United States Patent
Sato et al.

(10) Patent No.: US 11,894,466 B2
(45) Date of Patent: Feb. 6, 2024

(54) SEMICONDUCTOR DEVICE

(71) Applicant: SEMICONDUCTOR ENERGY LABORATORY CO., LTD., Atsugi (JP)

(72) Inventors: Rai Sato, Tochigi (JP); Masami Jintyou, Tochigi (JP); Masayoshi Dobashi, Tochigi (JP); Takashi Shiraishi, Tochigi (JP); Satoru Saito, Tochigi (JP); Yasutaka Nakazawa, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 406 days.

(21) Appl. No.: 17/279,153

(22) PCT Filed: Sep. 27, 2019

(86) PCT No.: PCT/IB2019/058211
§ 371 (c)(1),
(2) Date: Mar. 24, 2021

(87) PCT Pub. No.: WO2020/074993
PCT Pub. Date: Apr. 16, 2020

(65) Prior Publication Data
US 2021/0399140 A1  Dec. 23, 2021

(30) Foreign Application Priority Data
Oct. 10, 2018  (JP) .................................. 2018-192125

(51) Int. Cl.
*H01L 29/786* (2006.01)
*H01L 29/423* (2006.01)
(Continued)

(52) U.S. Cl.
CPC .. *H01L 29/78621* (2013.01); *H01L 29/42384* (2013.01); *H01L 29/66969* (2013.01);
(Continued)

(58) Field of Classification Search
CPC ........... H01L 29/78621; H01L 29/4908; H01L 29/7869; H01L 2029/42388
See application file for complete search history.

(56) References Cited

U.S. PATENT DOCUMENTS 7,061,565 B2  6/2006  Kwon et al.
8,049,225 B2  11/2011  Yamazaki et al.
(Continued)

FOREIGN PATENT DOCUMENTS

CN  101645462 A  2/2010
CN  102738002 A  10/2012
(Continued)

OTHER PUBLICATIONS

International Search Report (Application No. PCT/IB2019/058211), dated Dec. 17, 2019.
(Continued)

*Primary Examiner* — David A Zarneke
(74) *Attorney, Agent, or Firm* — Fish & Richardson P.C.

(57) ABSTRACT

A semiconductor device with favorable electrical characteristics is provided. A highly reliable semiconductor device is provided. The semiconductor device includes a semiconductor layer, a first insulating layer, a second insulating layer, a metal oxide layer, and a conductive layer; the first insulating layer, the metal oxide layer, and the conductive layer are stacked in this order over the semiconductor layer; an end portion of the first insulating layer is located inward from an end portion of the semiconductor layer; an end portion of the metal oxide layer is located inward from the end portion of the first insulating layer; and an end portion (Continued)

of the conductive layer is located inward from the end portion of the metal oxide layer. The second insulating layer is preferably provided to cover the semiconductor layer, the first insulating layer, the metal oxide layer, and the conductive layer. It is preferable that the semiconductor layer include a first region, a pair of second regions, and a pair of third regions; the first region overlap with the first insulating layer and the metal oxide layer; the second regions between which the first region is sandwiched overlap with the first insulating layer and not overlap with the metal oxide layer; the third regions between which the first region and the pair of second regions are sandwiched not overlap with the first insulating layer; and the third regions be in contact with the second insulating layer.

9 Claims, 30 Drawing Sheets

(51) Int. Cl.
    *H01L 29/66*     (2006.01)
    *H01L 27/12*     (2006.01)
    *H01L 29/49*     (2006.01)

(52) U.S. Cl.
    CPC ...... *H01L 27/1225* (2013.01); *H01L 29/4908* (2013.01); *H01L 29/7869* (2013.01); *H01L 2029/42388* (2013.01)

(56) References Cited

U.S. PATENT DOCUMENTS

| | | | |
|---|---|---|---|
| 8,514,340 B2 | 8/2013 | Kwon et al. | |
| 8,785,242 B2 | 7/2014 | Yamazaki et al. | |
| 8,956,929 B2 | 2/2015 | Egi et al. | |
| 9,105,659 B2 | 8/2015 | Yamazaki et al. | |
| 9,443,876 B2 | 9/2016 | Yamazaki et al. | |
| 9,496,408 B2 | 11/2016 | Yamazaki et al. | |
| 9,608,123 B2 | 3/2017 | Egi et al. | |
| 9,653,487 B2 | 5/2017 | Yamazaki et al. | |
| 9,741,865 B2 | 8/2017 | Yamazaki et al. | |
| 9,899,536 B2 | 2/2018 | Yamazaki et al. | |
| 9,929,279 B2 | 3/2018 | Yamazaki et al. | |
| 9,960,278 B2 | 5/2018 | Sato et al. | |
| 10,096,684 B2 | 10/2018 | Hosaka et al. | |
| 10,224,433 B2 | 3/2019 | Egi et al. | |
| 10,249,645 B2 | 4/2019 | Yamazaki et al. | |
| 10,373,981 B2 | 8/2019 | Yamazaki et al. | |
| 10,535,742 B2 | 1/2020 | Hosaka et al. | |
| 10,680,116 B2 | 6/2020 | Yamazaki et al. | |
| 10,811,435 B2 | 10/2020 | Yamazaki et al. | |
| 2006/0192907 A1 | 8/2006 | Kwon et al. | |
| 2015/0221678 A1 | 8/2015 | Yamazaki et al. | |
| 2015/0221679 A1 | 8/2015 | Yamazaki et al. | |
| 2015/0221774 A1 | 8/2015 | Yamazaki et al. | |
| 2017/0186843 A1 | 6/2017 | Hosaka et al. | |
| 2018/0182894 A1 | 6/2018 | Sato et al. | |
| 2018/0219102 A1 | 8/2018 | Koezuka et al. | |
| 2020/0052127 A1 | 2/2020 | Yamazaki et al. | |
| 2020/0161435 A1 | 5/2020 | Hosaka et al. | |
| 2021/0013239 A1 | 1/2021 | Yamazaki et al. | |

FOREIGN PATENT DOCUMENTS

| | | |
|---|---|---|
| CN | 103137495 A | 6/2013 |
| CN | 104821338 A | 8/2015 |
| CN | 108473334 A | 8/2018 |
| DE | 102015201707 | 8/2015 |
| JP | 2004-163901 A | 6/2004 |
| JP | 2014-007399 A | 1/2014 |
| JP | 2015-179822 A | 10/2015 |
| JP | 2015-181150 A | 10/2015 |
| JP | 2015-181151 A | 10/2015 |
| JP | 2018-006728 A | 1/2018 |
| JP | 2018-133508 A | 8/2018 |
| KR | 2015-0092722 A | 8/2015 |
| KR | 2018-0099725 A | 9/2018 |
| TW | 201535690 | 9/2015 |
| WO | WO-2017/115222 | 7/2017 |

OTHER PUBLICATIONS

Written Opinion (Application No. PCT/IB2019/058211), dated Dec. 17, 2019.
Chinese Office Action (Application No. 201980065656.2), dated Nov. 17, 2023.

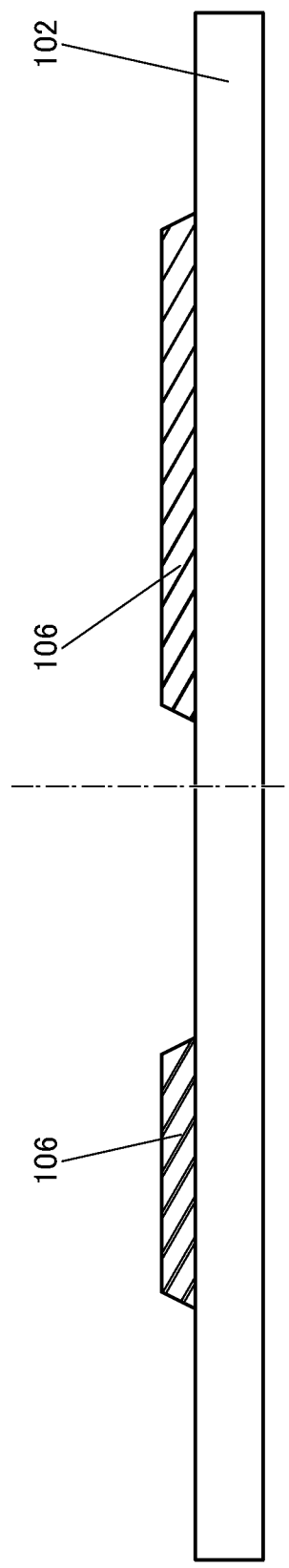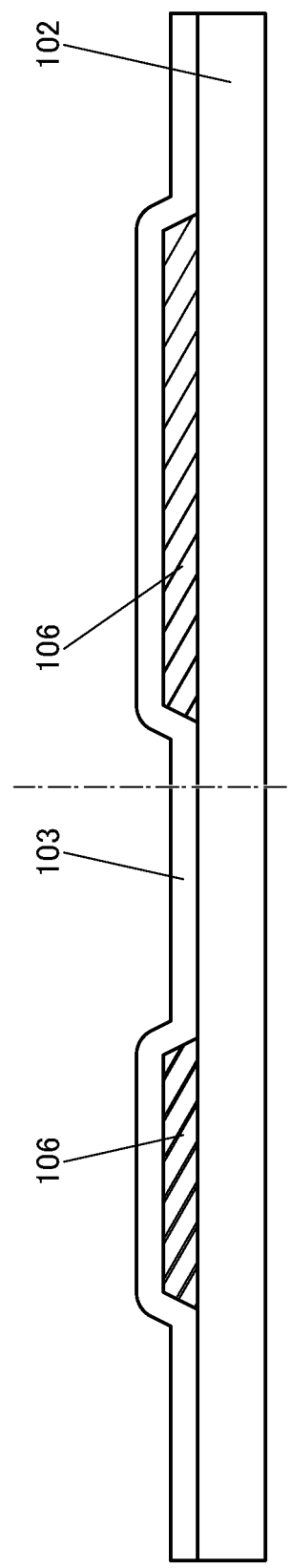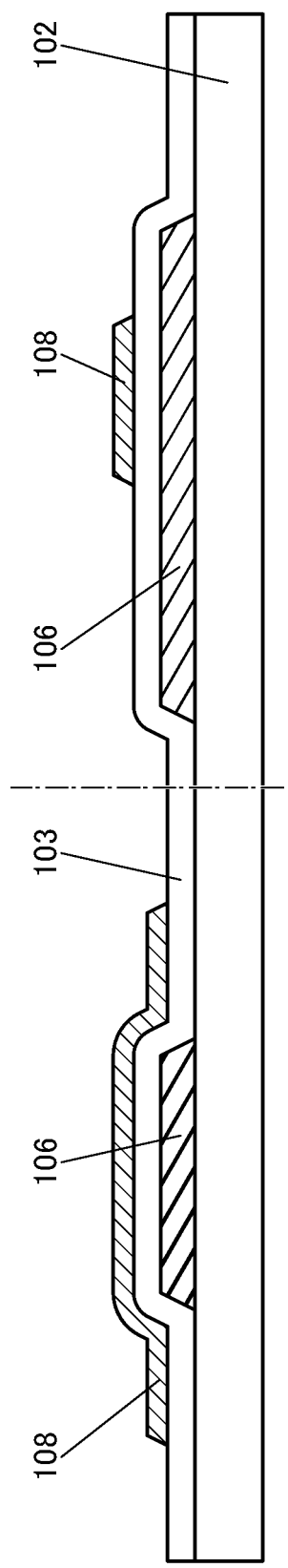

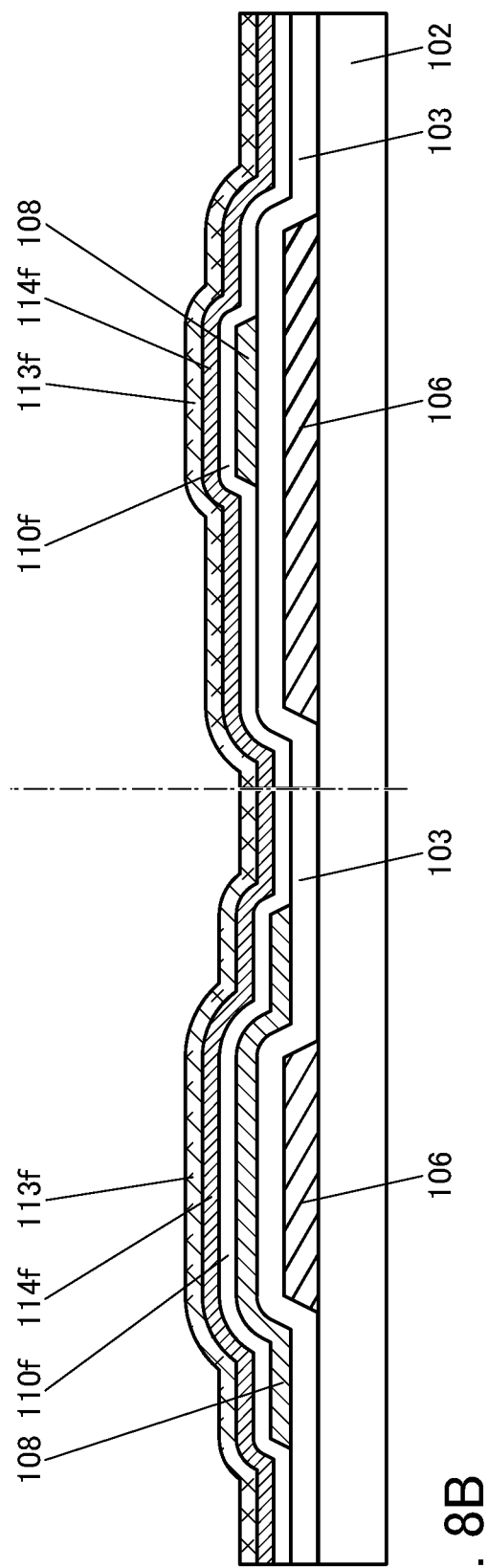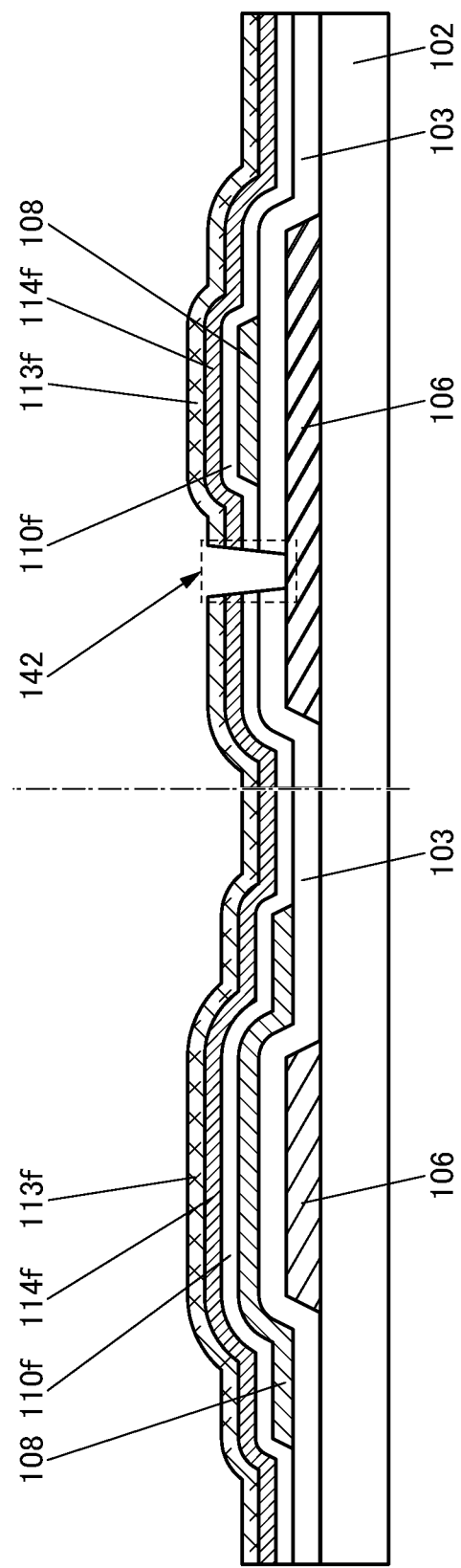

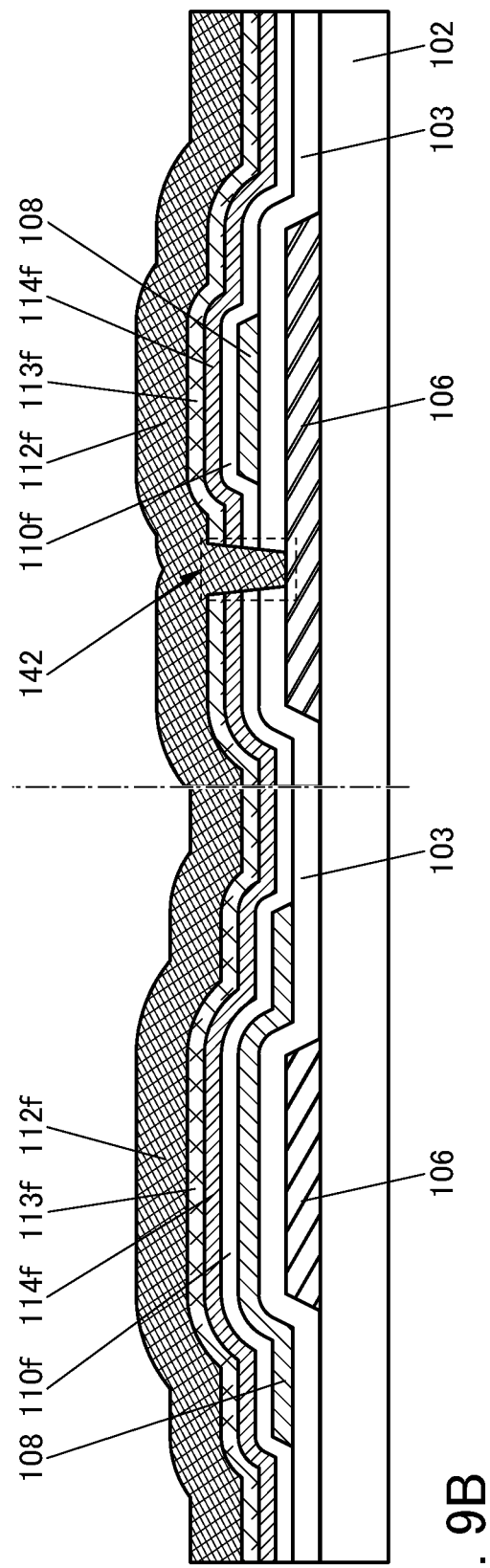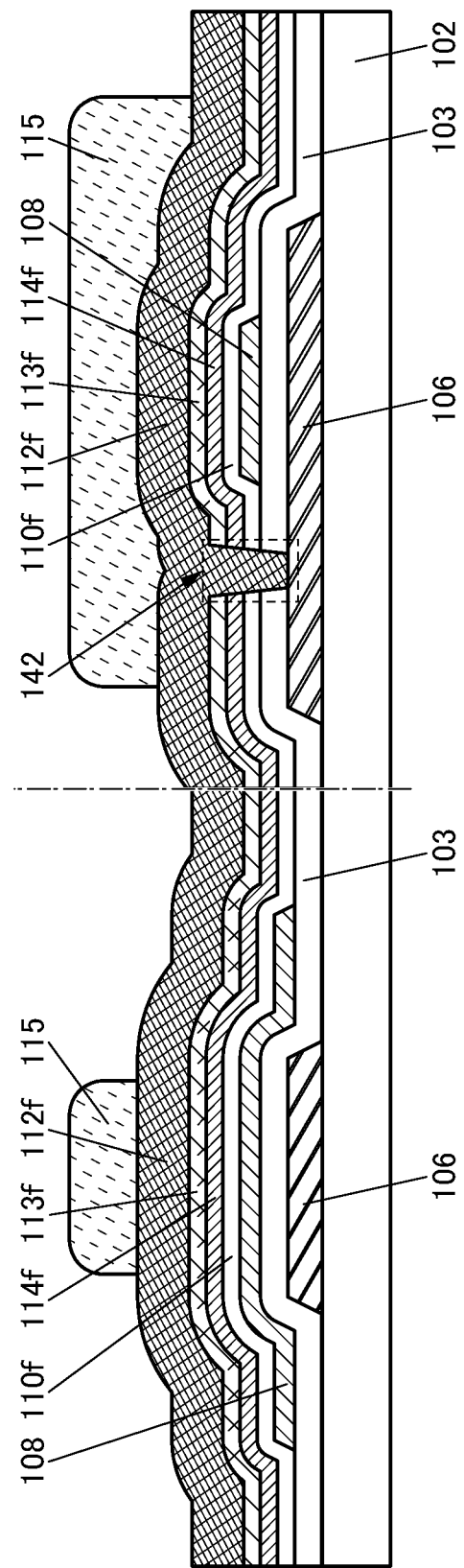

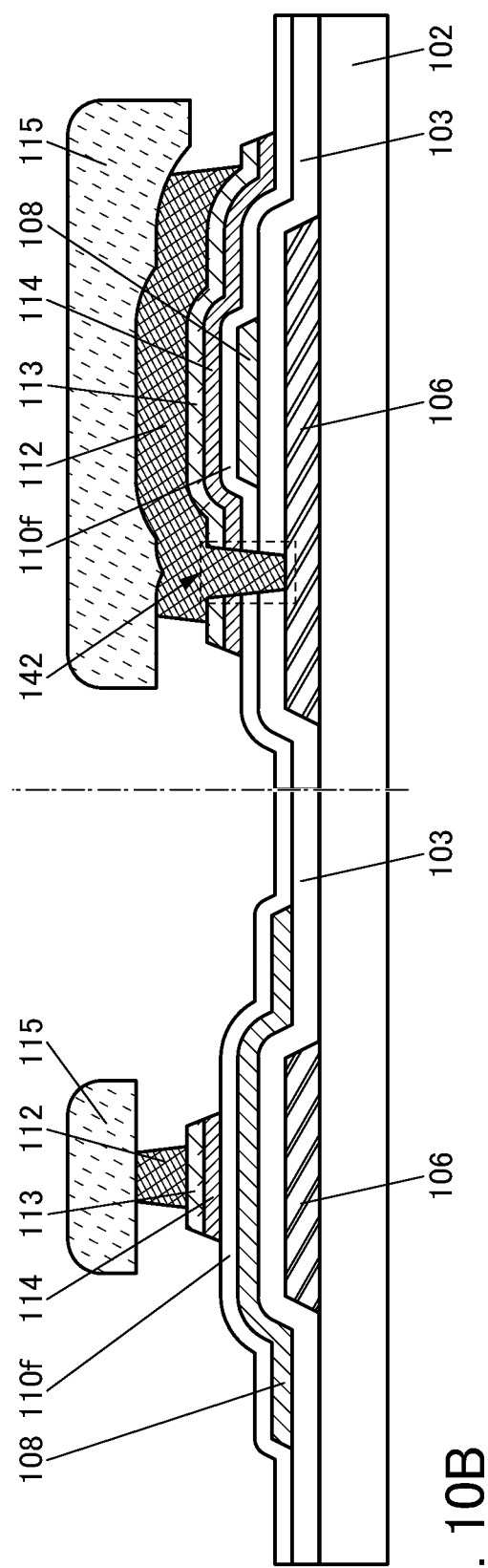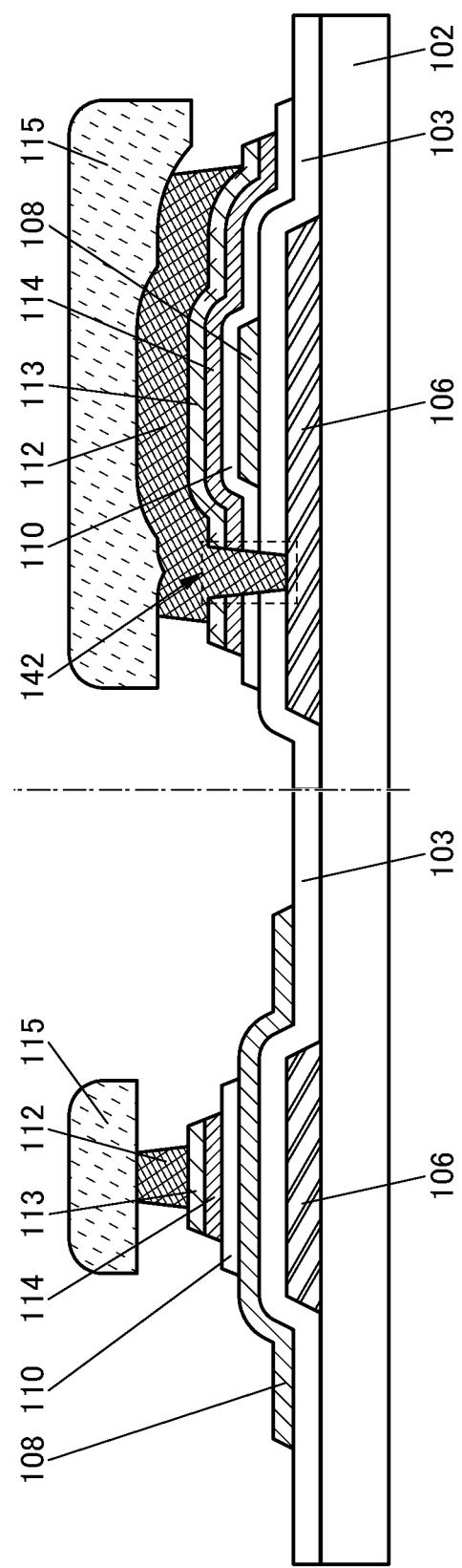

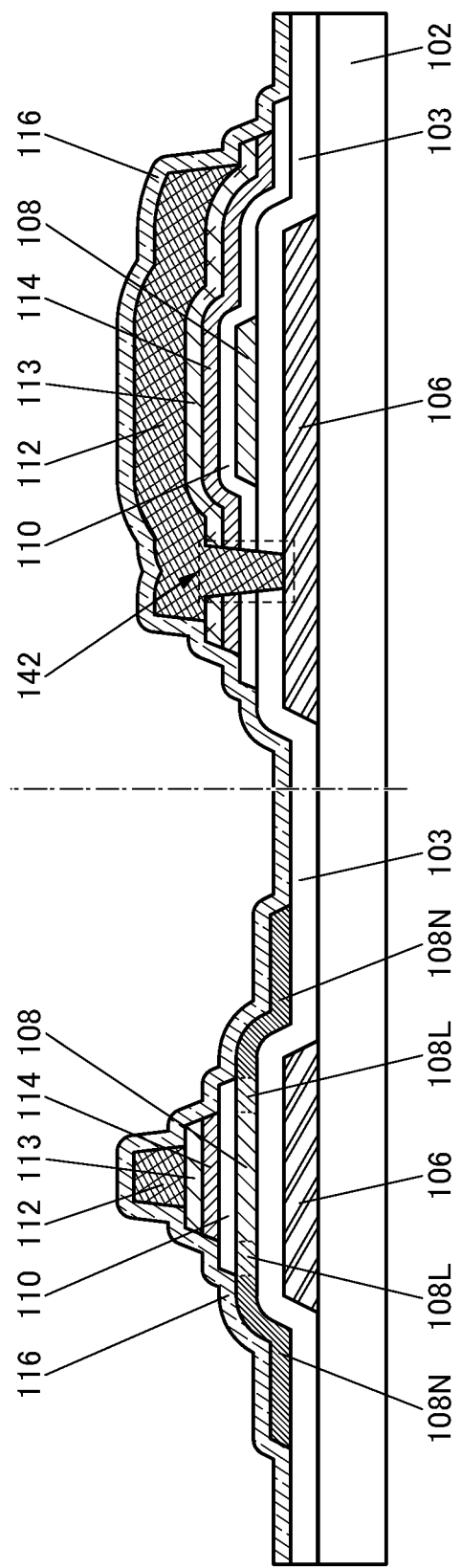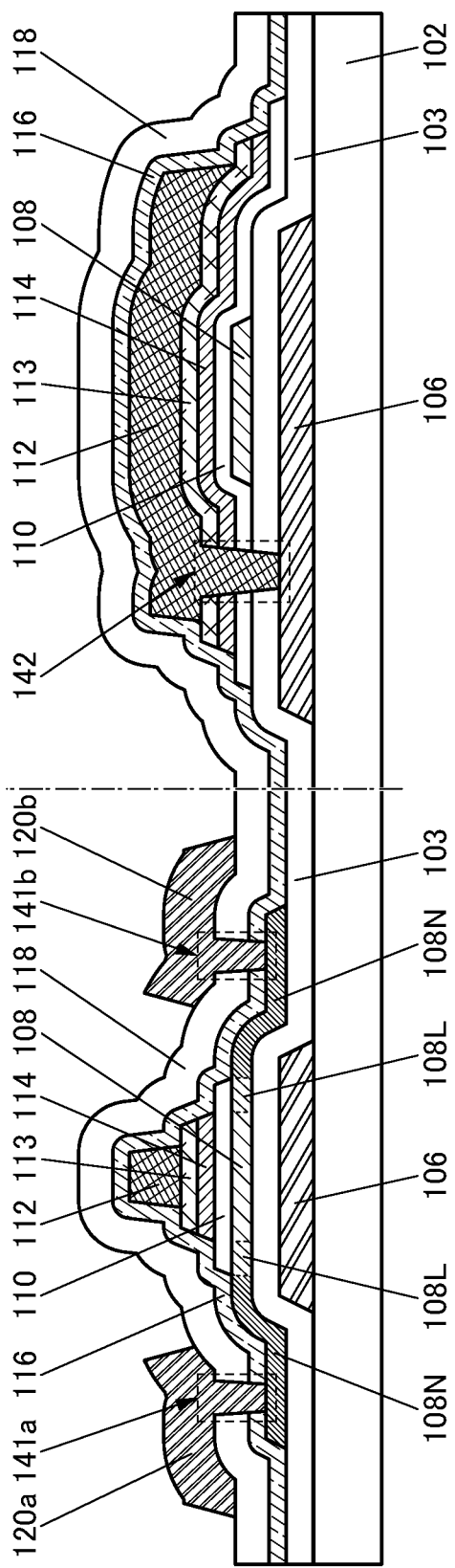

SEMICONDUCTOR DEVICE

CROSS REFERENCE TO RELATED APPLICATIONS

This application is a U.S. National Phase Application under 35 U.S.C. § 371 of International Application PCT/IB2019/058211, filed on Sep. 27, 2019, which is incorporated by reference and claims the benefit of a foreign priority application filed in Japan on Oct. 10, 2018, as Application No. 2018-192125.

TECHNICAL FIELD

One embodiment of the present invention relates to a semiconductor device. One embodiment of the present invention relates to a display device. One embodiment of the present invention relates to a method for manufacturing a semiconductor device or a display device.

Note that one embodiment of the present invention is not limited to the above technical field. Examples of the technical field of one embodiment of the present invention disclosed in this specification and the like can include a semiconductor device, a display device, a light-emitting device, a power storage device, a memory device, an electronic device, a lighting device, an input device, an input/output device, a driving method thereof, and a manufacturing method thereof. A semiconductor device refers to a device that can function by utilizing semiconductor characteristics in general.

BACKGROUND ART

As a semiconductor material applicable to a transistor, an oxide semiconductor using a metal oxide has attracted attention. For example, Patent Document 1 discloses a semiconductor device that makes field-effect mobility (simply referred to as mobility or μFE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. Furthermore, a transistor using a metal oxide has high field-effect mobility compared to the case of using amorphous silicon; therefore, a high-performance display device provided with a driver circuit can be achieved.

There is a trend in a display device toward a larger screen, and development taking a screen size of 60 inches diagonal or more or 120 inches diagonal or more into consideration has been progressed. In addition, there is a trend in resolution of a screen toward higher definition, for example, full high definition (the number of pixels: 1920×1080; also referred to as "2K", for example), ultra high definition (the number of pixels: 3840×2160; also referred to as "4K", for example), and super high definition (the number of pixels: 7680×4320; also referred to as "8K", for example).

Increases in screen size or definition tend to increase wiring resistance in a display portion. Patent Document 2 discloses a technique for forming a low-resistance wiring layer using copper (Cu) in order to suppress an increase in wiring resistance in a liquid crystal display device using an amorphous silicon transistor.

REFERENCES

Patent Documents

[Patent Document 1] Japanese Published Patent Application No. 2014-7399
[Patent Document 2] Japanese Published Patent Application No. 2004-163901

SUMMARY OF THE INVENTION

Problems to be Solved by the Invention

An object of one embodiment of the present invention is to provide a semiconductor device with favorable electrical characteristics. Another object of one embodiment of the present invention is to provide a highly reliable semiconductor device. Another object of one embodiment of the present invention is to provide a novel semiconductor device.

Note that the description of these objects does not preclude the existence of other objects. Note that one embodiment of the present invention does not need to achieve all the objects. Note that objects other than these can be derived from the description of the specification, the drawings, the claims, and the like.

Means for Solving the Problems

One embodiment of the present invention is a semiconductor device including a semiconductor layer, a first insulating layer, a second insulating layer, a metal oxide layer, and a conductive layer; the first insulating layer, the metal oxide layer, and the conductive layer are stacked in this order over the semiconductor layer; an end portion of the first insulating layer is located inward from an end portion of the semiconductor layer; an end portion of the metal oxide layer is located inward from the end portion of the first insulating layer; an end portion of the conductive layer is located inward from the end portion of the metal oxide layer; the second insulating layer is provided to cover the semiconductor layer, the first insulating layer, the metal oxide layer, and the conductive layer; the semiconductor layer includes a first region, a pair of second regions, and a pair of third regions; the first region overlaps with the first insulating layer and the metal oxide layer; the second regions between which the first region is sandwiched overlap with the first insulating layer and do not overlap with the metal oxide layer; the third regions between which the first region and the pair of second regions are sandwiched do not overlap with the first insulating layer; the third regions are in contact with the second insulating layer; the third regions include a portion having lower resistance than the first region; and the second regions include a portion having higher resistance than the third regions.

In the above semiconductor device, the second regions preferably include a portion having lower resistance than the first region.

In the above semiconductor device, the second regions preferably include a portion with a sheet resistance higher than or equal to $1\times10^3$ Ω/square and lower than or equal to $1\times10^9$ Ω/square.

In the above semiconductor device, a width of each of the second regions is greater than or equal to 100 nm and less than or equal to 2 μm in a cross section in a channel length direction.

In the above semiconductor device, the second insulating layer is preferably a silicon nitride film.

In the above semiconductor device, it is preferable that the end portion of the first insulating layer and the end portion of the metal oxide layer each have a tapered shape, and a taper angle of the end portion of the metal oxide layer be smaller than a taper angle of the end portion of the first insulating layer.

In the above semiconductor device, it is preferable that a functional layer be provided between the metal oxide layer and the conductive layer, the functional layer have conductivity, and an end portion of the functional layer be substantially aligned with the end portion of the metal oxide layer or be positioned between the end portion of the metal oxide layer and the end portion of the conductive layer.

In the above semiconductor device, the semiconductor layer, the metal oxide layer, and the functional layer preferably contain the same metal element.

In the above semiconductor device, the metal element is preferably one or more of indium and zinc.

Effect of the Invention

According to one embodiment of the present invention, a semiconductor device with favorable electrical characteristics can be provided. Alternatively, a highly reliable semiconductor device can be provided. Alternatively, a novel semiconductor device can be provided.

Note that the description of the effects does not preclude the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIG. 7A, FIG. 7B, and FIG. 7C are diagrams illustrating a method for manufacturing a semiconductor device.

FIG. 8A and FIG. 8B are diagrams illustrating a method for manufacturing a semiconductor device.

FIG. 9A and FIG. 9B are diagrams illustrating a method for manufacturing a semiconductor device.

FIG. 10A and FIG. 10B are diagrams illustrating a method for manufacturing a semiconductor device.

FIG. 11A and FIG. 11B are diagrams illustrating a method for manufacturing a semiconductor device.

MODE FOR CARRYING OUT THE INVENTION

Figure 1A:
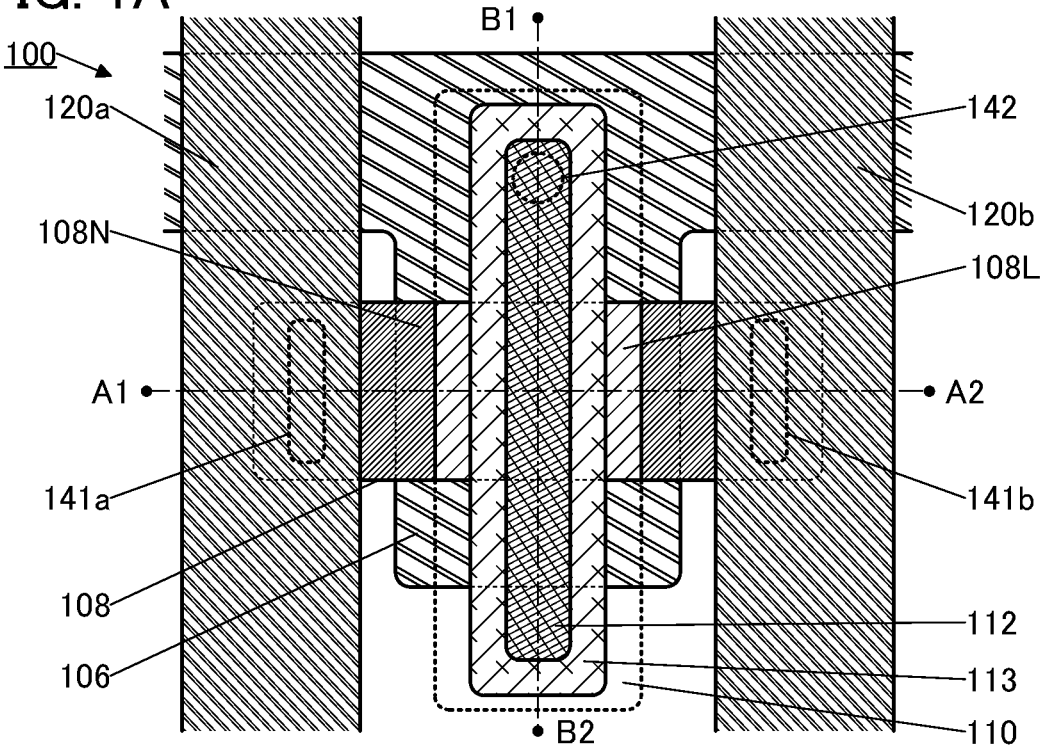
FIG. 1A is a top view illustrating a structure example of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In each drawing described in this specification, the size, the layer thickness, or the region of each component is exaggerated for clarity in some cases.

Ordinal numbers such as "first," "second," and "third" used in this specification and the like are used in order to avoid confusion among components, and the terms do not limit the components numerically.

In this specification and the like, terms for describing arrangement, such as "over" and "under," are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

In this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

Note that in this specification and the like, a channel length direction of a transistor refers to one of the directions parallel to a straight line that connects a source region and a drain region in the shortest distance. In other words, a channel length direction corresponds to one of the directions of current flowing through a semiconductor layer when a transistor is in an on state. In addition, a channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric action." Here, there is no particular limitation on the "object having any electric action" as long as electric signals can be transmitted and received between the connected components. Examples of the "object having any electric action" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

Unless otherwise specified, off-state current in this specification and the like refers to drain current of a transistor in an off state (also referred to as a non-conducting state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

In this specification and the like, a substrate of a touch panel to which a connector or an IC is attached is referred to as a touch panel module, a display module, or simply a touch panel or the like in some cases.

Embodiment 1

In this embodiment, a semiconductor device and a display device of one embodiment of the present invention and manufacturing methods thereof will be described. Particularly in this embodiment, as an example of the semiconductor device, a transistor using an oxide semiconductor for a semiconductor layer in which a channel is formed will be described.

One embodiment of the present invention is a transistor including, over a formation surface, a semiconductor layer in which a channel is formed, a gate insulating layer (also referred to as a first insulating layer) over the semiconductor layer, a metal oxide layer over the gate insulating layer, and a conductive layer (also referred to as a first conductive layer) functioning as a gate electrode over the metal oxide layer. The semiconductor layer preferably contains a metal oxide exhibiting semiconductor characteristics (hereinafter, also referred to as an oxide semiconductor).

It is preferable that an end portion of the first insulating layer be located inward from an end portion of the semiconductor layer, an end portion of the metal oxide layer be located inward from the end portion of the first insulating layer, and an end portion of the conductive layer be located inward from the end portion of the metal oxide layer.

A second insulating layer is preferably provided to cover the semiconductor layer, the first insulating layer, the metal oxide layer, and the conductive layer.

The semiconductor layer includes a first region, a pair of second regions, and a pair of third regions. The first region overlaps with the first insulating layer and the metal oxide layer. The second regions are regions between which the first region is sandwiched and which overlap with the first insulating layer and do not overlap with the metal oxide layer. The third regions are regions between which the first region and the pair of second regions are sandwiched and which do not overlap with the first insulating layer. The third regions are in contact with the second insulating layer. It is preferable that the third regions include a portion having lower resistance than the first region, and the second regions include a portion having higher resistance than the third regions.

More specific examples will be described below with reference to drawings.

Structure Example 1

Figure 1B:
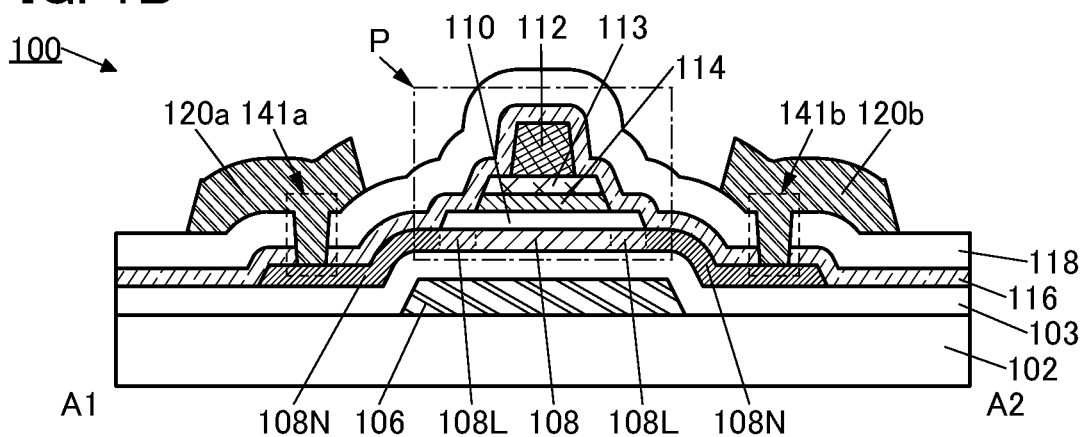
FIG. 1B and FIG. 1C are cross-sectional views illustrating a structure example of a semiconductor device.
Figure 1C:
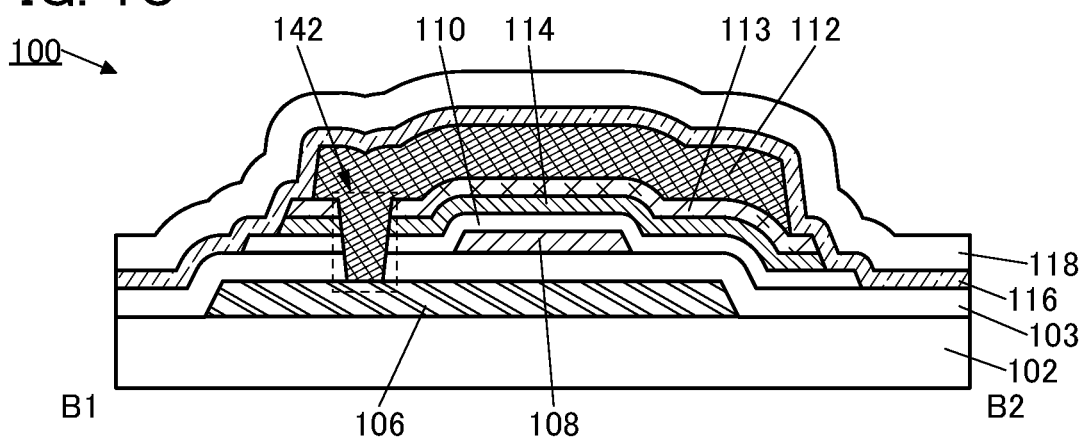

FIG. 1A is a top view of a transistor 100, FIG. 1B corresponds to a cross-sectional view of a cut plane along the dashed-dotted line A1-A2 shown in FIG. 1A, and FIG. 1C corresponds to a cross-sectional view of a cut plane along the dashed-dotted line B1-B2 shown in FIG. 1A. Note that in FIG. 1A, some components of the transistor 100 (a protective layer and the like) are not illustrated. In addition, the direction of the dashed-dotted line A1-A2 corresponds to a channel length direction, and the direction of the dashed-dotted line B1-B2 corresponds to a channel width direction. Furthermore, some components are not illustrated in top views of transistors in the following drawings, as in FIG. 1A.

Figure 2:
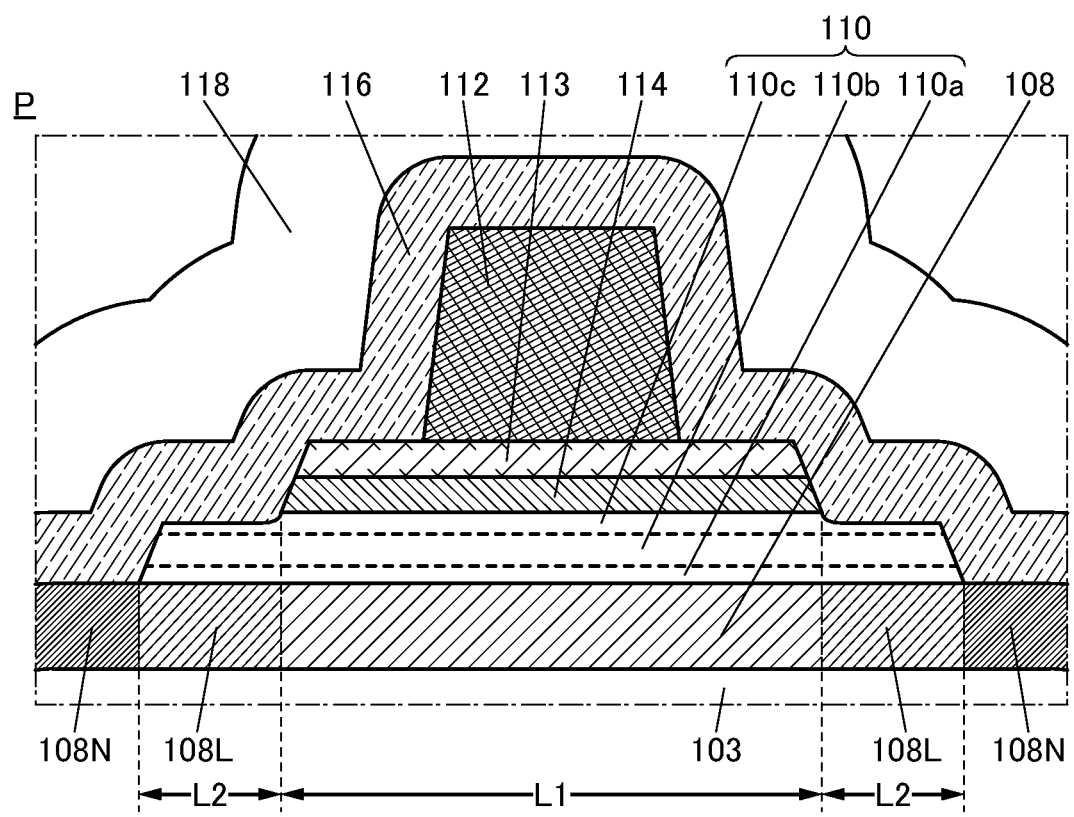
FIG. 2 is a cross-sectional view illustrating a structure example of a semiconductor device.

The transistor 100 is provided over a substrate 102 and includes an insulating layer 103, a semiconductor layer 108, an insulating layer 110, a metal oxide layer 114, a conductive layer 112, an insulating layer 116, an insulating layer 118, and the like. The semiconductor layer 108 having an island shape is provided over the insulating layer 103. The insulating layer 110 is provided to cover part of a top surface of the insulating layer 103 and part of a top surface of the semiconductor layer 108. The metal oxide layer 114 and the conductive layer 112 are provided to be stacked in this order over the insulating layer 110 and each include a portion overlapping with the semiconductor layer 108. An enlarged view of a region P surrounded by a dashed-dotted line in FIG. 1B is shown in FIG. 2.

End portions of the conductive layer 112 and the metal oxide layer 114 are located inward from an end portion of the insulating layer 110. In other words, the insulating layer 110 includes a portion extending beyond the end portions of the conductive layer 112 and the metal oxide layer 114 at least over the semiconductor layer 108. In addition, the end portion of the conductive layer 112 is located inward from the end portion of the metal oxide layer 114. In other words, the metal oxide layer 114 includes a portion extending beyond the end portion of the conductive layer 112 at least over the semiconductor layer 108.

The semiconductor layer 108 includes a pair of regions 108L between which the channel formation region is sandwiched and a pair of regions 108N on outer sides of the regions 108L. The regions 108L are each a region of the semiconductor layer 108 that overlaps with the insulating layer 110 and does not overlap with the conductive layer 112. In FIG. 2, the width of the channel formation region of the transistor 100 in the channel length direction is denoted as L1, and the width of each of the regions 108L is denoted as L2.

The regions 108L can each be referred to as a region whose resistance is substantially equal to or lower than that of the channel formation region, a region whose carrier concentration is substantially equal to or higher than that of the channel formation region, a region whose oxygen vacancy density is substantially equal to or higher than that of the channel formation region, or a region whose impurity concentration is substantially equal to or higher than that of the channel formation region.

The regions 108L can each be referred to as a region whose resistance is substantially equal to or higher than that of the regions 108N, a region whose carrier concentration is substantially equal to or lower than that of the regions 108N, a region whose oxygen vacancy density is substantially equal to or lower than that of the regions 108N, or a region whose impurity concentration is substantially equal to or lower than that of the regions 108N.

The sheet resistance of the regions 108L is preferably higher than or equal to $1 \times 10^3$ Ω/square and lower than or equal to $1 \times 10^9$ Ω/square, further preferably higher than or equal to $1 \times 10^3$ Ω/square and lower than or equal to $1 \times 10^8$ Ω/square, still further preferably higher than or equal to $1 \times 10^3$ Ω/square and lower than or equal to $1 \times 10^7$ Ω/square. When the resistance is within the above range, a transistor that has favorable electrical characteristics and high reliability can be provided. Note that the sheet resistance can be calculated from a resistance value. Providing such regions 108L between the channel formation region and the regions 108N can increase the source-drain withstand voltage of the transistor 100.

Note that the carrier concentration is not necessarily uniform in the regions 108L; in some cases, the carrier concentration has a falling gradient from the region 108N side toward the channel formation region. For example, one or both of the hydrogen concentration and the oxygen vacancy concentration in the regions 108L may have a falling gradient from the region 108N side toward the channel formation region side.

Part of the end portion of the insulating layer 110 is positioned over the semiconductor layer 108. The insulating layer 110 includes a portion overlapping with the conductive layer 112 and functioning as the gate insulating layer and portions not overlapping with the conductive layer 112 and the metal oxide layer 114 (i.e., portions overlapping with the regions 108L).

The insulating layer 116 is provided to cover a top surface and a side surface of the conductive layer 112, a side surface of the metal oxide layer 114, a top surface and a side surface of the insulating layer 110, the top surface and a side surface of the semiconductor layer 108, and the top surface of the insulating layer 103. The insulating layer 116 has a function of inhibiting diffusion of impurities into the semiconductor layer 108 from above the insulating layer 116. In addition, the insulating layer 116 has a function of lowering the resistance of the semiconductor layer 108 in contact with the insulating layer 116 at the time of deposition. The regions 108N are in contact with the insulating layer 116. The regions 108L are not in contact with the insulating layer 116 owing to the insulating layer 110 positioned therebetween and thus are supplied with a small amount of hydrogen from the insulating layer 116 compared with the regions 108N. Furthermore, the regions 108L have lower impurity concentration than the regions 108N and thus can be in a state of having higher resistance than the regions 108N.

The regions 108L can be formed in a self-aligned manner as described later; thus, a photomask for forming the regions 108L is not needed and manufacturing cost can be reduced. In addition, forming the regions 108L in a self-aligned manner does not cause relative misalignment between the regions 108L and the conductive layer 112; hence, the widths of the regions 108L in the semiconductor layer 108 can be substantially the same.

The regions 108L, which function as offset regions that experience no electric field of a gate (or are less likely to experience an electric field than the channel formation region), can be stably formed without variations between the channel formation region and the low-resistance regions 108N in the semiconductor layer 108. As a result, the source-drain withstand voltage of a transistor can be improved, so that a transistor and a semiconductor device can each have high reliability.

The widths L2 of the regions 108L are each preferably greater than or equal to 100 nm and less than or equal to 2 μm, further preferably greater than or equal to 150 nm and less than or equal to 1 μm, still further preferably greater than or equal to 200 nm and less than or equal to 1 μm. Providing the regions 108L reduces the concentration of the electric field on the vicinity of the drain, which can inhibit the deterioration of the transistor especially in a high drain voltage state. In particular, when the widths L2 of the regions 108L are each greater than the thickness of the insulating layer 110, the concentration of the electric field on the vicinity of the drain can be effectively reduced. On the other hand, when the widths L2 are each greater than 2 μm, the source-drain resistance is increased and the driving speed of the transistor is lowered in some cases. The widths L2 in the above range allow a transistor and a semiconductor device to have high reliability and high driving speed. Note that the widths L2 of the regions 108L can be determined depending on the thickness of the semiconductor layer 108, the thickness of the insulating layer 110, and the level of a voltage applied between the source and the drain in driving the transistor 100.

Providing the regions 108L between the channel formation region and the low-resistance regions 108N can reduce the current density at boundaries between the channel formation region and the regions 108N and can suppress heat generation at a boundary between the channel and the source or the drain, which enables a transistor and a semiconductor device to have high reliability.

A low-resistance material is preferably used for the conductive layer 112. The use of a low-resistance material for the conductive layer 112 can reduce parasitic resistance and enables the transistor to have a high on-state current, leading to a semiconductor device having a high on-state current. In addition, in a large-sized display device or a high-resolution display device, a reduction in wiring resistance inhibits signal delay and enables high-speed operation. For the conductive layer 112, copper, silver, gold, aluminum, or the like can be used. Copper is particularly preferable because of its high mass productivity.

When a shape in which an end portion of a layer over which the conductive layer 112 is formed is located inward from the end portion of the conductive layer 112, what is called an undercut, occurs, coverage with layers to be formed later decreases, which causes defects such as disconnection and voids on the layers. Shape defects such as an undercut might cause defects such as variation in electrical characteristics of a transistor.

As illustrated in FIG. 1B, FIG. 1C, and FIG. 2, it is preferable that a functional layer 113 be provided as a layer over which the conductive layer 112 is formed, and have substantially the same etching rate as the conductive layer 112 or a lower etching rate than the conductive layer 112 with respect to an etchant used for the processing of the conductive layer 112. Such a structure can inhibit occurrence of the undercut and can provide a transistor in which shape defects are unlikely to occur. In addition, a transistor and a semiconductor device with favorable electrical characteristics can be provided.

As illustrated in FIG. 1B, FIG. 1C, and the like, the functional layer 113 is preferably provided between the conductive layer 112 and the metal oxide layer 114. It is particularly preferable to use a conductive material for the functional layer 113. A material that is highly adhesive to the conductive layer 112 is preferably used for the functional layer 113. High adhesion between the functional layer 113 and the conductive layer 112 can inhibit the generation of a space between the functional layer 113 and the conductive layer 112 that is caused by entry of the etchant between the functional layer 113 and the conductive layer 112 at the time of forming these two layers.

The cross sections of the conductive layer 112 and the functional layer 113 are preferably continuous. When the cross sections of the conductive layer 112 and the functional layer 113 are continuous, the coverage with layers (e.g., the insulating layer 116) formed over the conductive layer 112 and the functional layer 113 is improved, which can inhibit the generation of defects such as disconnection and voids on the layers.

The end portion of the insulating layer 110 and the end portion of the metal oxide layer 114 each preferably have a tapered shape. Furthermore, the taper angle of the end portion of the metal oxide layer 114 is preferably smaller than the taper angle of the end portion of the insulating layer 110. This structure can improve the coverage with the layers (e.g., the insulating layer 116) formed over the insulating layer 110 and the metal oxide layer 114, and inhibit the generation of defects such as disconnection and voids on the layers.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and an end portion of the upper layer is located inward from an end portion of the lower layer or an end portion of the upper layer is located outward from an end portion of the lower layer; such a case is also represented by the expression "having substantially the same top surface shapes."

In this specification and the like, the taper angle refers to an inclination angle formed by a side surface and a bottom surface of a specific layer when the layer is observed from the direction perpendicular to the cross section (e.g., the plane perpendicular to the surface of the substrate).

The insulating layer 116 is provided to cover the top surface and the side surface of the conductive layer 112, a top surface and a side surface of the functional layer 113, the side surface of the metal oxide layer 114, the top surface and the side surface of the insulating layer 110, the top surface and the side surface of the semiconductor layer 108, and the top surface of the insulating layer 103. The insulating layer 118 is provided to cover the insulating layer 116. The insulating layer 116 and the insulating layer 118 each function as a protective layer, and can inhibit diffusion of impurities from the outside.

Parts of the conductive layer 112, the functional layer 113, and the metal oxide layer 114 function as a gate electrode. Part of the insulating layer 110 functions as a gate insulating layer. The transistor 100 is what is called a top-gate transistor, in which the gate electrode is provided over the semiconductor layer 108.

As illustrated in FIG. 1A and FIG. 1B, the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to the regions 108N that are described later through an opening portion 141a and an opening portion 141b, respectively, which are provided in the insulating layer 118 and the insulating layer 116.

The semiconductor layer 108 preferably includes a metal oxide.

The semiconductor layer 108 preferably contains indium, an element M (the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, the element M is preferably one or more kinds selected from aluminum, gallium, yttrium, and tin.

It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

For the conductive layer 112, one or more selected from copper, silver, gold, and aluminum can be used. Copper is particularly preferable because of its low resistance and high mass productivity.

The metal oxide layer 114 positioned between the insulating layer 110 and the functional layer 113 functions as a barrier film that prevents diffusion of oxygen contained in the insulating layer 110 to the conductive layer 112 side. Furthermore, the metal oxide layer 114 also functions as a barrier film that prevents diffusion of hydrogen and water contained in the conductive layer 112 to the insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, the carrier concentration in a channel formation region of the semiconductor layer 108 can be extremely low.

For the metal oxide layer 114, an insulating material or a conductive material can be used. When having an insulating property, the metal oxide layer 114 functions as part of the gate insulating layer. By contrast, when having conductivity, the metal oxide layer 114 functions as part of the gate electrode.

For the metal oxide layer 114, it is preferable to use an insulating material having a higher dielectric constant than silicon oxide. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 114, it is preferable to use an oxide material containing one or more elements that are the same as those of the semiconductor layer 108. It is particularly preferable to use an oxide semiconductor material that can be used for the semiconductor layer 108. Here, a metal oxide film formed using the same sputtering target as that for the semiconductor layer 108 is preferably used for the metal oxide layer 114 because an apparatus can be shared.

Alternatively, when a metal oxide material containing indium and gallium is used for both the semiconductor layer 108 and the metal oxide layer 114, a material whose composition (content ratio) of gallium is higher than that of the material used for the semiconductor layer 108 is preferably used for the metal oxide layer 114 because an oxygen blocking property can be further increased. Here, when the semiconductor layer 108 is formed using a material whose composition of indium is higher than that of the material used for the metal oxide layer 114, the field-effect mobility of the transistor 100 can be increased.

The metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

For the functional layer 113 positioned between the metal oxide layer 114 and the conductive layer 112, a conductive material having oxidation resistance is preferably used. The use of a material having oxidation resistance can suppress an increase in resistance of the functional layer 113.

It is preferable that the etching rates of the metal oxide layer 114 and the functional layer 113 with respect to an etchant used for processing the conductive layer 112 be almost equal to that of the conductive layer 112 or lower than that of the conductive layer 112.

In the case where the etching rates of the metal oxide layer 114 and the functional layer 113 are higher than that of the conductive layer 112, an undercut in which end portions of the metal oxide layer 114 and the functional layer 113 are located inward from the end portion of the conductive layer 112 is likely to occur. When the undercut occurs, the coverage with the insulating layer 116 and the insulating layer 118 that are to be formed later decreases, which results in defects such as disconnection of the insulating layer 116 and the insulating layer 118 and low-density regions (also referred to as voids) therein.

In one embodiment of the present invention, the etching rates of the metal oxide layer 114 and the functional layer 113 are almost equal to that of the conductive layer 112 or lower than that of the conductive layer 112, which can inhibit occurrence of an undercut and achieves a transistor in which shape defects are unlikely to occur. Alternatively, a transistor with favorable electrical characteristics can be provided.

The functional layer 113, the metal oxide layer 114, and the conductive layer 112 can be formed in the same step using an etchant used for processing the conductive layer 112. Furthermore, the metal oxide layer 114, the functional layer 113, and the conductive layer 112 can have substantially the same top surface shapes.

The etching rate of the insulating layer 110 is preferably lower than those of the metal oxide layer 114, the functional layer 113, and the conductive layer 112. With a structure in which the etching rate of the insulating layer 110 is lower than those of the metal oxide layer 114, the functional layer 113, and the conductive layer 112, the etching amount of the insulating layer 110 at the time of forming the metal oxide layer 114, the functional layer 113, and the conductive layer 112 can be reduced.

It is preferable that the functional layer 113 be highly adhesive to the metal oxide layer 114 and the conductive layer 112. In the case where the adhesion between these layers is low in the structure where the conductive layer 112 is formed over the metal oxide layer 114, for example, a space might be generated between the metal oxide layer 114 and the conductive layer 112 due to entry of an etchant between the two layers at the time of forming the metal oxide layer 114 and the conductive layer 112. In one embodiment of the present invention, providing the functional layer 113 between the metal oxide layer 114 and the conductive layer 112 increases the adhesion between the metal oxide layer 114, the functional layer 113, and the conductive layer 112, which can inhibit generation of a space between these layers and achieve a transistor in which shape defects are unlikely to occur. Alternatively, a transistor with favorable electrical characteristics can be provided.

The released amount of impurities including hydrogen from the functional layer 113 is preferably small. Examples of impurities including hydrogen include hydrogen and water. In the case where the functional layer 113 releases impurities including hydrogen, the hydrogen reaching the channel formation region of the semiconductor layer 108 is bonded to oxygen contained in the channel formation region and released as water, thereby forming an oxygen vacancy (hereinafter, also referred to as $V_O$) in the channel formation region in some cases. In addition, when the oxygen vacancy ($V_O$) and hydrogen exist in the channel formation region, a state in which hydrogen enters the oxygen vacancy ($V_O$) (hereinafter, also referred to as $V_O$H) is sometimes generated. In some cases, $V_O$H serves as a carrier generation source that adversely affects the electrical characteristics and reliability of the transistor. With the use of the functional layer 113 from which the released amount of impurities including hydrogen is small, favorable electrical characteristics and reliability can be obtained.

The released amount of impurities including oxygen from the functional layer 113 is preferably small. Examples of impurities including oxygen include oxygen and water. In the case where the functional layer 113 releases impurities including oxygen, the oxygen reaching the conductive layer 112 increases the resistance of the conductive layer 112 in some cases. With the use of the functional layer 113 from which the released amount of impurities including oxygen is small, an increase in resistance of the conductive layer 112 can be suppressed.

A metal oxide can be used for the functional layer 113. For example, an oxide containing indium, such as indium oxide, indium tin oxide (ITO), or indium tin oxide containing silicon (ITSO), can be used. ITSO is particularly preferable because it is not easily crystallized owing to silicon contained therein, has high planarity, and thus is highly adhesive to a film formed over the ITSO. A metal oxide such as indium zinc oxide, zinc oxide, or zinc oxide containing gallium can also be used.

For the functional layer 113, it is possible to use an oxide containing indium, zinc, and an element M (the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium). In particular, the element M is preferably one or more kinds selected from aluminum, gallium, yttrium, and tin. For example, an In—Ga—Zn oxide in which the atomic ratio of In to Ga is higher than 1 is preferable because the conductivity increases. In particular, the atomic ratio of In to the element M and Zn in the functional layer 113 is preferably InM:Zn=4:2:3 or in the neighborhood thereof. Alternatively, the atomic ratio of In to the element M and Zn is preferably In:M:Zn=5:1:6 or in the neighborhood thereof. Furthermore, as the composition of the semiconductor layer 108, the atomic proportions of In, the element M, and Zn in the semiconductor layer 108 may be approximately equal to each other. That is, a material in which the atomic ratio of In to the element M and Zn is In:M:Zn=1:1:1 or in the neighborhood thereof may be included.

For the functional layer 113, a metal such as aluminum, titanium, chromium, nickel, copper, yttrium, zirconium, molybdenum, silver, tantalum, or tungsten or an alloy containing any of the metals as its main component can be used.

For the functional layer 113, a material different from those for the metal oxide layer 114 and the conductive layer 112 is preferably used. Note that in this specification and the like, different materials mean materials having different constituent elements or materials having the same constituent element and different compositions. Even in the case where the metal oxide layer 114 has low adhesion to the conductive layer 112, providing the functional layer 113, which includes a material different from that for the metal oxide layer 114, between the metal oxide layer 114 and the conductive layer 112 can increase the adhesion between the metal oxide layer 114 and the conductive layer 112.

The functional layer 113 may have a stacked-layer structure of two or more layers of the aforementioned materials.

The semiconductor layer 108 includes a channel formation region overlapping with the conductive layer 112 with the insulating layer 110 therebetween. The semiconductor layer 108 includes the pair of regions 108N between which the channel formation region is sandwiched. The regions 108N are each a region of the semiconductor layer 108 that overlaps with neither the conductive layer 112 nor the insulating layer 110, and a region in contact with the insulating layer 116.

The regions 108N can also be regarded as regions having lower resistance than the channel formation region, regions having higher carrier concentration than the channel formation region, regions having higher oxygen defect density than the channel formation region, regions having higher impurity concentration than the channel formation region, or n-type regions.

The regions 108N are regions containing an impurity element (hereinafter, referred to as a first element). Examples of the first element include hydrogen, boron, carbon, nitrogen, fluorine, phosphorus, sulfur, arsenic, aluminum, magnesium, and a rare gas. Note that typical examples of a rare gas include helium, neon, argon, krypton, and xenon. In particular, boron, phosphorus, magnesium, or aluminum is preferably contained. Two or more of these elements may be contained.

Here, the regions 108N preferably have a concentration gradient such that the concentration of the first element is higher in a portion closer to the insulating layer 116. In that case, the total amount of the first element in the regions 108N can be smaller than that in the case where the concentration is uniform throughout the entire regions 108N; thus, the amount of the first element that might diffuse into the channel formation region due to the influence of heat applied during the manufacturing process or the like can be kept small. In addition, an upper portion of the regions 108N has lower resistance, and thus contact resistance with the conductive layer 120a (or the conductive layer 120b) can be more effectively reduced.

As described later, treatment for adding the first element to the regions 108N can be performed using the insulating layer 110 as a mask. Thus, the regions 108N can be formed in a self-aligned manner.

The regions 108N preferably include a region where the concentration of the first element is higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of the first element included in the regions 108N can be analyzed by an analysis method such as secondary ion mass spectrometry (SIMS) or X-ray photoelectron spectroscopy (XPS), for example. In the case of using XPS analysis, it is possible to find out the concentration distribution in the depth direction by combination of XPS analysis and ion sputtering from a front surface side or a rear surface side.

The first element preferably exists in an oxidized state in the regions 108N. For example, it is preferable to use an element that is easily oxidized, such as boron, phosphorus, magnesium, aluminum, or silicon, as the first element. Since such an element that is easily oxidized can exist stably in a state of being bonded to oxygen in the semiconductor layer 108 to be oxidized, the element can be inhibited from being released even when a high temperature (e.g., higher than or equal to 400° C., higher than or equal to 600° C., or higher than or equal to 800° C.) is applied in a later step. Furthermore, the first element takes oxygen in the semiconductor layer 108 away, and many oxygen vacancies are generated in the regions 108N. The oxygen vacancies are bonded to hydrogen in a film to serve as carrier supply sources; thus, the regions 108N are in an extremely low-resistance state.

Note that resistance might be increased if much oxygen is supplied from the outside or a film near the regions 108N to the regions 108N at the time of performing high-temperature treatment in a later step. Thus, in the case where high-temperature treatment is performed, the treatment is preferably performed with the semiconductor layer 108 covered with the insulating layer 116 that has a high barrier property against oxygen.

The insulating layer 116 is provided in contact with the regions 108N of the semiconductor layer 108.

The insulating layer 116 functions as a hydrogen supply source to the regions 108N. For example, the insulating layer 116 is preferably a film from which hydrogen is released by heating. When such an insulating layer 116 is provided in contact with the regions 108N and then heat treatment is performed after the formation of the insulating layer 116, hydrogen can be supplied to the regions 108N to reduce the resistance.

The insulating layer 116 is preferably a film deposited using a gas containing a hydrogen element as a deposition gas used for the deposition. Thus, hydrogen can be effectively supplied to the regions 108N also at the time of the deposition of the insulating layer 116.

For the insulating layer 116, for example, an insulating film of silicon nitride, silicon nitride oxide, silicon oxynitride, aluminum nitride, or aluminum nitride oxide can be used.

The regions 108N are in a state of containing many oxygen vacancies because the first element is added thereto as described above. Thus, hydrogen contained in the semiconductor layer 108 and hydrogen supplied from the insulating layer 116 can further increase the carrier concentration.

The insulating layer 118 functions as a protective layer protecting the transistor 100. For example, an inorganic insulating material such as an oxide or a nitride can be used for the insulating layer 118. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used. Alternatively, the insulating layer 118 can be used as a planarization layer. In that case, an organic resin material can be used for the insulating layer 118.

Note that although the case where a stacked-layer structure of the insulating layer 116 and the insulating layer 118 is employed as the protective layer is described here, the insulating layer 118 is not necessarily provided when not needed. Moreover, the insulating layer 118 may have a stacked-layer structure of two or more layers.

Here, the semiconductor layer 108 and oxygen vacancies that might be formed in the semiconductor layer 108 will be described.

Oxygen vacancies formed in the channel formation region of the semiconductor layer 108 affect the transistor characteristics and thus cause a problem. For example, when an oxygen vacancy is formed in the semiconductor layer 108, the oxygen vacancy might be bonded to hydrogen to serve as a carrier supply source. The carrier supply source generated in the channel formation region causes a change in the electrical characteristics, typically, a shift in the threshold voltage, of the transistor 100. Therefore, the amount of oxygen vacancies in the channel formation region is preferably as small as possible.

In view of this, one embodiment of the present invention has a structure in which insulating films in the vicinity of the channel formation region of the semiconductor layer 108, specifically, the insulating layer 110 positioned above the channel formation region and the insulating layer 103 positioned below the channel formation region each include an oxide film. When oxygen is moved from the insulating layer 103 and the insulating layer 110 to the channel formation region by heat during the manufacturing process or the like, the amount of oxygen vacancies in the channel formation region can be reduced.

The semiconductor layer 108 preferably includes a region where the atomic ratio of In to the element M is higher than 1. A higher percentage of In content results in higher field-effect mobility of the transistor.

Here, in the case of a metal oxide containing In, Ga, and Zn, bonding strength between In and oxygen is weaker than bonding strength between Ga and oxygen; thus, with a higher percentage of In content, oxygen vacancies are likely to be formed in the metal oxide film. There is a similar tendency even when a metal element shown above as the element M is used instead of Ga. The existence of a large amount of oxygen vacancies in the metal oxide film leads to a reduction in electrical characteristics and a reduction in reliability of the transistor.

However, in one embodiment of the present invention, an extremely large amount of oxygen can be supplied into the channel formation region of the semiconductor layer 108 including a metal oxide; thus, a metal oxide material with a high percentage of In content can be used. Accordingly, it is possible to achieve a transistor with extremely high field-effect mobility, stable electrical characteristics, and high reliability.

For example, a metal oxide in which the atomic ratio of In to the element M is 1.5 or higher, 2 or higher, 3 or higher, 3.5 or higher, or 4 or higher can be suitably used.

In particular, the atomic ratio of In to M and Zn in the semiconductor layer 108 is preferably In:M:Zn=4:2:3 or in the neighborhood thereof. Alternatively, the atomic ratio of In to M and Zn is preferably In:M:Zn=5:1:6 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In to the element M and Zn is In:M:Zn=1:1:1 or in the neighborhood thereof may be included.

For example, with the use of the transistor with high field-effect mobility in a gate driver that generates a gate signal, a display device with a small frame width (also referred to as a narrow frame) can be provided. Furthermore, with the use of the transistor with high field-effect mobility in a source driver (particularly a demultiplexer connected to an output terminal of a shift register included in the source driver), a display device to which a small number of wirings are connected can be provided.

Note that even when the semiconductor layer 108 includes the region where the atomic ratio of In to the element M is higher than 1, the field-effect mobility might be low if the semiconductor layer 108 has high crystallinity. The crystallinity of the semiconductor layer 108 can be analyzed using X-ray diffraction (XRD) or a transmission electron microscope (TEM), for example.

Here, by reducing the impurity concentration and reducing the density of defect states (reducing oxygen vacancies) in the channel formation region of the semiconductor layer 108, the carrier concentration in the film can be reduced. A transistor using such a metal oxide film for the channel formation region of the semiconductor layer rarely has electrical characteristics with a negative threshold voltage (also referred to as normally-on). Furthermore, a transistor using such a metal oxide film can have characteristics of an extremely low off-state current.

When a metal oxide film with high crystallinity is used for the semiconductor layer 108, damage in the processing of the semiconductor layer 108 or in the deposition of the insulating layer 110 can be inhibited, so that a highly reliable transistor can be achieved. By contrast, when a metal oxide film with relatively low crystallinity is used for the semiconductor layer 108, the electrical conductivity can be improved, so that a transistor with high field-effect mobility can be achieved.

As the semiconductor layer 108, a metal oxide film having a CAAC (c-axis aligned crystal) structure described later, a metal oxide film having an nc (nano crystal) structure, or a metal oxide film in which a CAAC structure and an nc structure are mixed is preferably used.

The semiconductor layer 108 may have a stacked-layer structure of two or more layers.

For example, the semiconductor layer 108 in which two or more metal oxide films with different compositions are stacked can be used. For example, in the case of using an In-M-Zn oxide, it is preferable to use a stack of two or more films each formed using a sputtering target in which the atomic ratio of In to the element M and Zn is In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

The semiconductor layer 108 in which two or more metal oxide films with different crystallinities are stacked can be used. In that case, the metal oxide films are preferably successively formed without exposure to the air using the same oxide target under different deposition conditions.

In this case, the semiconductor layer 108 can have a stacked-layer structure of a metal oxide film having an nc structure and a metal oxide film having a CAAC structure. Alternatively, a stacked-layer structure of a metal oxide film having an nc structure and a metal oxide film having an nc structure may be employed. Note that for a function or a material composition of a metal oxide that can be suitably used for these metal oxide films, reference can be made to the description of a CAC (Cloud-Aligned Composite) described later.

For example, the oxygen flow rate ratio at the time of depositing an earlier-formed first metal oxide film is set lower than the oxygen flow rate ratio at the time of depositing a subsequently formed second metal oxide film. Alternatively, a condition without oxygen flowing is employed at the time of depositing the first metal oxide film. In such a manner, oxygen can be effectively supplied at the time of depositing the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or depositing the insulating layer 110 can be inhibited.

More specifically, the oxygen flow rate ratio at the time of depositing the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of depositing the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the deposition, such as pressure, temperature, and power, may vary between the first metal oxide film and the second metal oxide film, it is preferable to employ the same conditions except for the oxygen flow rate ratio, in which case the time required for the deposition steps can be shortened.

With such a structure, the transistor 100 with excellent electrical characteristics and high reliability can be achieved.

For each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. Accordingly, oxygen released from the insulating layer 103 and the insulating layer 110 can be supplied to the channel formation region of the semiconductor layer 108 by heat treatment or the like in the manufacturing process of the transistor 100 to reduce oxygen vacancies in the semiconductor layer 108.

Part of the end portion of the insulating layer 110 is positioned over the semiconductor layer 108. The insulating layer 110 includes a region that overlaps with the conductive layer 112 and functions as a gate insulating layer.

The insulating layer 110 may have a stacked-layer structure of two or more layers. FIG. 2 illustrates an example in which the insulating layer 110 has a three-layer structure of an insulating layer 110a, an insulating layer 110c over the insulating layer 110a, and an insulating layer 110b between the insulating layer 110a and the insulating layer 110c. Note that insulating films formed of the same kind of material can be used for the insulating layer 110a, the insulating layer 110b, and the insulating layer 110c; thus, interfaces between the insulating layer 110a, the insulating layer 110b, and the insulating layer 110c cannot be clearly observed in some cases. Thus, in this embodiment, the interfaces between the insulating layer 110a, the insulating layer 110b, and the insulating layer 110c are shown by dashed lines.

The insulating layer 110a in contact with the channel formation region of the semiconductor layer 108 preferably has a low defect density in the vicinity of the interface with the channel formation region and in the film. In addition, the insulating layer 110a preferably has a low concentration of impurities including hydrogen in the film. Furthermore, damage to the semiconductor layer 108 caused at the time of forming the insulating layer 110a is preferably small. When the insulating layer 110a is deposited using a film with a low defect density and a low impurity concentration under the condition where damage to the semiconductor layer 108 is small, the transistor can have favorable electrical characteristics.

For example, in the case where a film containing silicon is formed for the insulating layer 110 by a PECVD method, the insulating layer 110a can be deposited under a condition with a small proportion of a silicon-containing gas in the deposition gases used for the deposition. With the use of a deposition condition with a small proportion of a silicon-containing gas in the deposition gases, the insulating layer 110a with a low defect density and a low impurity concentration can be formed. In addition, when the deposition power at the time of forming the insulating layer 110a is low, damage to the semiconductor layer 108 can be small.

It is preferable that the etching rate of the insulating layer 110c in contact with the metal oxide layer 114 with respect to an etchant used for processing the conductive layer 112 be almost equal to that of the conductive layer 112 or lower than that of the conductive layer 112.

The insulating layer 110c is preferably a film denser than the insulating layer 110a. The dense insulating layer 110c can be formed under a deposition condition with a lower deposition rate than the insulating layer 110a. Furthermore, water adsorption on the surface of the dense insulating layer 110c is inhibited. That is, providing the insulating layer 110c over the top surface of the insulating layer 110 can inhibit water adsorption on the surface of the insulating layer 110.

In the case where water is adsorbed on the surface of the insulating layer 110, hydrogen contained in the adsorbed water forms a carrier in the channel formation region when reaching the channel formation region, and adversely affects the electrical characteristics and reliability of the transistor in some cases. Providing the insulating layer 110c, on which water is unlikely to be adsorbed, over the top surface of the insulating layer 110 can inhibit carrier formation in the channel formation region, whereby favorable electrical characteristics and reliability can be obtained.

The insulating layer 110c can be formed using a deposition condition with a lower deposition rate than the insulating layer 110a. For example, in the case where a film containing silicon is used for the insulating layer 110, the insulating layer 110c can be deposited under a condition with a small proportion of a silicon-containing gas in the deposition gases used for the deposition. In addition, when the insulating layer 110c is deposited with a higher deposition power than the insulating layer 110a, the insulating layer on which water is unlikely to be adsorbed can be obtained.

The etching rate of the insulating layer 110c with respect to an etchant is preferably lower than that of the insulating layer 110a. Note that the insulating layer 110c has a higher film density than the insulating layer 110a in some cases. The difference in film density between the insulating layer 110a and the insulating layer 110c can be examined by the concentration (luminance) of a TEM image, for example.

The insulating layer 110b can be formed using a deposition condition with a higher deposition rate than the insulating layer 110a and the insulating layer 110c. With the use of the insulating layer 110b with a high deposition rate, the insulating layer 110 having a stacked-layer structure can be formed with high productivity.

For example, in the case where a film containing silicon is used for the insulating layer 110, the insulating layer 110b can be deposited under a condition with a larger proportion of a silicon-containing gas in the deposition gases than the insulating layer 110a and the insulating layer 110c. In addition, the insulating layer 110b can be an insulating layer with few impurities when deposited with a high power. Furthermore, the insulating layer 110b can be an insulating layer with few impurities when deposited at a high pressure.

The etching rate of the insulating layer 110b with respect to an etchant is preferably higher than those of the insulating layer 110a and the insulating layer 110c. Note that the insulating layer 110b has a lower film density than the insulating layer 110a and the insulating layer 110c in some cases. The difference in film density between the insulating layer 110a, the insulating layer 110b, and the insulating layer 110c can be examined by the concentration (luminance) of a TEM image, for example. Furthermore, the insulating layer 110b sometimes has a higher hydrogen concentration in the film than the insulating layer 110a and the insulating layer 110c. The difference in hydrogen concentration between the insulating layer 110a, the insulating layer 110b, and the insulating layer 110c can be examined by secondary ion mass spectrometry (SIMS), for example.

At the time of forming the conductive layer 112, the functional layer 113, and the metal oxide layer 114, the thickness of the insulating layer 110c in a region not overlapping with the conductive layer 112 is reduced in some cases. As illustrated in FIG. 2, the insulating layer 110c preferably remains in the region not overlapping with the conductive layer 112. With a structure in which the insulating layer 110c remains in the region not overlapping with the conductive layer 112, water adsorption on the insulating layer 110 can be inhibited. The thickness of the insulating layer 110c in the region overlapping with the conductive layer 112 is greater than or equal to 1 nm and less than or equal to 50 nm, preferably greater than or equal to 2 nm and less than or equal to 40 nm, further preferably greater than or equal to 3 nm and less than or equal to 30 nm.

Figure 3A:
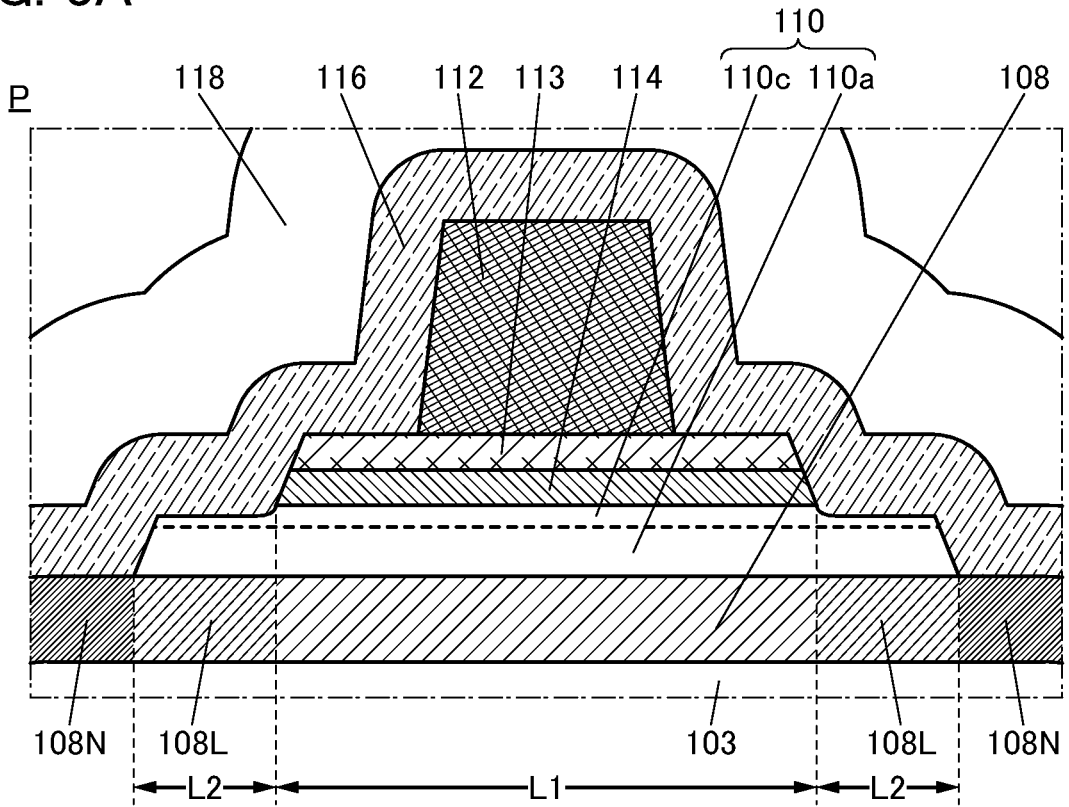
FIG. 3A and FIG. 3B are cross-sectional views each illustrating a structure example of a semiconductor device.

As illustrated in FIG. 3A, the insulating layer 110 may have a two-layer structure of the insulating layer 110a and the insulating layer 110c over the insulating layer 110a.

Figure 3B:
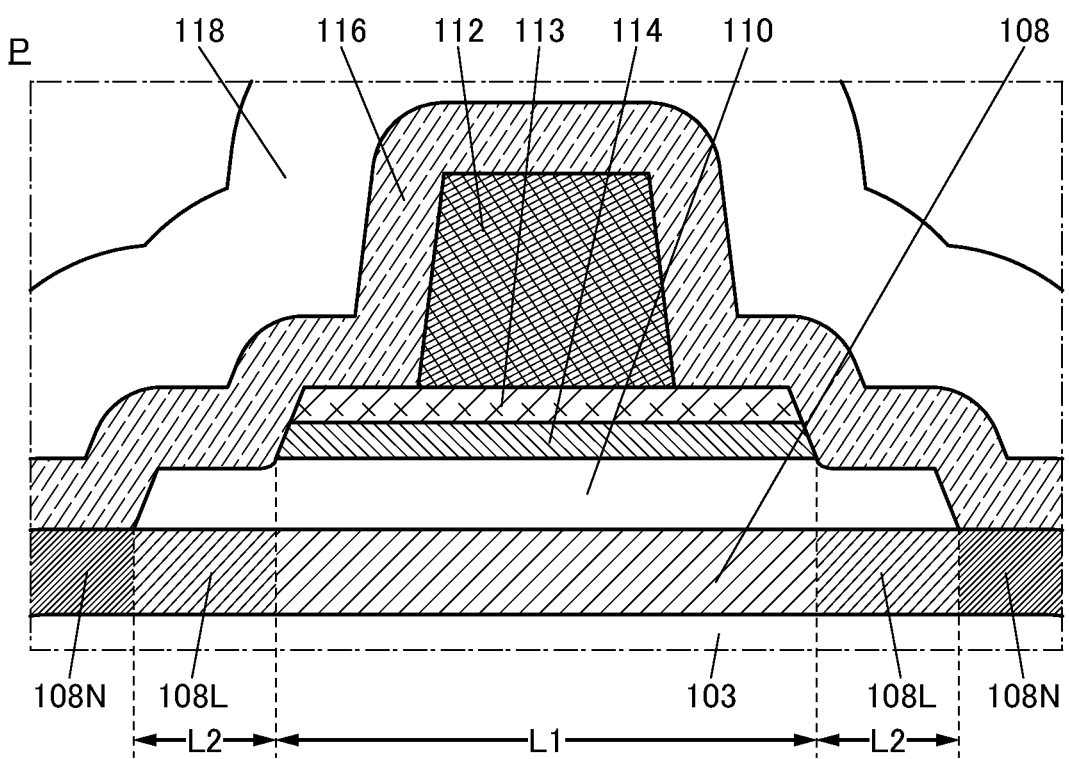

The insulating layer 110 may have a single-layer structure as illustrated in FIG. 3B. Any of the insulating layer 110a, the insulating layer 110b, and the insulating layer 110c may be selected as the insulating layer 110 as appropriate in accordance with the purpose.

Figure 4A:
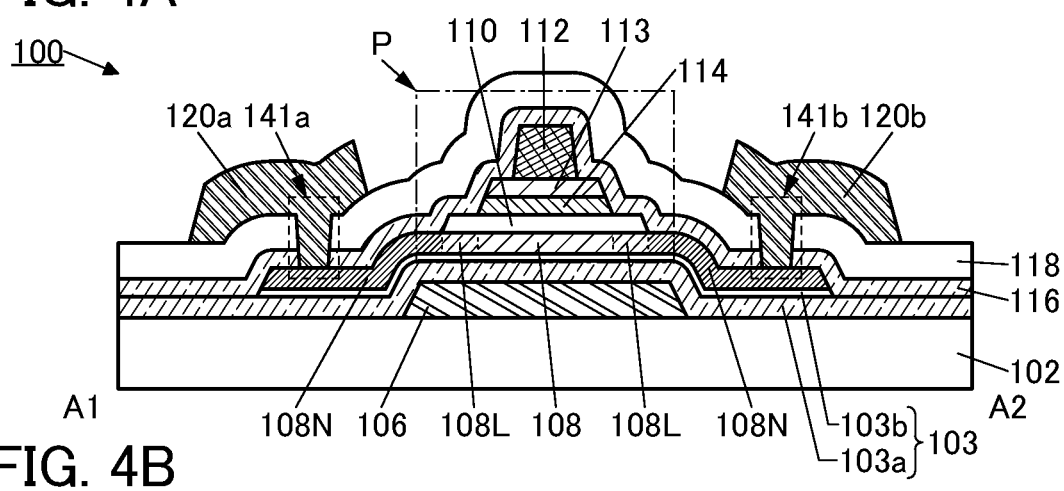
FIG. 4A and FIG. 4B are cross-sectional views illustrating a structure example of a semiconductor device.
Figure 4B:
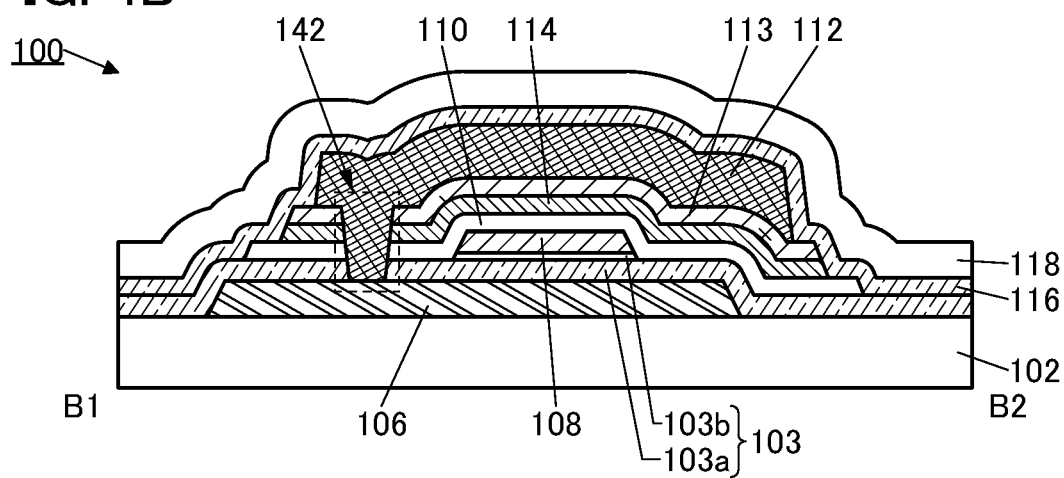

The insulating layer 103 can have a stacked-layer structure. An example of the transistor in which the insulating layer 103 has a stacked-layer structure is illustrated in FIG. 4A and FIG. 4B. FIG. 4A is a cross-sectional view of the transistor 100 in the channel length direction, and FIG. 4B is a cross-sectional view of the transistor 100 in the channel width direction.

The insulating layer 103 preferably has a stacked-layer structure of an insulating layer 103a and an insulating layer 103b over the insulating layer 103a. Nitride or nitride oxide such as silicon nitride, silicon nitride oxide, aluminum nitride, or aluminum nitride oxide can be suitably used for the insulating layer 103a, for example. Oxide or oxynitride such as silicon oxide, silicon oxynitride, aluminum oxide, aluminum oxynitride, hafnium oxide, or hafnium oxynitride can be suitably used for the insulating layer 103b, for example. The insulating layer 103a provided on the lower side of the insulating layer 103 can inhibit impurity diffusion from a layer below the insulating layer 103 into a layer above the insulating layer 103. In addition, the insulating layer 103b that is provided on the upper side of the insulating layer 103 and is in contact with the channel formation region enables oxygen released from the insulating layer 103 to be supplied to the channel formation region. The insulating layer 103 can have a stacked-layer structure of a silicon nitride film and a silicon oxynitride film over the silicon nitride film, for example.

Note that in this specification and the like, oxynitride refers to a substance that contains more oxygen than nitrogen in its composition, and oxynitride is included in oxide. Nitride oxide refers to a substance that contains more nitrogen than oxygen in its composition, and nitride oxide is included in nitride.

As illustrated in FIG. 4A and FIG. 4B, the transistor 100 preferably includes a region where the insulating layer 103a is in contact with the insulating layer 116. The region where the insulating layer 103a is in contact with the insulating layer 116 can inhibit diffusion of impurities into the transistor 100 from the outside of the transistor 100.

The transistor 100 includes a conductive layer 106 between the substrate 102 and the insulating layer 103, and the conductive layer 106 includes a region overlapping with the channel formation region of the semiconductor layer 108, the metal oxide layer 114, the functional layer 113, and the conductive layer 112.

In the transistor 100, the conductive layer 106 has a function of a first gate electrode (also referred to as a bottom gate electrode), and the functional layer 113 and the conductive layer 112 have a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with one or more of the functional layer 113, the conductive layer 112, and the conductive layer 106 functions as a channel formation region. Note that for easy explanation, a portion of the semiconductor layer 108 that overlaps with the functional layer 113 and the conductive layer 112 is sometimes referred to as a channel formation region in the following description; however, a channel can also be actually formed in a portion not overlapping with the functional layer 113 and the conductive layer 112 but overlapping with the conductive layer 106 (a portion including the regions 108N).

As illustrated in FIG. 1C and FIG. 4B, the conductive layer 106 may be electrically connected to the conductive layer 112 through an opening 142 provided in the functional layer 113, the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120a, or the conductive layer 120b can be used. In particular, a material containing copper is preferably used for the conductive layer 106, in which case wiring resistance can be reduced. When a material including a high-melting-point metal such as tungsten or molybdenum is used for the conductive layer 106, treatment in a later step can be performed at high temperatures.

As illustrated in FIG. 1C and FIG. 4B, the functional layer 113, the conductive layer 112, and the conductive layer 106 preferably extend beyond an end portion of the semiconductor layer 108 in the channel width direction. In this case, a structure is employed in which the semiconductor layer 108 in the channel width direction is entirely covered with the functional layer 113, the conductive layer 112, and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be supplied to the conductive layer 106, the functional layer 113, and the conductive layer 112. In that case, electric fields for inducing a channel can be effectively applied to the semiconductor layer 108, whereby the on-state current of the transistor 100 can be increased. Thus, the transistor 100 can be miniaturized.

Note that a structure in which the functional layer 113 and the conductive layer 112 are not connected to the conductive layer 106 may be employed. In this case, a constant potential may be supplied to one of the pair of gate electrodes, and a signal for driving the transistor 100 may be supplied to the other. In this case, the potential supplied to one of the gate electrodes can control the threshold voltage at the time of driving the transistor 100 with the other gate electrode.

A structure example of a transistor whose structure is partly different from that of Structure example 1 is described below. Note that description of the same portions as those in Structure example 1 is omitted below in some cases. Furthermore, in drawings that are referred to later, the same hatching pattern is applied to portions having functions similar to those in Structure example 1, and the portions are not denoted by reference numerals in some cases.

Structure Example 2

Figure 5A:
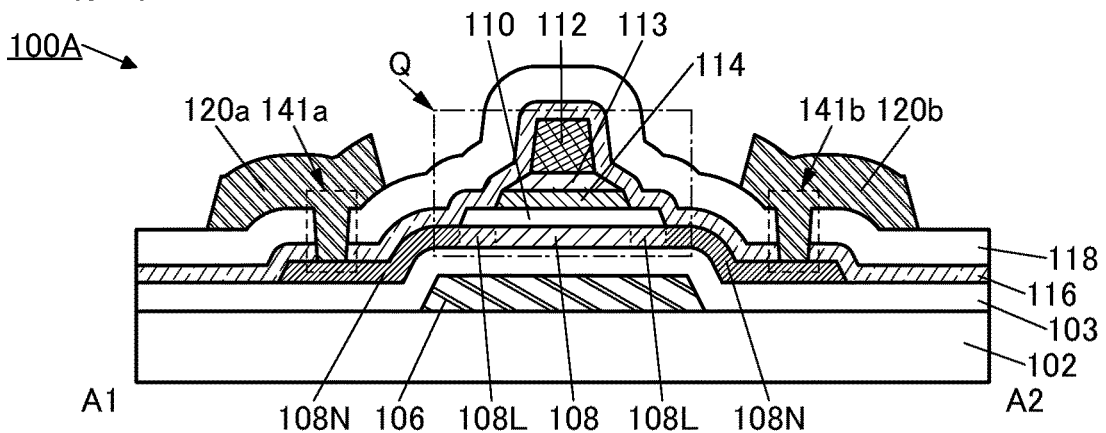
FIG. 5A, FIG. 5B, and FIG. 5C are cross-sectional views illustrating a structure example of a semiconductor device.
Figure 5B:
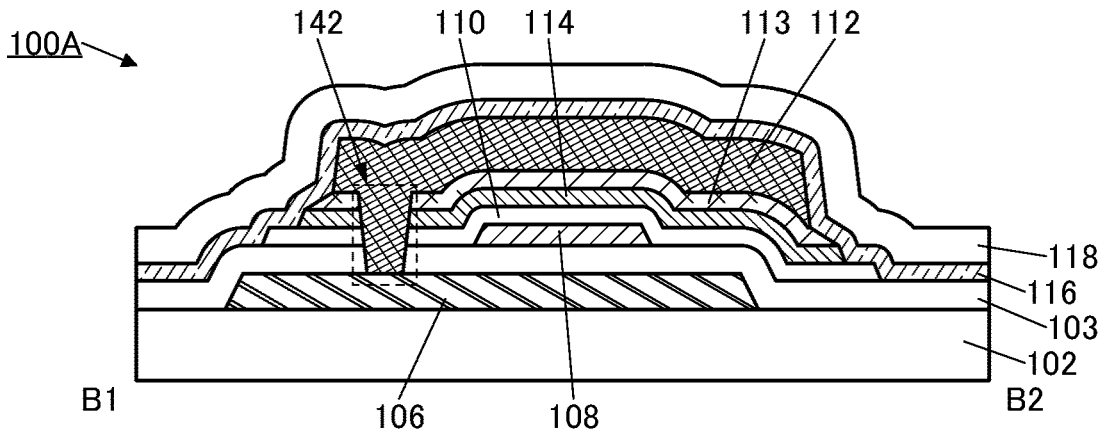
Figure 5C:
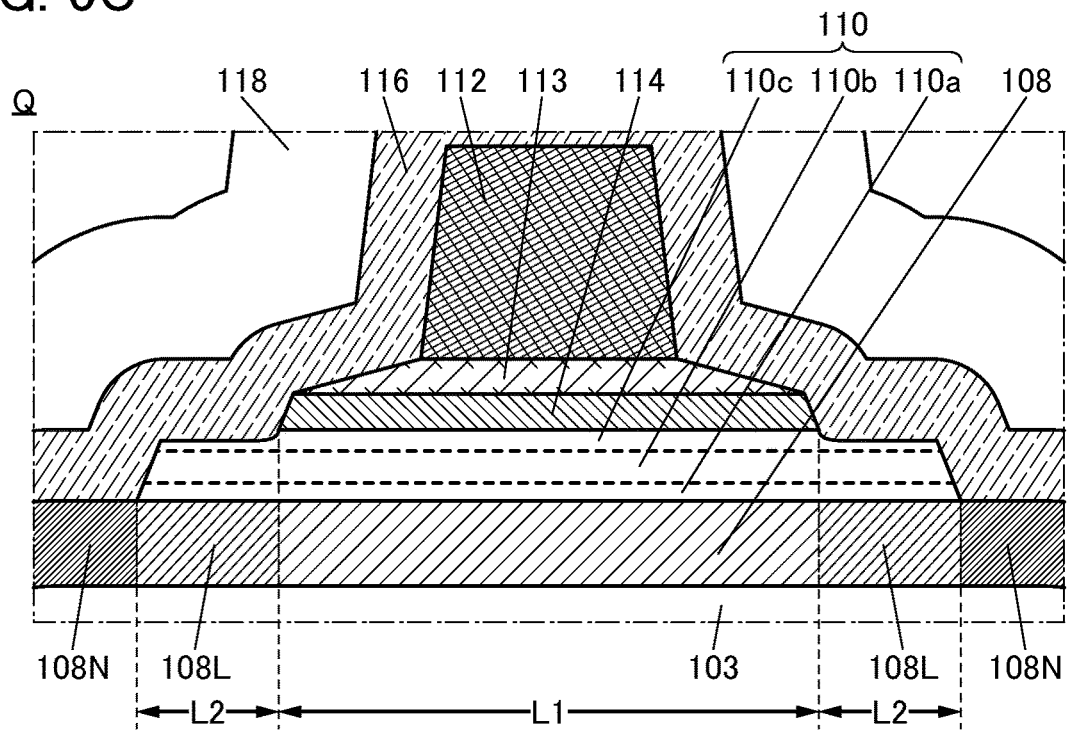

FIG. 5A is a cross-sectional view of a transistor 100A in the channel length direction, and FIG. 5B is a cross-sectional view of the transistor 100A in the channel width direction. An enlarged view of a region Q surrounded by a dashed-dotted line in FIG. 5A is shown in FIG. 5C.

The transistor 100A is different from Structure example 1 mainly in that the thickness of the functional layer 113 in a region not overlapping with the conductive layer 112 is smaller than the thickness of the functional layer 113 in a region overlapping with the conductive layer 112.

When the thickness of the functional layer 113 in the region not overlapping with the conductive layer 112 is small, a step can be small, the coverage with layers formed over the functional layer 113 is improved, and the generation of defects such as disconnection and voids on the layers can be inhibited.

The above is the description of Structure example 2.

Structure Example 3

Figure 6A:
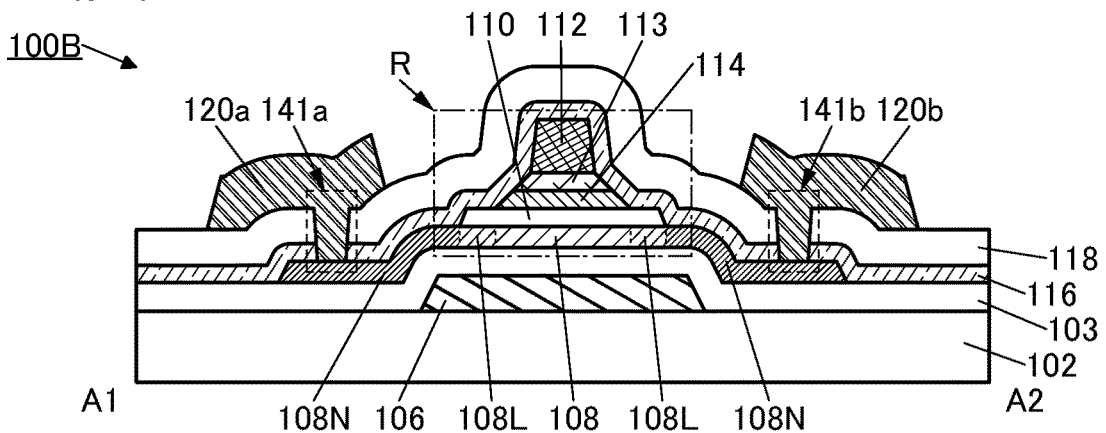
FIG. 6A, FIG. 6B, and FIG. 6C are cross-sectional views illustrating a structure example of a semiconductor device.
Figure 6B:
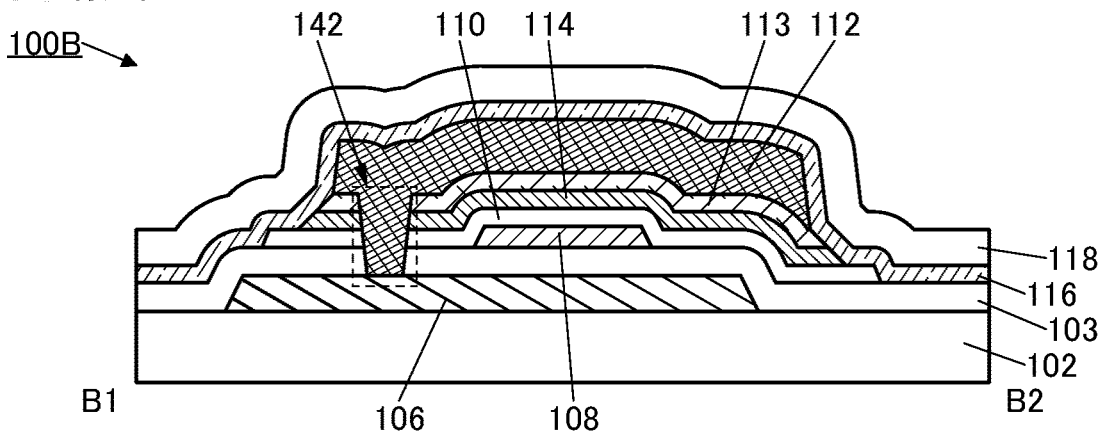
Figure 6C:
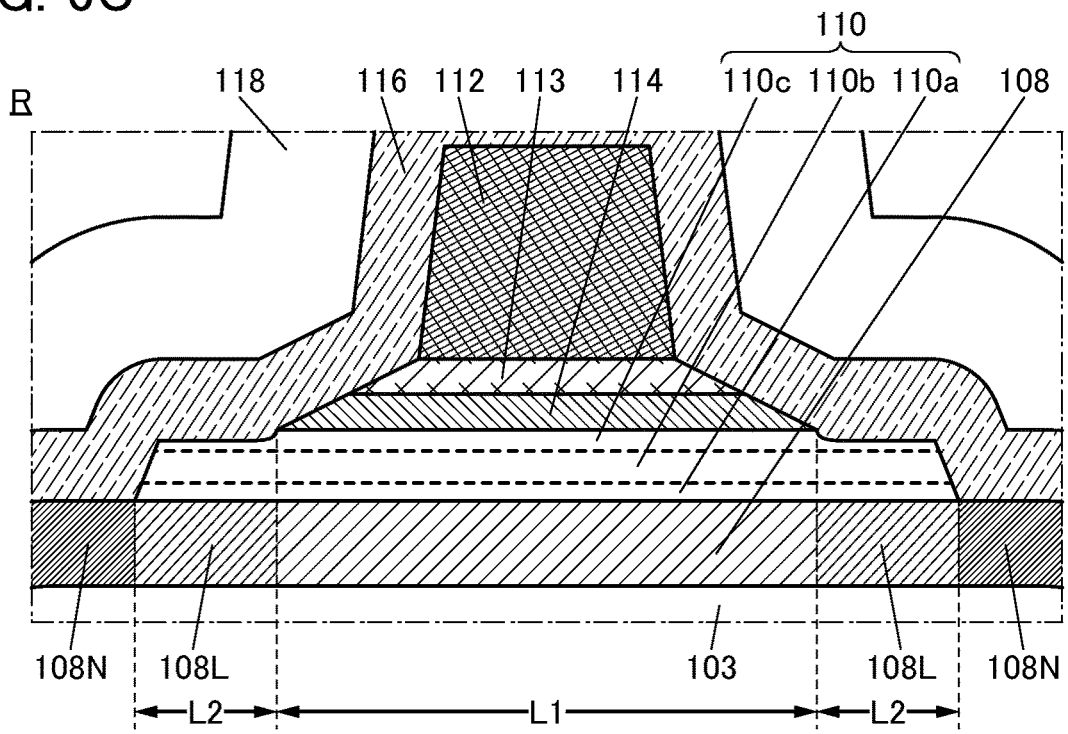

FIG. 6A is a cross-sectional view of a transistor 100B in the channel length direction, and FIG. 6B is a cross-sectional view of the transistor 100B in the channel width direction. An enlarged view of a region R surrounded by a dashed-dotted line in FIG. 6A is shown in FIG. 6C.

The transistor 100B is different from Structure example 1 mainly in that the thickness of the functional layer 113 in a region not overlapping with the conductive layer 112 is smaller than the thickness of the functional layer 113 in a region overlapping with the conductive layer 112, and the thickness of the metal oxide layer 114 in a region not overlapping with the conductive layer 112 is smaller than the thickness of the metal oxide layer 114 in a region overlapping with the conductive layer 112.

The cross sections of the conductive layer 112 and the functional layer 113 are preferably continuous. When the cross sections of the conductive layer 112 and the functional layer 113 are continuous, the coverage with layers formed over the conductive layer 112 and the functional layer 113 is improved, which can inhibit the generation of defects such as disconnection and voids on the layers.

The above is the description of Structure example 3.

Manufacturing Method Example 1

A manufacturing method of the semiconductor device of one embodiment of the present invention is described below with reference to drawings. Here, the description is made using, as an example, the transistor 100 exemplified in the above structure example.

Note that thin films that constitute the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that constitute the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, and the thin film is processed by etching or the like, so that the resist mask is removed. In the other method, after a photosensitive thin film is deposited, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

Each drawing in FIG. 7A to FIG. 11B illustrates cross sections of the transistor 100A in each step in the manufacturing process. In each drawing, a cross section in the channel length direction is shown on the left side of the central dashed line, and a cross section in the channel width direction is shown on the right side.

[Formation of Conductive Layer 106]

A conductive film is deposited over the substrate 102 and processed by etching to form the conductive layer 106 functioning as a first gate electrode (FIG. 7A).

[Formation of Insulating Layer 103]

Then, the insulating layer 103 is formed to cover the substrate 102 and the conductive layer 106 (FIG. 7B). The insulating layer 103 can be formed by a PECVD method, an ALD method, a sputtering method, or the like.

In the case where the insulating layer 103 has a stacked-layer structure, insulating films to be the insulating layer 103 are sequentially formed. For example, in the case where the insulating layer 103 has a stacked-layer structure of a nitride film and an oxide film over the nitride film, the nitride film and the oxide film are formed in this order.

The nitride film included in the insulating layer 103 may have a stacked-layer structure of two or more layers. In the case where the insulating layer 103 has a stacked-layer structure of, for example, a first silicon nitride film, a second silicon nitride film over the first silicon nitride film, a third silicon nitride film over the second silicon nitride film, and a silicon oxynitride film over the third silicon nitride film, the first silicon nitride film, the second silicon nitride film, the third silicon nitride film, and the silicon oxynitride film are formed in this order.

In the case where the insulating layer 103 has a stacked-layer structure of the first silicon nitride film, the second silicon nitride film, the third silicon nitride film, and the silicon oxynitride film, the first silicon nitride film preferably has a function of blocking impurities. Providing the first silicon nitride film can inhibit impurity diffusion from a layer below the insulating layer 103 into a layer above the insulating layer 103. The second silicon nitride film preferably has low stress and high withstand voltage. Providing the second silicon nitride film enables the insulating layer 103 to have low stress and high withstand voltage. It is preferable that the third silicon nitride film release a small amount of impurities including hydrogen and have a function of blocking impurities including hydrogen. Providing the third silicon nitride film can inhibit hydrogen diffusion into the channel formation region. It is preferable that the silicon oxynitride film have a low defect density and release a small amount of impurities including hydrogen.

For example, in the formation of the insulating layer 103, the first silicon nitride film having a function of blocking impurities is formed by a plasma CVD method using a mixed gas of silane, nitrogen, and ammonia. Next, the second silicon nitride film having low stress and high withstand voltage is deposited using a mixed gas with a higher ammonia flow rate than the first silicon nitride film. Then, the third silicon nitride film that releases a small amount of impurities including hydrogen and has a function of blocking impurities including hydrogen is deposited using a mixed gas with a lower ammonia flow rate than the second silicon nitride film. Subsequently, the silicon oxynitride film that has a low defect density and releases a small amount of impurities including hydrogen is deposited using a mixed gas of silane and dinitrogen monoxide, whereby the insulating layer 103 can be formed. Furthermore, changing the deposition conditions in the same chamber enables the first silicon nitride film, the second silicon nitride film, the third silicon nitride film, and the silicon oxynitride film to be successively deposited in vacuum, so that the insulating layer 103 can be formed with high productivity.

Alternatively, when plasma treatment is performed in an oxygen-containing atmosphere to oxidize a surface of the third silicon nitride film after the deposition of the third silicon nitride film, the silicon oxynitride film can be formed over the third silicon nitride film.

The second silicon nitride film has a lower film density than the first silicon nitride film and the third silicon nitride film in some cases. The difference in film density between the first silicon nitride film, the second silicon nitride film, and the third silicon nitride film can be examined by the concentration (luminance) of a TEM image, for example. Furthermore, the second silicon nitride film has a higher hydrogen concentration in the film than the first silicon nitride film and the third silicon nitride film in some cases. The difference in hydrogen concentration between the first silicon nitride film, the second silicon nitride film, and the third silicon nitride film can be examined by secondary ion mass spectrometry (SIMS), for example.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method. Note that heat treatment is not necessarily performed after the formation of the insulating layer 103.

[Formation of Semiconductor Layer 108]

Next, a metal oxide film is deposited over the insulating layer 103 and processed to form the semiconductor layer 108 having an island shape (FIG. 7C).

The metal oxide film is preferably formed by a sputtering method using a metal oxide target.

An oxygen gas and an inert gas (e.g., a helium gas, an argon gas, or a xenon gas) may be mixed at the time of depositing the metal oxide film. Note that when the proportion of an oxygen gas in the whole deposition gas (an oxygen flow rate ratio) at the time of depositing the metal oxide film is higher, the crystallinity of the metal oxide film can be higher and a highly reliable transistor can be achieved. By contrast, when the oxygen flow rate ratio is lower, the crystallinity of the metal oxide film is lower and a transistor with a higher on-state current can be obtained.

In the case where the semiconductor layer 108 has a stacked-layer structure, successive deposition is preferably performed using the same sputtering target in the same deposition chamber because the interface can be a favorable one. Although the deposition conditions such as pressure, temperature, and power at the time of the deposition may vary between the metal oxide films, it is particularly preferable to employ the same conditions except for the oxygen flow rate ratio because the time required for deposition steps can be shortened. Furthermore, in the case where metal oxide films having different compositions are stacked, successive deposition without exposure to the air is preferably performed.

The deposition conditions of the metal oxide film are preferably set such that a metal oxide film having a CAAC structure, a metal oxide film having an nc structure, or a metal oxide film in which a CAAC structure and an nc structure are mixed is obtained. Note that the deposition conditions for the metal oxide film deposited to have a CAAC structure and the deposition conditions for the metal oxide film deposited to have an nc structure each vary depending on the composition of a sputtering target to be used; thus, pressure, power, and the like, in addition to a substrate temperature and an oxygen flow rate ratio, are set as appropriate depending on the composition.

As the deposition conditions of the metal oxide film, the substrate temperature is set higher than or equal to room temperature and lower than or equal to 450° C., and the substrate temperature is preferably set higher than or equal to room temperature and lower than or equal to 300° C., further preferably higher than or equal to room temperature and lower than or equal to 200° C., still further preferably higher than or equal to room temperature and lower than or equal to 140° C. The substrate temperature is preferably set higher than or equal to room temperature and lower than 140° C. in the case where a large-sized glass substrate or a resin substrate is used as the substrate 102, for example, because high productivity is achieved. Furthermore, when the metal oxide film is deposited with the substrate temperature set at room temperature or without heating, the crystallinity can be made low.

It is preferable to perform treatment for desorbing water, hydrogen, an organic substance, or the like adsorbed onto a surface of the insulating layer 103 or treatment for supplying oxygen into the insulating layer 103 before deposition of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment is performed in an atmosphere containing a dinitrogen monoxide gas, an organic substance on the surface of the insulating layer 103 can be suitably removed. After such treatment, the metal oxide film is preferably deposited successively without exposure of the surface of the insulating layer 103 to the air.

For processing of the metal oxide film, either one or both of a wet etching method and a dry etching method are used. At this time, part of the insulating layer 103 that does not overlap with the semiconductor layer 108 is etched and thinned in some cases.

After the metal oxide film is deposited or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C. Note that heat treatment is not necessarily performed after the metal oxide film is deposited or processed into the semiconductor layer 108. The heat treatment may be performed at any stage as long as it is after the deposition of the metal oxide film. The heat treatment may also serve as heat treatment or a heat application step that is to be performed later.

The heat treatment can be performed in an atmosphere containing a rare gas or nitrogen. Alternatively, heating may be performed in the atmosphere, and then heating may be performed in an oxygen-containing atmosphere. As a nitrogen-containing atmosphere or an oxygen-containing atmosphere, clean dry air (CDA) may be used. It is preferable that the atmosphere of the above heat treatment not contain hydrogen, water, or the like. When a gas which is highly purified to have a dew point of −60° C. or lower, preferably −100° C. or lower is used, hydrogen, water, or the like can be prevented from being taken into the semiconductor layer 108 as much as possible. An electric furnace, a rapid thermal annealing (RTA) apparatus, or the like can be used for the heat treatment. The use of the RTA apparatus can shorten the heat treatment time.

Note that an insulating film 110f is preferably formed immediately after the formation of the semiconductor layer 108. In a state where the surface of the semiconductor layer 108 is exposed, water is adsorbed on the surface of the semiconductor layer 108 in some cases. When water is adsorbed on the surface of the semiconductor layer 108, hydrogen is diffused into the semiconductor layer 108 by later heat treatment or the like, so that $V_OH$ is formed in some cases. Since $V_OH$ might be a carrier generation source, the amount of water adsorbed on the semiconductor layer 108 is preferably small.

[Formation of Insulating Film 110*f*, metal oxide film 114*f*, and Functional Film 113*f*]

Next, the insulating film 110*f* and a metal oxide film 114*f* are formed to cover the insulating layer 103 and the semiconductor layer 108.

The insulating film 110*f* is a film to be the insulating layer 110 later. As the insulating film 110*f*, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, a PECVD method using a microwave may be employed.

In the case where the insulating layer 110 has a stacked-layer structure, insulating films to be the insulating layer 110 are sequentially formed. For example, in the case where the insulating layer 110 has a three-layer structure of the insulating layer 110*a*, the insulating layer 110*b*, and the insulating layer 110*c* as illustrated in FIG. 2, an insulating film to be the insulating layer 110*a*, an insulating film to be the insulating layer 110*b*, and an insulating film to be the insulating layer 110*c* are formed in this order.

For example, in the formation of the insulating layer 110, the insulating film to be the insulating layer 110*a* is formed by a plasma CVD method using a mixed gas of silane and dinitrogen monoxide. Next, the insulating film to be the insulating layer 110*b* is deposited using a mixed gas in which a ratio of the silane flow rate to the dinitrogen monoxide flow rate is higher than that for the insulating film to be the insulating layer 110*a* under a condition with a higher power. Then, the insulating film to be the insulating layer 110*c* is deposited using a mixed gas in which a ratio of the silane flow rate to the dinitrogen monoxide flow rate is lower than that for the insulating film to be the insulating layer 110*b* under a condition with a lower pressure, whereby the insulating films to be the insulating layer 110 can be formed. Furthermore, changing the deposition conditions in the same chamber enables the insulating film to be the insulating layer 110*a*, the insulating film to be the insulating layer 110*b*, and the insulating film to be the insulating layer 110*c* to be successively deposited in vacuum, so that the insulating film 110*f* can be formed with high productivity.

For example, in the case where the insulating layer 110 has a two-layer structure of the insulating layer 110*a* and the insulating layer 110*c* as illustrated in FIG. 3A, the insulating film to be the insulating layer 110*a* and the insulating film to be the insulating layer 110*c* are formed in this order.

For example, in the formation of the insulating layer 110, the insulating film to be the insulating layer 110*a* is formed by a plasma CVD method using a mixed gas of silane and dinitrogen monoxide. Then, the insulating film to be the insulating layer 110*c* is deposited under conditions with a lower pressure and a higher power than the insulating film to be the insulating layer 110*a*, whereby the insulating films to be the insulating layer 110 can be formed. Furthermore, changing the deposition conditions in the same chamber enables the insulating film to be the insulating layer 110*a* and the insulating film to be the insulating layer 110*c* to be successively deposited in vacuum, so that the insulating film 110*f* can be formed with high productivity.

Heat treatment may be performed after the formation of the insulating film 110*f*. The heat treatment can remove impurities in the insulating film 110*f* and adsorbed water on the surface of the insulating film 110*f*. The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the insulating film 110*f*. The heat treatment may be performed at any stage as long as it is after the formation of the insulating film 110*f*. The heat treatment may also serve as heat treatment or a heat application step that is to be performed later.

The metal oxide film 114*f* is a film to be the metal oxide layer 114 later. The metal oxide film 114*f* is preferably formed by a sputtering method in an oxygen-containing atmosphere, for example. Thus, oxygen can be supplied to the insulating film 110*f* at the time of depositing the metal oxide film 114*f*.

In the case where the metal oxide film 114*f* is formed by a sputtering method using an oxide target including a metal oxide similar to that in the case of the semiconductor layer 108, reference can be made to the above description.

The metal oxide film 114*f* may be formed by a reactive sputtering method with a metal target using oxygen as a deposition gas. In the case where aluminum is used for the metal target, an aluminum oxide film can be deposited.

At the time of depositing the metal oxide film 114*f*, the amount of oxygen supplied into the insulating film 110*f* can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferable that the oxygen flow rate ratio be 100% and the oxygen partial pressure be as close to 100% as possible.

When the metal oxide film 114*f* is formed by a sputtering method in an oxygen-containing atmosphere in the above manner, oxygen can be supplied to the insulating film 110*f* and release of oxygen from the insulating film 110*f* can be prevented during the deposition of the metal oxide film 114*f*. As a result, an extremely large amount of oxygen can be enclosed in the insulating film 110*f*. Then, by heat treatment performed later, a large amount of oxygen is supplied to the channel formation region of the semiconductor layer 108, so that oxygen vacancies in the channel formation region can be reduced, and thus a highly reliable transistor can be achieved.

As the deposition conditions of the metal oxide film 114*f*, the substrate temperature is set higher than or equal to room temperature and lower than or equal to 450° C., and the substrate temperature is preferably set higher than or equal to room temperature and lower than or equal to 300° C., further preferably higher than or equal to room temperature and lower than or equal to 200° C., still further preferably higher than or equal to room temperature and lower than or equal to 140° C. The substrate temperature is preferably set higher than or equal to room temperature and lower than 140° C. in the case where a large-sized glass substrate or a resin substrate is used as the substrate 102, for example, because high productivity is achieved. In addition, when the deposition temperature of the metal oxide film 114*f* is high, the crystallinity of the metal oxide film 114*f* is increased and the etching rate is decreased in some cases. When the deposition temperature of the metal oxide film 114*f* is low, the crystallinity of the metal oxide film 114*f* is decreased and the etching rate is increased in some cases. The deposition temperature of the metal oxide film 114*f* may be selected as appropriate so that the etching rate with respect to an etchant used for processing the metal oxide film 114*f* is desirable.

Oxygen may be supplied from the insulating film 110*f* to the semiconductor layer 108 by heat treatment performed after the formation of the metal oxide film 114*f*. The heat treatment can be performed at a temperature higher than or equal to 200° C. and lower than or equal to 400° C. in an atmosphere containing one or more of nitrogen, oxygen, and a rare gas. Note that heat treatment is not necessarily performed after the formation of the metal oxide film 114*f*. The heat treatment may be performed at any stage as long as it is after the deposition of the metal oxide film 114*f*. The heat treatment may also serve as heat treatment or a heat application step that is to be performed later.

Next, a functional film 113*f* to be the functional layer 113 is deposited over the metal oxide film 114*f* (FIG. 8A). The functional film 113*f* is preferably deposited by a sputtering method using a sputtering target of a metal or an alloy.

Heat treatment may be performed after the formation of the functional film 113*f*. In the case where an oxygen-containing material is used for the functional film 113*f*, the heat treatment performed after the formation of the functional film 113*f* allows oxygen to be supplied from the functional film 113*f* to the semiconductor layer 108. The heat treatment can be performed at a temperature higher than or equal to 200° C. and lower than or equal to 400° C. in an atmosphere containing one or more of nitrogen, oxygen, and a rare gas. Note that the heat treatment is not necessarily performed after the formation of the functional film 113*f*.

Then, parts of the functional film 113*f*, the metal oxide film 114*f*, the insulating film 110*f*, and the insulating layer 103 are etched to form the opening 142 reaching the conductive layer 106 (FIG. 8B). Accordingly, the conductive layer 112 to be formed later can be electrically connected to the conductive layer 106 through the opening 142.

[Formation of Conductive Film 112*f*]

Next, a conductive film 112*f* to be the conductive layer 112 is deposited over the functional film 113*f* (FIG. 9A). The conductive film 112*f* is preferably deposited by a sputtering method using a sputtering target of a metal or an alloy.

[Formation of Insulating Layer 110, Metal Oxide Layer 114, Functional Layer 113, and Conductive Layer 112]

Then, a resist mask 115 is formed over the conductive film 112*f* (FIG. 9B). After that, the conductive film 112*f*, the functional film 113*f*, and the metal oxide film 114*f* that are in a region not covered with the resist mask 115 are removed, so that the conductive layer 112, the functional layer 113, and the metal oxide layer 114 are formed (FIG. 10A).

A wet etching method can be suitably used for formation of the conductive layer 112, the functional layer 113, and the metal oxide layer 114. In a wet etching method, for example, an etchant containing hydrogen peroxide can be used. For example, an etchant containing one or more of phosphoric acid, acetic acid, nitric acid, hydrochloric acid, and sulfuric acid can be used. In particular, in the case where a material containing copper is used for the conductive layer 112, an etchant containing phosphoric acid, acetic acid, and nitric acid can be suitably used.

The etching rates of the metal oxide layer 114 and the functional layer 113 are lower than that of the conductive layer 112, so that the functional layer 113, the metal oxide layer 114, and the conductive layer 112 can be formed in the same step. Furthermore, the end portion of the conductive layer 112 can be located inward from the end portions of the metal oxide layer 114 and the functional layer 113. In addition, the formation in the same step can simplify the process and increase the productivity.

The processing is performed such that the end portions of the conductive layer 112, the functional layer 113, and the metal oxide layer 114 are located inward from the outline of the resist mask 115. A wet etching method is suitably used for the formation of the conductive layer 112, the functional layer 113, and the metal oxide layer 114. The widths of the regions 108L can be controlled by adjustment of the etching time.

The conductive layer 112, the functional layer 113, and the metal oxide layer 114 may be formed in the following manner: the conductive film 112*f*, the functional film 113*f*, and the metal oxide film 114*f* are etched by an anisotropic etching method, and then side surfaces of the conductive film 112*f*, the functional film 113*f*, and the metal oxide film 114*f* are etched by an isotropic etching method to make the end surfaces recede (also referred to as side etching). Consequently, the conductive layer 112, the functional layer 113, and the metal oxide layer 114 whose end portions are located inward from that of the insulating layer 110 in a plan view can be formed.

At the time of forming the conductive layer 112, the functional layer 113, and the metal oxide layer 114, the conductive layer 112 recedes from the functional layer 113 and the metal oxide layer 114, and the thickness of the functional layer 113 in the region not overlapping with the conductive layer 112 is smaller than the thickness of the functional layer 113 in the region overlapping with the conductive layer 112 in some cases (see FIG. 5A, FIG. 5B, and FIG. 5C). In addition, the thickness of the metal oxide layer 114 in the region not overlapping with the conductive layer 112 is smaller than the thickness of the metal oxide layer 114 in the region overlapping with the conductive layer 112 and the functional layer 113 in some cases (see FIG. 6A, FIG. 6B, and FIG. 6C).

Note that for the formation of the conductive layer 112, the functional layer 113, and the metal oxide layer 114, etching may be performed at least twice using different etching conditions or methods. For example, the conductive film 112*f* may be etched first, and then the functional film 113*f* and the metal oxide film 114*f* may be etched under different etching conditions.

Next, the insulating film 110*f* in a region not covered with the resist mask 115 is removed to form the insulating layer 110 (FIG. 10B). For the formation of the insulating layer 110, either one or both of a wet etching method and a dry etching method can be used. Although the insulating layer 110 may be formed in a state where the resist mask 115 is removed, a reduction in the thickness of the conductive layer 112 can be inhibited when the resist mask 115 is left.

After the formation of the insulating layer 110, the resist mask 115 is removed.

[Formation of Insulating layer 116 and Regions 108N (Treatment for Supplying Hydrogen)]

Subsequently, treatment for supplying hydrogen to an exposed region of the semiconductor layer 108 is performed. Here, the insulating layer 116 containing hydrogen is deposited in contact with the exposed region of the semiconductor layer 108 to supply hydrogen (FIG. 11A).

The insulating layer 116 is preferably formed by a plasma CVD method using a deposition gas containing hydrogen. For example, a silicon nitride film is deposited using a deposition gas containing a silane gas and an ammonia gas. Using the ammonia gas in addition to the silane gas enables the film to contain a large amount of hydrogen. Furthermore, hydrogen can be supplied to the exposed portion of the semiconductor layer 108 at the time of the deposition.

Heat treatment is preferably performed after the deposition of the insulating layer 116 so that part of hydrogen released from the insulating layer 116 is supplied to part of the semiconductor layer 108. The heat treatment is preferably performed in an atmosphere containing one or more of nitrogen, oxygen, and a rare gas at a temperature higher than or equal to 150° C. and lower than or equal to 450° C., further preferably higher than or equal to 200° C. and lower than or equal to 400° C.

By supplying hydrogen as described above, the regions 108N having extremely low resistance can be formed in the semiconductor layer 108.

Oxygen can be supplied from the insulating layer 110 to the channel formation region of the semiconductor layer 108 by the heat treatment.

[Formation of Insulating Layer 118]

Next, the insulating layer 118 is formed over the insulating layer 116.

In the case where the insulating layer 118 is formed by a plasma CVD method at a too high deposition temperature, impurities contained in the regions 108N and the like might be diffused into a peripheral portion including the channel formation region of the semiconductor layer 108, depending on the impurities. As a result, the resistance of the channel formation region might be lowered, and the resistance of the regions 108N might be increased, for example. The deposition temperature of the insulating layer 116 or the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Formation of the insulating layer 118 at low temperatures enables the transistor to have favorable electrical characteristics even when it has a short channel length.

Heat treatment may be performed after the formation of the insulating layer 118.

[Formation of Opening Portion 141a and Opening Portion 141b]

Next, a mask is formed by lithography in a desired position on the insulating layer 118, and then parts of the insulating layer 118 and the insulating layer 116 are etched to form the opening portion 141a and the opening portion 141b reaching the regions 108N.

[Formation of Conductive Layer 120a and Conductive Layer 120b]

Next, a conductive film is deposited over the insulating layer 118 to cover the opening portion 141a and the opening portion 141b, and the conductive film is processed into a desired shape, so that the conductive layer 120a and the conductive layer 120b are formed (FIG. 11B).

Through the above process, the transistor 100 can be manufactured.

<Components of Semiconductor Device>

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate containing silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 or the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 103]

The insulating layer 103 can be formed by a sputtering method, a CVD method, an evaporation method, a pulsed laser deposition (PLD) method, or the like as appropriate. In addition, for example, the insulating layer 103 can be formed to have a single layer or stacked layer of an oxide insulating film or a nitride insulating film. To improve the properties of the interface with the semiconductor layer 108, at least a region in the insulating layer 103, which is in contact with the semiconductor layer 108, is preferably formed using an oxide insulating film. The insulating layer 103 is preferably formed using a film from which oxygen is released by heating.

For example, a single layer or stacked layers using silicon oxide, silicon oxynitride, silicon nitride oxide, silicon nitride, aluminum oxide, hafnium oxide, gallium oxide, a Ga—Zn oxide, or the like can be provided as the insulating layer 103.

In the case where a film other than an oxide film, e.g., a silicon nitride film, is used for the side of the insulating layer 103 that is in contact with the semiconductor layer 108, pretreatment such as oxygen plasma treatment is preferably performed on the surface in contact with the semiconductor layer 108 to oxidize the surface or the vicinity of the surface.

[Conductive Film]

The conductive layer 106 and the conductive layer 112 functioning as gate electrodes, the conductive layer 120a functioning as one of a source electrode and a drain electrode, and the conductive layer 120b functioning as the other of the source electrode and the drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used for each of the conductive layer 106, the conductive layer 112, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layer 106 or the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as a conductive film on the side in contact with an insulating layer functioning as a gate insulating film.

Among the above metal elements, it is particularly preferable that any one or more metal elements selected from titanium, tungsten, tantalum, and molybdenum be included in the conductive layer 106, the conductive layer 112, the conductive layer 120a, and the conductive layer 120b. It is particularly preferable to use a tantalum nitride film. The tantalum nitride film has conductivity and a high barrier property against copper, oxygen, or hydrogen and releases little hydrogen from itself; thus, the tantalum nitride film can be suitably used as a conductive film in contact with the semiconductor layer 108 or a conductive film near the semiconductor layer 108.

[Insulating Layer 110]

The insulating layer 110 functioning as a gate insulating film of the transistor 100 or the like can be formed by a PECVD method, a sputtering method, or the like. As the insulating layer 110, an insulating layer including one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two layers or a stacked-layer structure of three or more layers.

The insulating layer 110 that is in contact with the semiconductor layer 108 is preferably an oxide insulating film and further preferably includes a region containing oxygen in excess of that in the stoichiometric composition. In other words, the insulating layer 110 is an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For the insulating layer 110, a material having a higher dielectric constant than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher dielectric constant than amorphous hafnium oxide.

[Semiconductor Layer]

In the case where the semiconductor layer 108 is an In-M-Zn oxide, a sputtering target used for depositing the In-M-Zn oxide preferably has the atomic ratio of In to the element M higher than or equal to 1. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer 108 having crystallinity is easily formed. Note that the atomic ratio in the semiconductor layer 108 to be deposited varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is sometimes in the neighborhood of In:Ga:Zn=4:2:3 [atomic ratio].

Note that when the atomic ratio is described as In:Ga:Zn=4:2:3 or as being in the neighborhood thereof, the case is included where Ga is greater than or equal to 1 and less than or equal to 3 and Zn is greater than or equal to 2 and less than or equal to 4 with In being 4. In addition, when the atomic ratio is described as In:Ga:Zn=5:1:6 or as being in the neighborhood thereof, the case is included where Ga is greater than 0.1 and less than or equal to 2 and Zn is greater than or equal to 5 and less than or equal to 7 with In being 5. Furthermore, when the atomic ratio is described as In:Ga:Zn=1:1:1 or as being in the neighborhood thereof, the case is included where Ga is greater than 0.1 and less than or equal to 2 and Zn is greater than 0.1 and less than or equal to 22 with In being 1.

The energy gap of the semiconductor layer 108 is 2 eV or more, preferably 2.5 eV or more. With the use of such a metal oxide having a wider energy gap than silicon, the off-state current of the transistor can be reduced.

A metal oxide with a low carrier concentration is preferably used for the semiconductor layer 108. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of the impurities in the metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing much hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Accordingly, hydrogen in the metal oxide is preferably reduced as much as possible. Specifically, the hydrogen concentration of the metal oxide, which is obtained by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with sufficiently reduced impurities such as hydrogen is used for a channel formation region of a transistor, stable electrical characteristics can be given.

The carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^3$.

The semiconductor layer 108 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the entry of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an InGaZnO$_4$ crystal having a YbFe$_2$O$_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than a crystal part. Meanwhile, in some cases, a circular (ring-like) region with high luminance is observed when electron diffraction (also referred to as nanobeam electron diffraction) using an electron beam with a probe diameter (e.g., 1 nm or larger and 30 nm or smaller) close to or smaller than the size of a crystal part is performed on the nc-OS film, and a plurality of spots are observed in the region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Accordingly, the nc-OS film has a higher carrier concentration and higher electron mobility than the CAAC-OS film in some cases. Therefore, a transistor using the nc-OS film may have high field-effect mobility.

The nc-OS film can be formed at a lower oxygen flow rate ratio in deposition than the CAAC-OS film. The nc-OS film can also be formed at a lower substrate temperature in deposition than the CAAC-OS film. For example, the nc-OS film can be deposited at a relatively low substrate temperature (e.g., a temperature of 130° C. or lower) or without heating of the substrate and thus is suitable for the case of using a large-sized glass substrate, a resin substrate, or the like, and productivity can be increased.

An example of a crystal structure of a metal oxide is described. Note that a metal oxide deposited by a sputtering method using an In—Ga—Zn oxide target (In:Ga:Zn=4:2:4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R. T.) is likely to have the nc structure. Note that room temperature (R.T.) were also includes a temperature in the case where a substrate is not heated.

<Composition of Metal Oxide>

The composition of a CAC (Cloud-Aligned Composite)-OS that can be used in a transistor disclosed in one embodiment of the present invention will be described below.

Note that in this specification and the like, "CAAC (c-axis aligned crystal)" or "CAC (Cloud-Aligned Composite)" might be stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. The conductive regions are observed to be coupled in a cloud-like manner with their boundaries blurred, in some cases.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of such a structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility, can be obtained.

In other words, the CAC-OS or the CAC-metal oxide can also be referred to as a matrix composite or a metal matrix composite.

The above is the description of the components.

At least part of this embodiment can be implemented in combination with the other embodiments described in this specification as appropriate.

Embodiment 2

In this embodiment, an example of a display device that includes any of the transistors described in the above embodiment will be described.

Structure Example

Figure 12A:
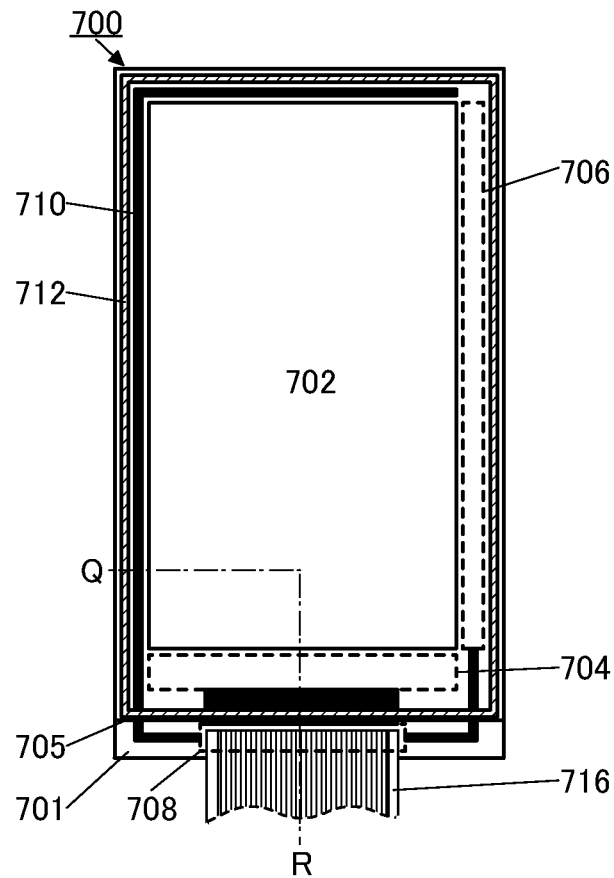
FIG. 12A, FIG. 12B, and FIG. 12C are top views of display devices.

FIG. 12A is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Figure 12B:
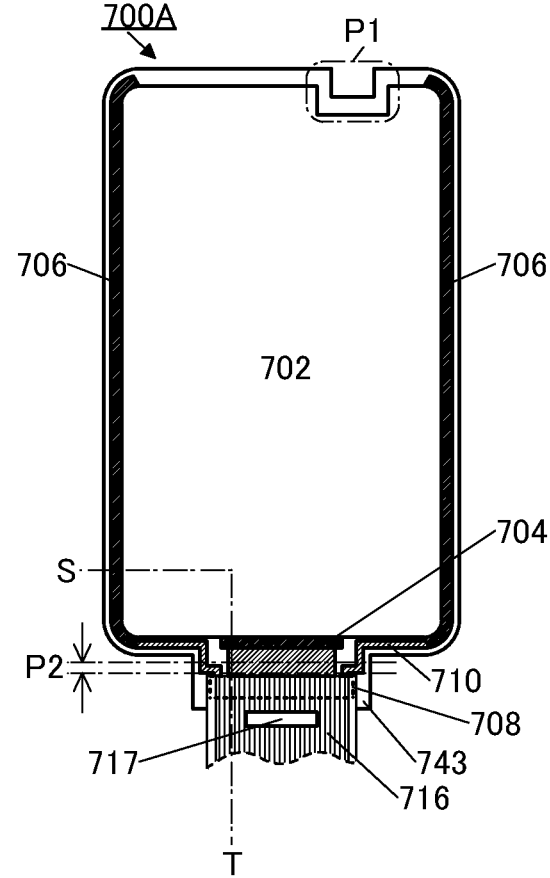

A display device 700A illustrated in FIG. 12B is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as illustrated in a region P1 in FIG. 12B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 12B. When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

Figure 12C:
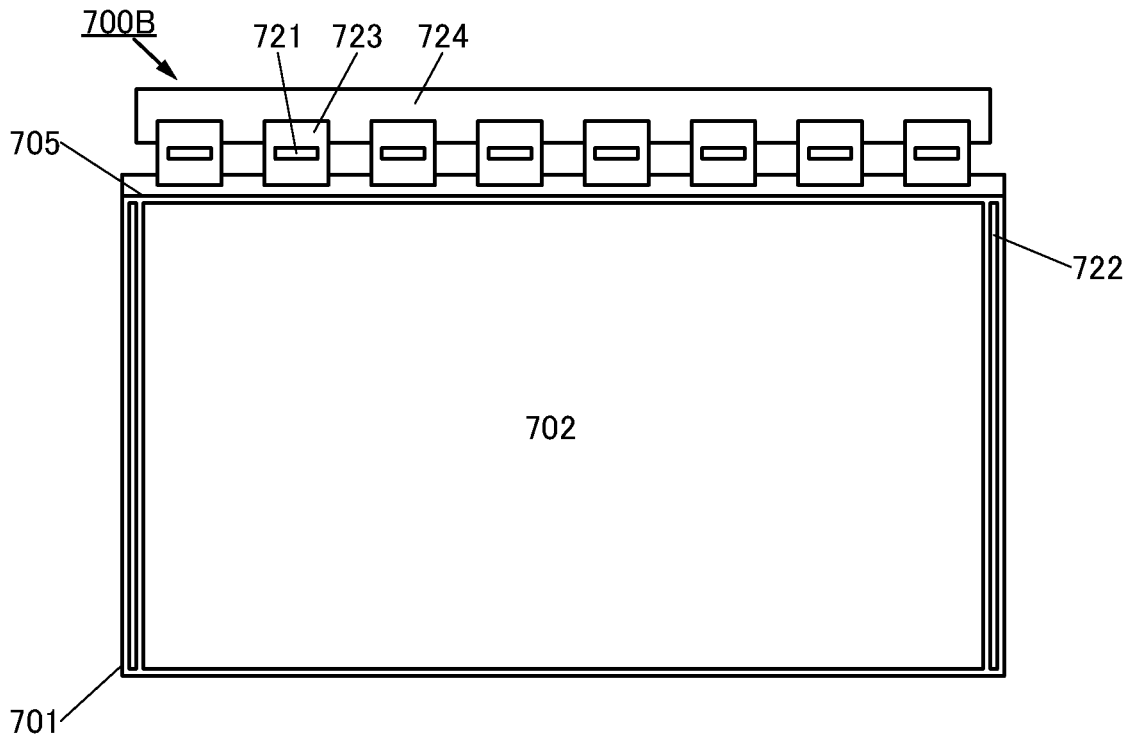

A display device 700B illustrated in FIG. 12C is a display device that can be suitably used for an electronic device with a large screen. For example, the display device 700B can be suitably used for a television device, a monitor device, a personal computer (including a notebook type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the first substrate 701. Thus, an electronic device with a narrow bezel can be provided.

With such a structure, a large-size and high-resolution display device can be provided. For example, a display device with a diagonal screen size of 30 inches or more, 40 inches or more, 50 inches or more, or 60 inches or more can be obtained. Furthermore, a display device with extremely high resolution such as 4K2K or 8K4K can be provided.

Cross-Sectional Structure Example

Figure 13:
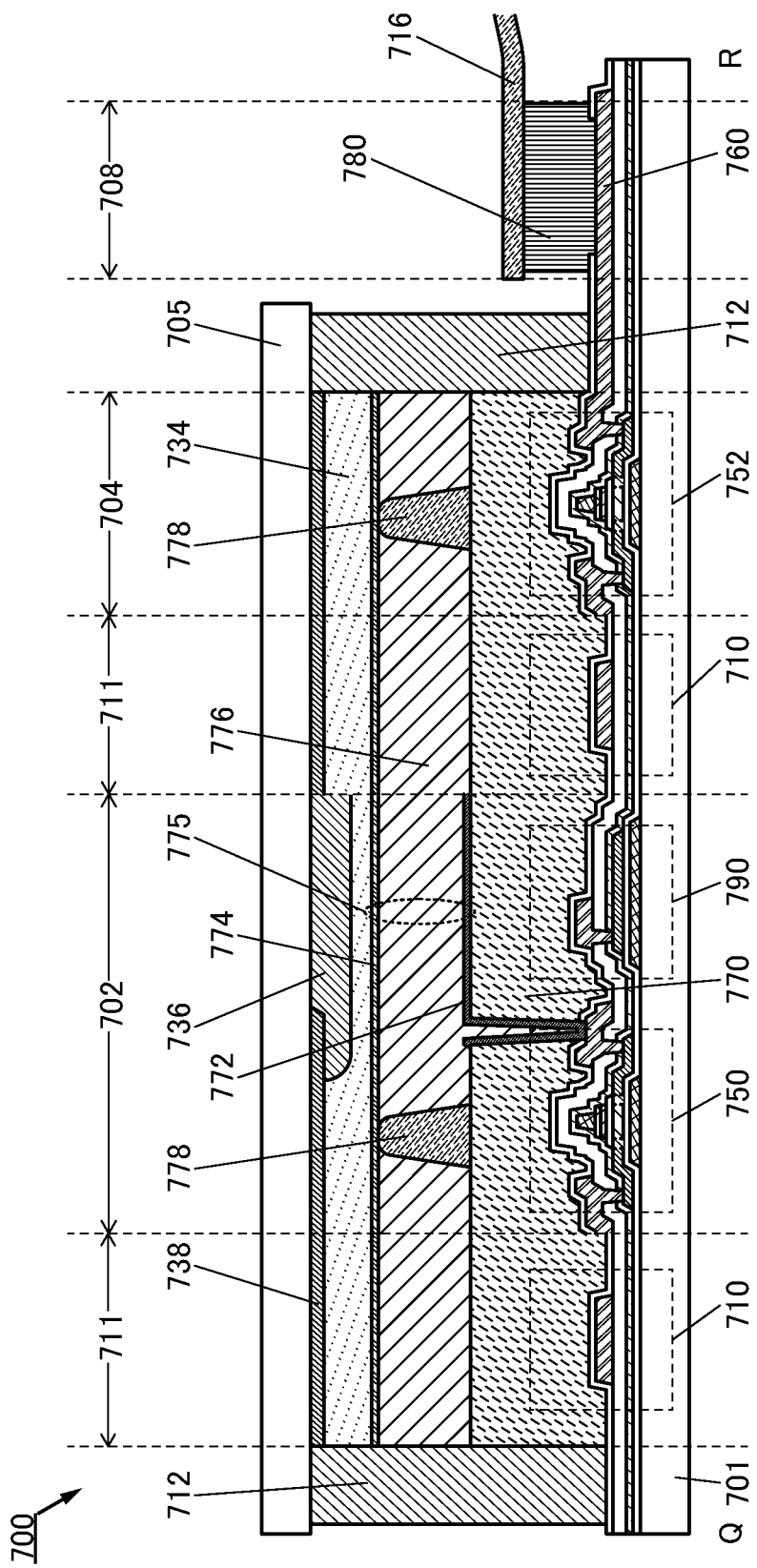
FIG. 13 is a cross-sectional view of a display device.
Figure 14:
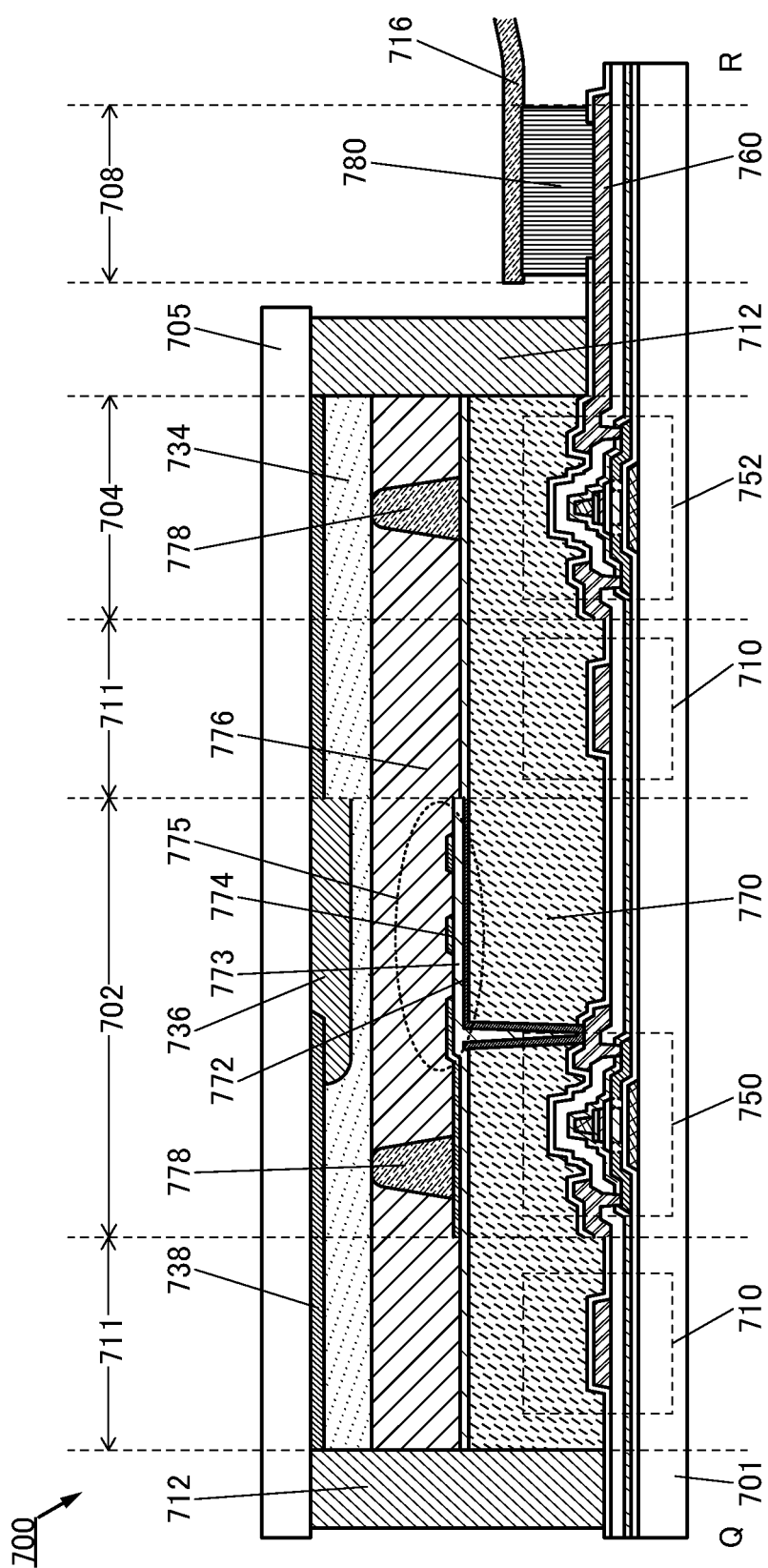
FIG. 14 is a cross-sectional view of a display device.
Figure 15:
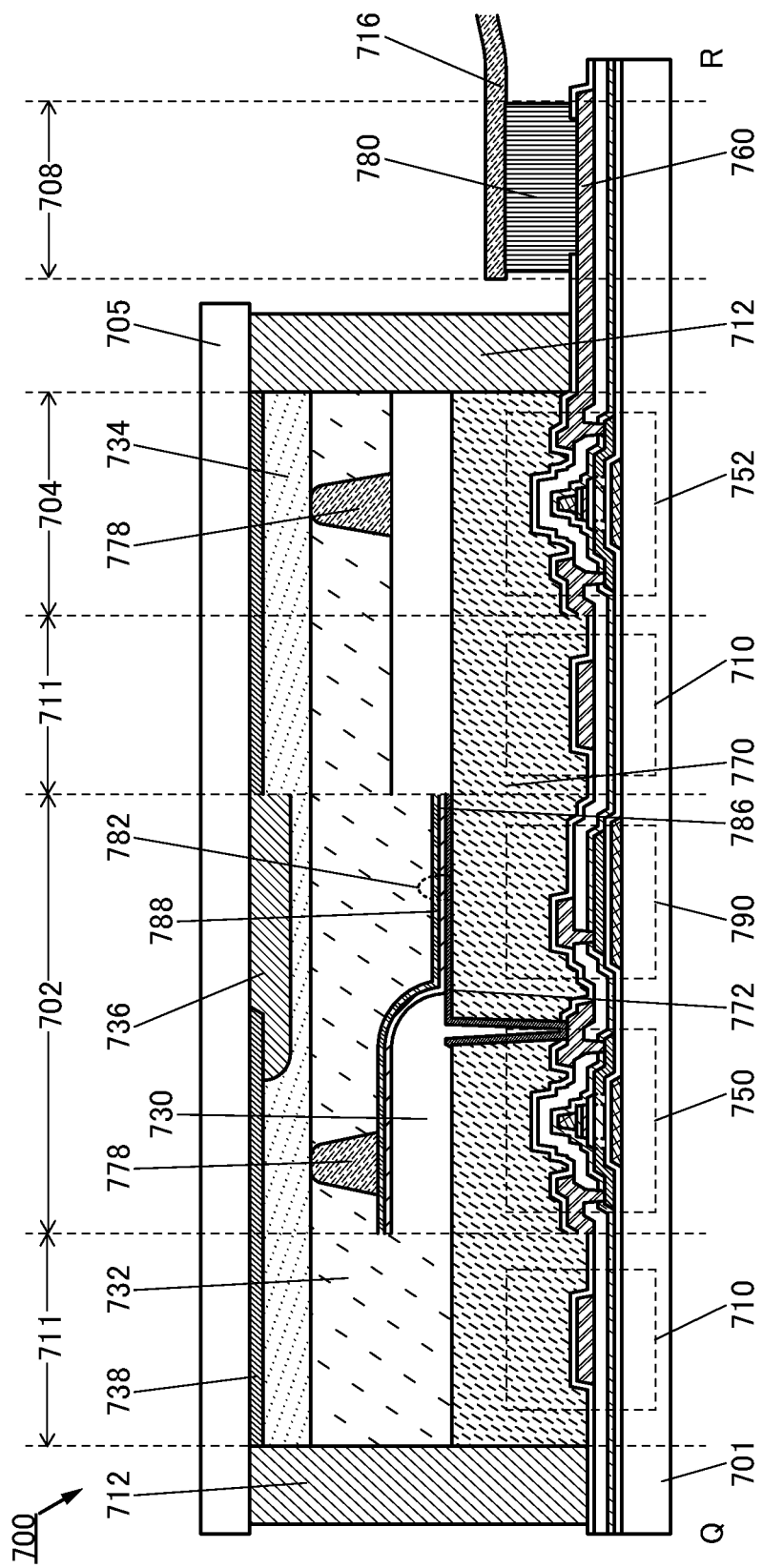
FIG. 15 is a cross-sectional view of a display device.
Figure 16:
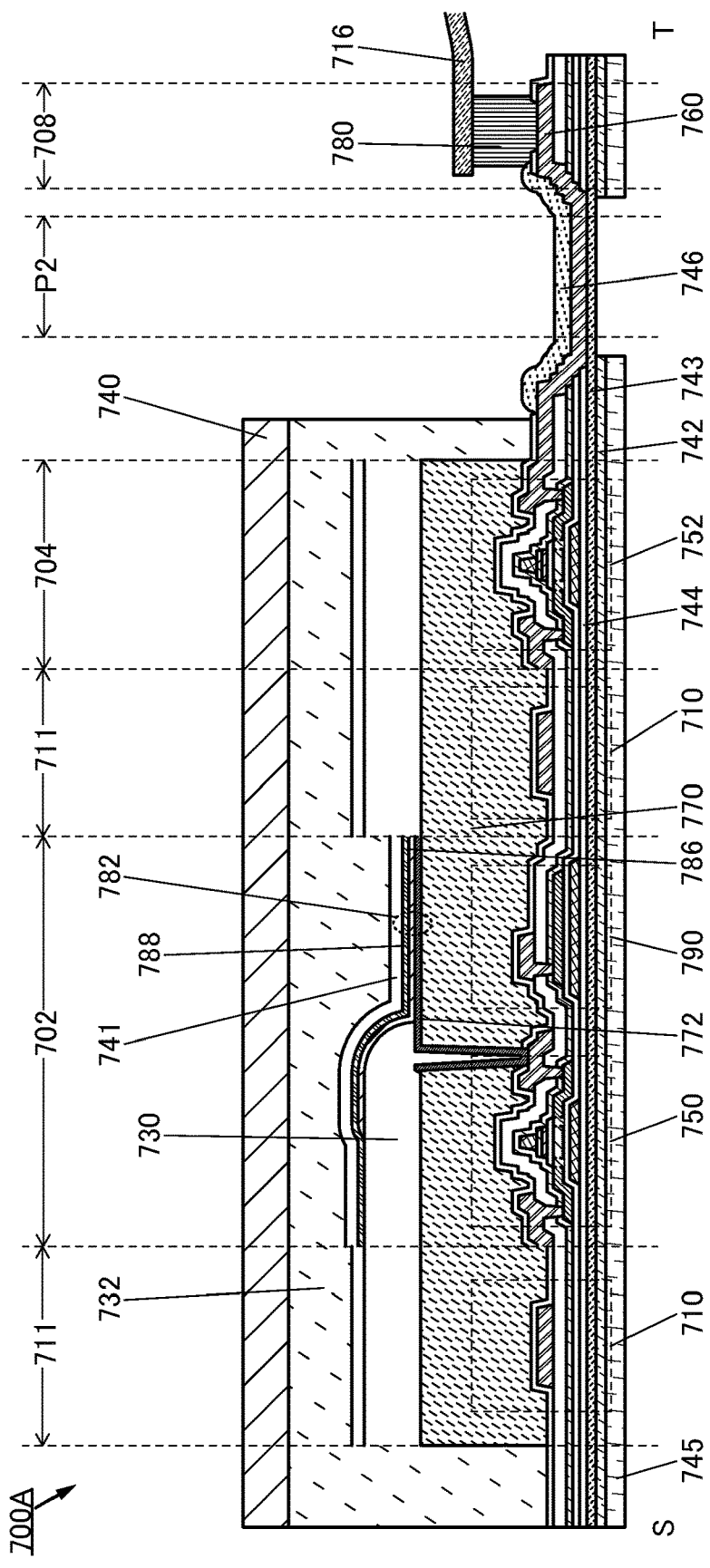
FIG. 16 is a cross-sectional view of a display device.

Structures using a liquid crystal element as a display element and structures using an EL element will be described below with reference to FIG. 13 to FIG. 16. Note that FIG. 13 to FIG. 15 are cross-sectional views taken along the dashed-dotted line Q-R in FIG. 12A. FIG. 16 is a cross-sectional view taken along the dashed-dotted line S-T in the display device 700A in FIG. 12B. FIG. 13 and FIG. 14 are each a structure using a liquid crystal element as a display element, and FIG. 15 and FIG. 16 are each a structure using an EL element.

[Description of Common Portions in Display Devices]

Display devices in FIG. 13 to FIG. 16 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 14 illustrates a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal or the like can be set longer. Thus, frequency of refresh operation can be reduced, which leads to lower power consumption.

The transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 13, FIG. 15, and FIG. 16 includes a lower electrode formed by processing the same film as a first gate electrode included in the transistor 750 and an upper electrode formed by processing the same metal oxide as the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the same can be said for the gate driver circuit portion 706, as the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

Structure Example of Display Device Using Liquid Crystal Element

The display device 700 illustrated in FIG. 13 includes a liquid crystal element 775 and a spacer 778. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. When a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided so that the liquid crystal element is placed therebetween.

The display device 700 in FIG. 14 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 14, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 13 and FIG. 14, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field-sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

[Display Device Using Light-Emitting Element]

The display device 700 illustrated in FIG. 15 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 illustrated in FIG. 15, an insulating film 730 covering part of the conductive film 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 16 illustrates a structure of a display device suitably applicable to a flexible display. FIG. 16 is a cross-sectional view taken along the dashed-dotted line S-T in the display device 700A in FIG. 12B.

The display device 700A in FIG. 16 has a structure in which a support substrate 745, a bonding layer 742, the resin layer 743, and an insulating layer 744 are stacked instead of the first substrate 701 in FIG. 15. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700 in FIG. 16 includes a protective layer 740 instead of the substrate 705 in FIG. 15. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 16 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When a structure is employed in which an inorganic insulating film is not provided if possible in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

Structure Example of Display Device Provided with Input Device

An input device may be provided in the display device illustrated in FIG. 13 to FIG. 16. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include what is called an in-cell touch panel in which an input device is provided between a pair of substrates, what is called an on-cell touch panel in which an input device is formed over the display device, and what is called an out-cell touch panel in which an input device is attached to the display device.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 3

In this embodiment, a display device that includes the semiconductor device of one embodiment of the present invention will be described with reference to FIG. 17.

Figure 17A:
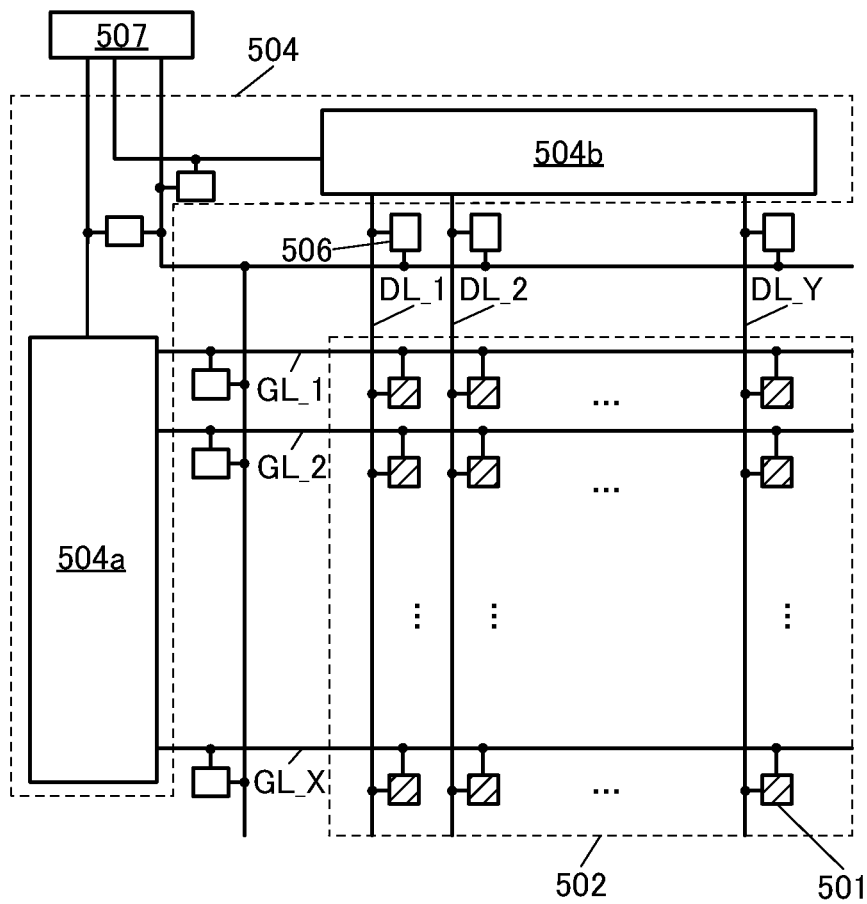
FIG. 17A is a block diagram of a display device.

A display device illustrated in FIG. 17A includes a pixel portion 502, a driver circuit portion 504, protection circuits 506, and a terminal portion 507. Note that a structure in which the protection circuits 506 are not provided may be employed. Pixel circuits 501 are hatched in FIG. 17A to distinguish the protection circuits 506 from the pixel circuits 501.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scan signal to scan lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 17A is connected to a variety of wirings such as the scan lines GL_1 to GL_X that are wirings between the gate driver 504a and the pixel circuits 501 and the data lines DL_1 to DL_Y that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

Figure 17B:
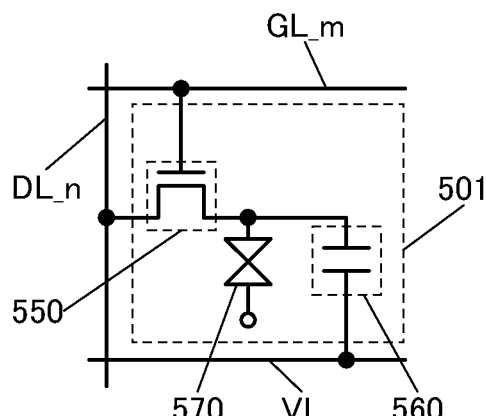
FIG. 17B and FIG. 17C are circuit diagrams of display devices.
Figure 17C:
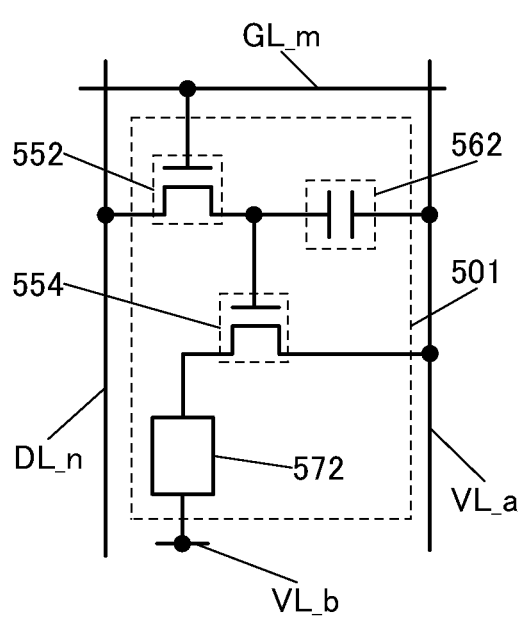

The plurality of pixel circuits 501 illustrated in FIG. 17A can have a structure illustrated in FIG. 17B or FIG. 17C, for example.

The pixel circuit 501 illustrated in FIG. 17B includes a liquid crystal element 570, a transistor 550, and a capacitor 560. The data line DL_n, the scan line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 17C includes transistors 552 and 554, a capacitor 562, and a light-emitting element 572. The data line DL_n, the scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential supplied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

<Circuit Structure>

Figure 18A:
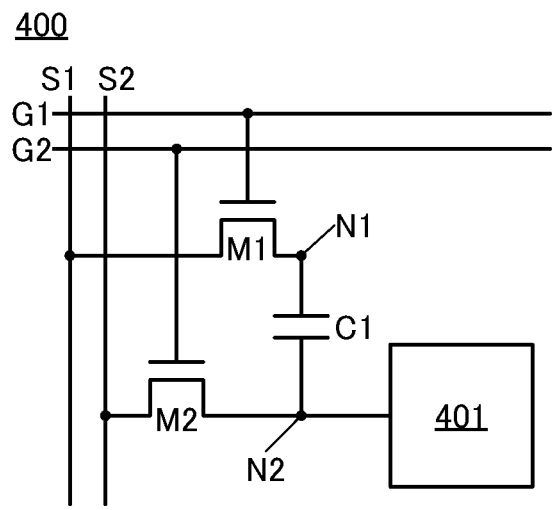
FIG. 18A, FIG. 18C, and FIG. 18D are circuit diagrams of display devices.

FIG. 18A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

Anode connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 18B:
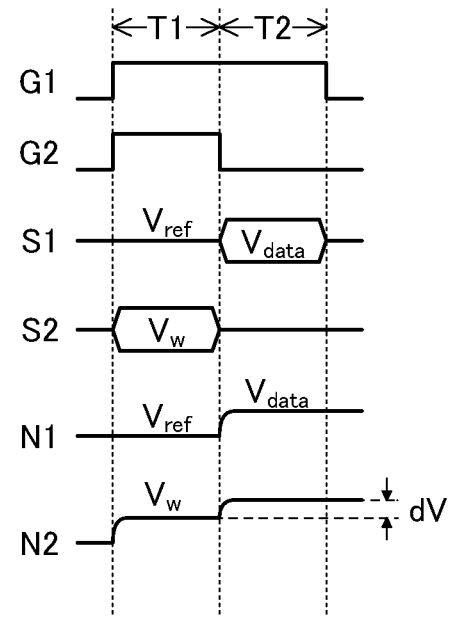
FIG. 18B is a timing chart for a display device.

Next, an example of a method for operating the pixel circuit 400 is described with reference to FIG. 18B. FIG. 18B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 18B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 18B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

Example Using Liquid Crystal Element

Figure 18C:
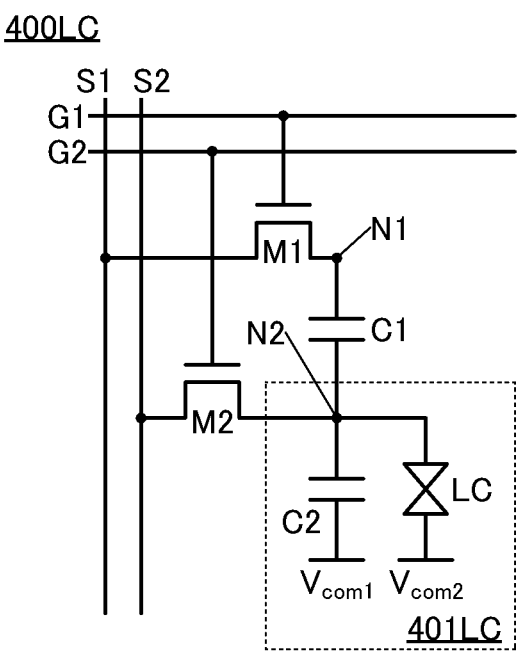

A pixel circuit 400LC illustrated in FIG. 18C includes a circuit 401LC. The circuit 401LC includes a liquid crystal element LC and a capacitor C2.

In the liquid crystal element LC, one electrode is connected to the other electrode of the capacitor C1, the other of the source and the drain of the transistor M2, and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

Example Using Light-Emitting Element

Figure 18D:
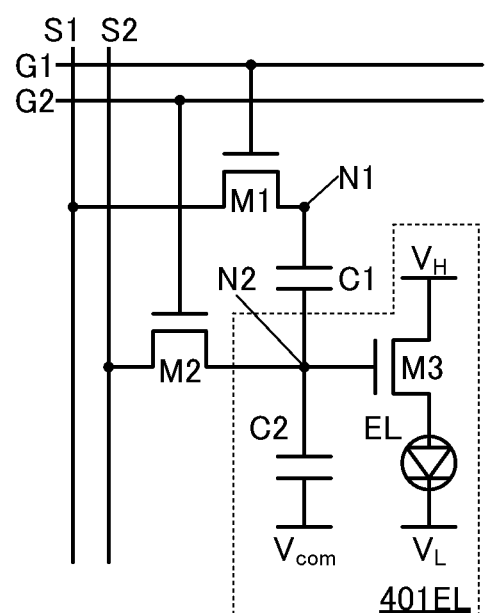

A pixel circuit 400EL illustrated in FIG. 18D includes a circuit 401EL. The circuit 401EL includes a light-emitting element EL, a transistor M3, and the capacitor C2.

In the transistor M3, a gate is connected to one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is supplied to the gate of the transistor M3, which enables HDR display, for example. A variation in the electrical characteristics of the transistor M3 and the light-emitting element EL can be corrected by supply of a correction signal to the wiring S1 or the wiring S2.

Note that the structure is not limited to the circuits illustrated in FIG. 18C and FIG. 18D, and a structure to which a transistor, a capacitor, or the like is further added may be employed.

At least part of this embodiment can be implemented in combination with any of the other embodiments described in this specification as appropriate.

Embodiment 5

In this embodiment, a display module that can be fabricated using one embodiment of the present invention will be described.

Figure 19A:
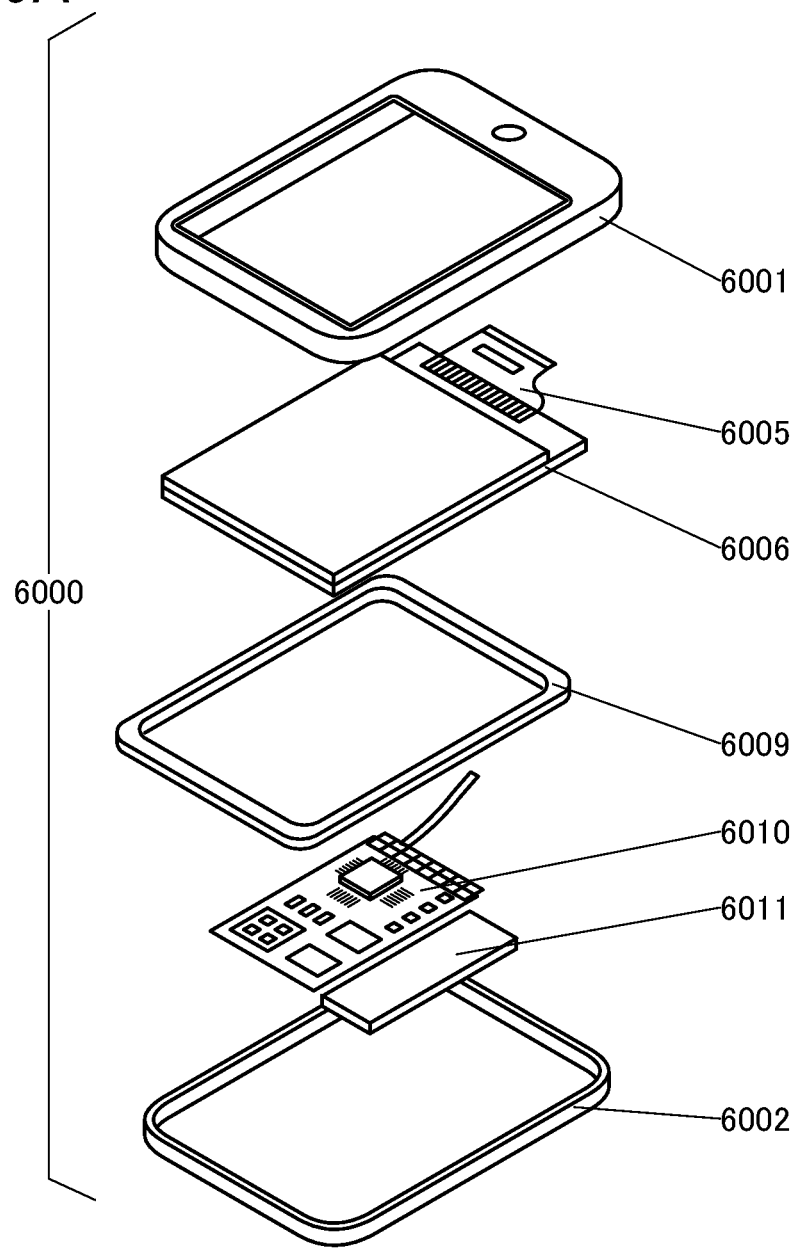
FIG. 19A and FIG. 19B are a structure example of a display module.

In a display module 6000 illustrated in FIG. 19A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 19B:
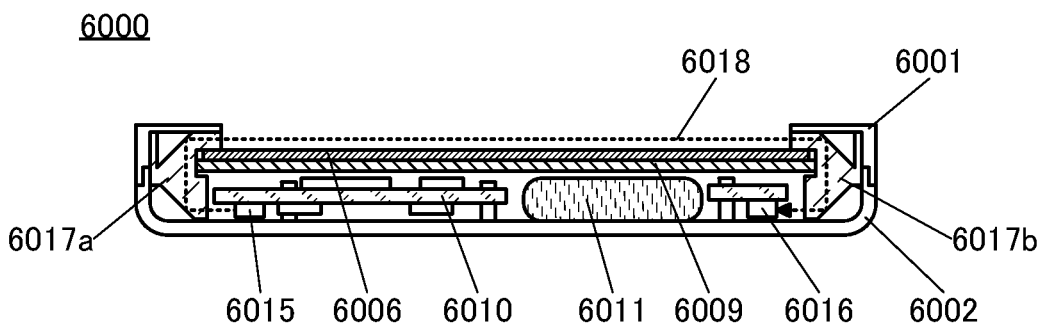

FIG. 19B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electrical signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with any of the other embodiments described in this specification as appropriate.

Embodiment 6

In this embodiment, examples of an electronic device for which the display device of one embodiment of the present invention can be used will be described.

Figure 20A:
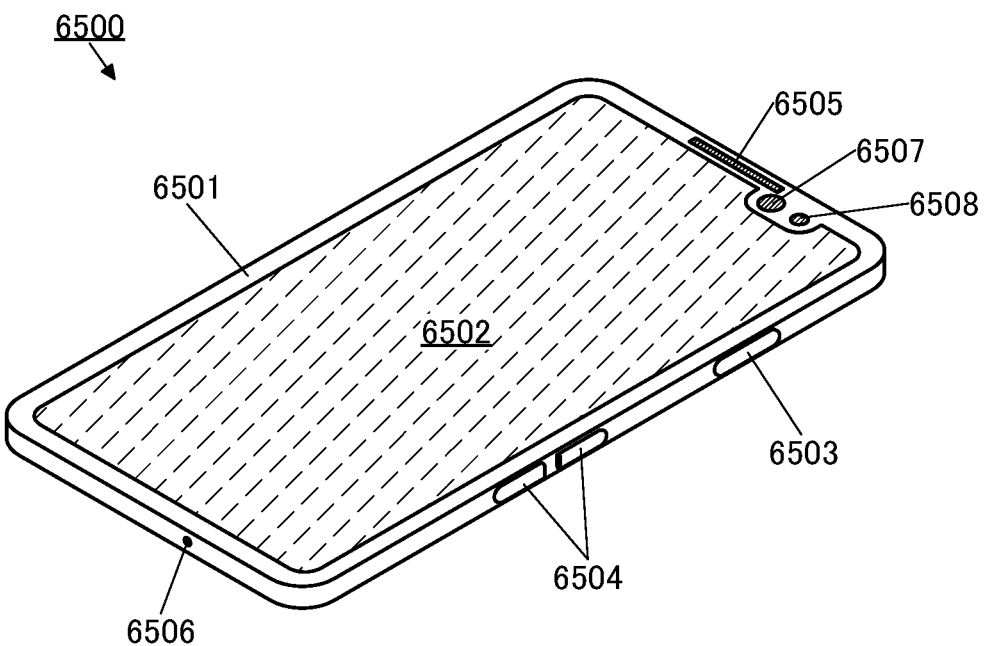
FIG. 20A and FIG. 20B are a structure example of an electronic device.

An electronic device 6500 illustrated in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 20B:
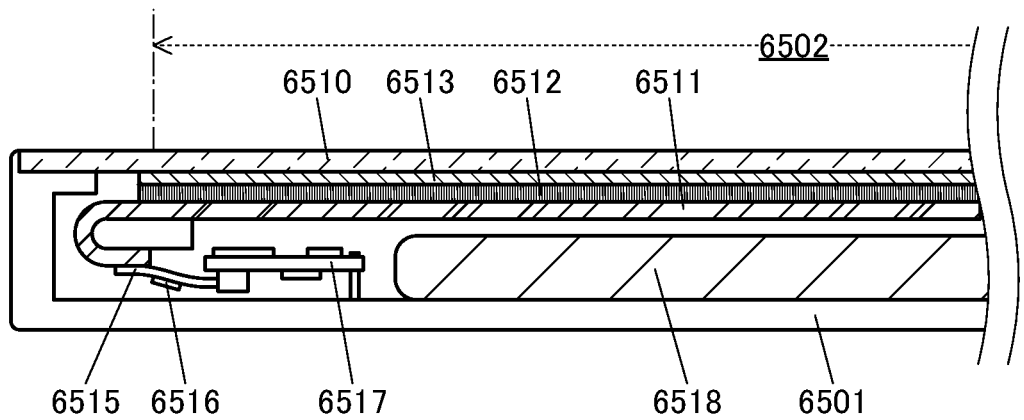

FIG. 20B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with any of the other embodiments described in this specification as appropriate.

Embodiment 7

In this embodiment, electronic devices each including a display device fabricated using one embodiment of the present invention will be described.

Electronic devices exemplified below each include a display device of one embodiment of the present invention in a display portion. Thus, the electronic devices achieve high resolution. In addition, the electronic devices can each achieve both high resolution and a large screen.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a house or a building, an interior or an exterior of a car, or the like.

Figure 21A:
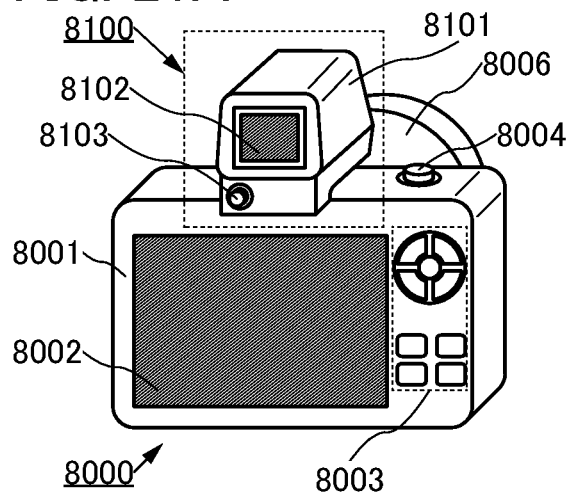
FIG. 21A, FIG. 21B, FIG. 21C, FIG. 21D, and FIG. 21E are structure examples of electronic devices.

FIG. 21A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 21B:
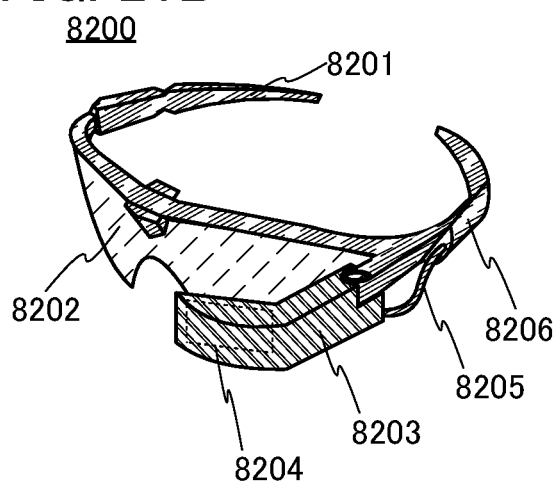

FIG. 21B is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and data on the movement of the user's eyeball and eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used for the display portion 8204.

Figure 21C:
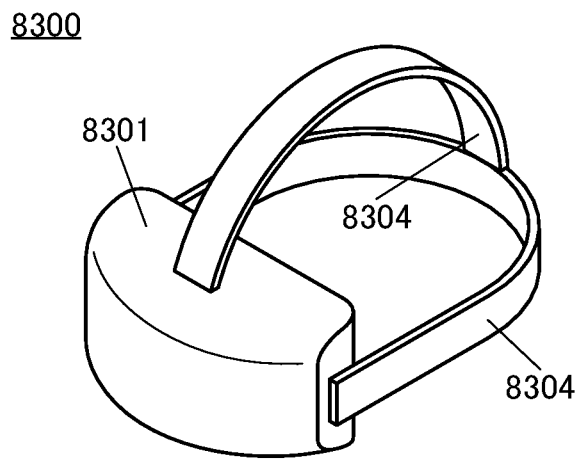
Figure 21D:
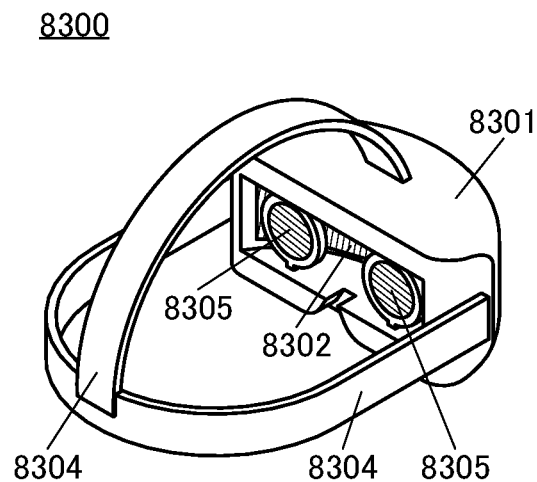
Figure 21E:
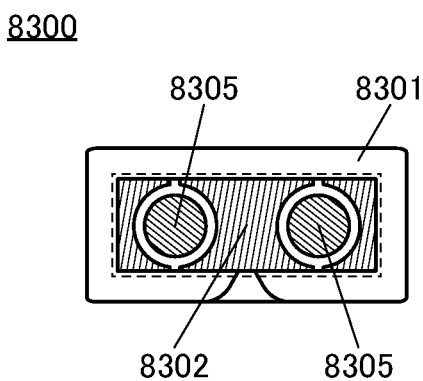

FIG. 21C, FIG. 21D, and FIG. 21E are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed in a different region of the display portion 8302 is viewed through the lenses 8305, 3D display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be used for the display portion 8302. A display device including a semiconductor device of one embodiment of the present invention has extremely high resolution; thus, even when a video is magnified using the lenses 8305 as illustrated in FIG. 21E, the user does not perceive pixels, and a more realistic video can be displayed.

Electronic devices illustrated in FIG. 22A to FIG. 22G include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in FIG. 22A to FIG. 22G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 22A to FIG. 22G are described below.

Figure 22A:
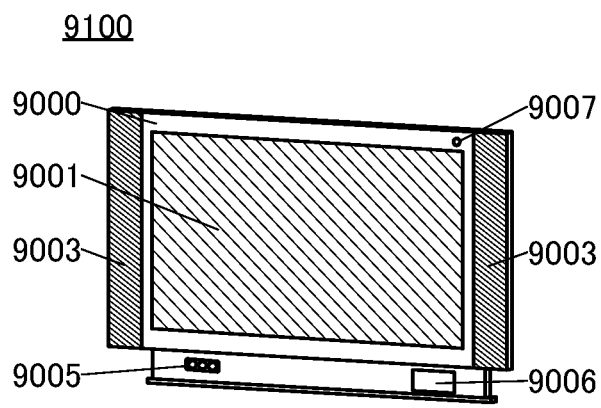
FIG. 22A, FIG. 22B, FIG. 22C, FIG. 22D, FIG. 22E, FIG. 22F, and FIG. 22G are structure examples of electronic devices.

FIG. 22A is a perspective view illustrating a television device 9100. The display portion 9001 having a large screen size of, for example, 50 inches or more, or 100 inches or more can be incorporated in the television device 9100.

Figure 22D:
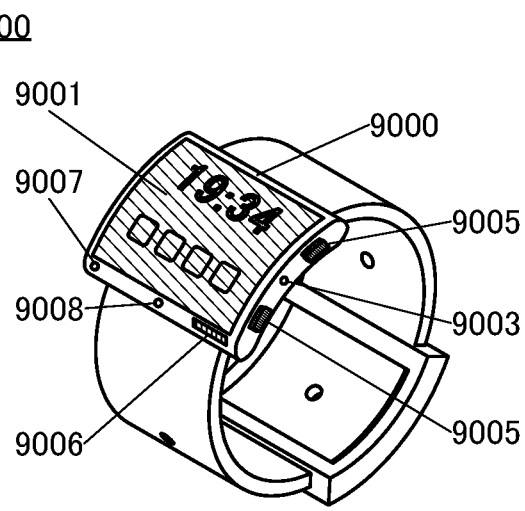
Figure 22B:
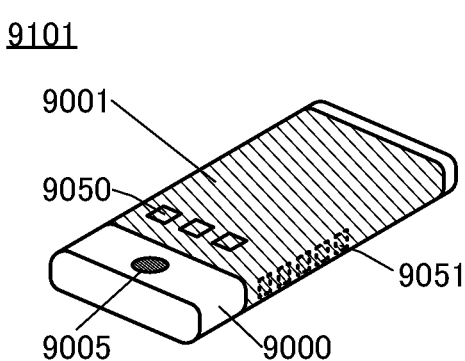

FIG. 22B is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. In addition, the portable information terminal 9101 can display characters and image information on its plurality of surfaces. FIG. 22B illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

Figure 22E:
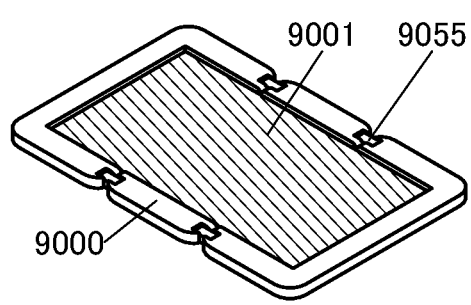
Figure 22C:
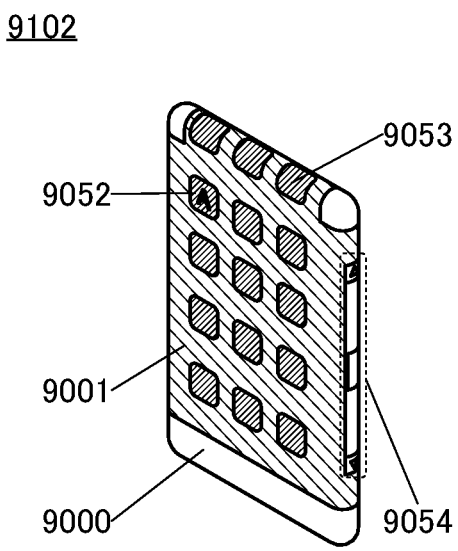

FIG. 22C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 22D is a perspective view illustrating a watch-type portable information terminal 9200. For example, the portable information terminal 9200 can be used as a smartwatch (registered trademark). In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal and charging. Note that charging operation may be performed by wireless power feeding.

Figure 22F:
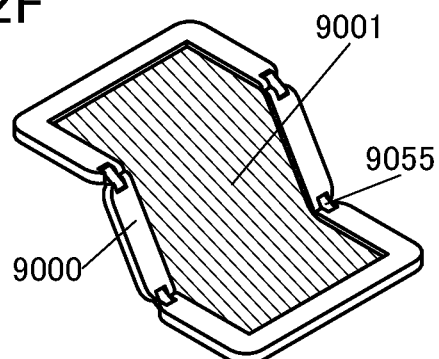
Figure 22G:
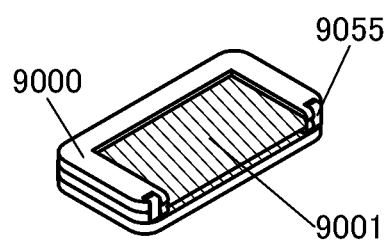

FIG. 22E, FIG. 22F, and FIG. 22G are perspective views illustrating a foldable portable information terminal 9201. In addition, FIG. 22E is a perspective view of an unfolded state of the portable information terminal 9201, FIG. 22G is a perspective view of a folded state thereof, and FIG. 22F is a perspective view of a state in the middle of change from one of FIG. 22E and FIG. 22G to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature greater than or equal to 1 mm and less than or equal to 150 mm.

Figure 23A:
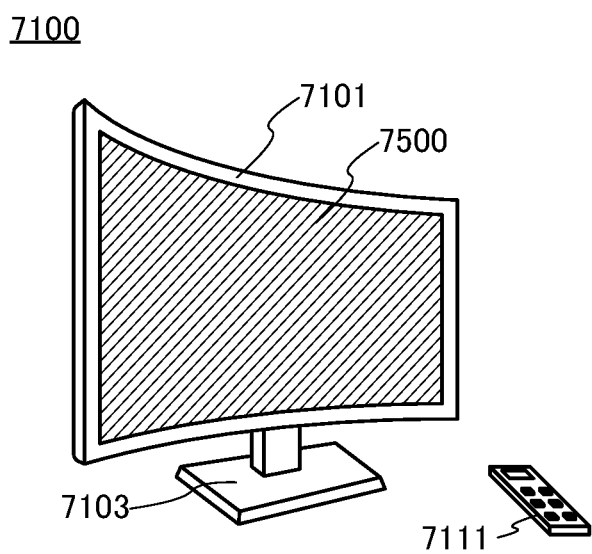
FIG. 23A, FIG. 23B, FIG. 23C, and FIG. 23D are structure examples of electronic devices.

FIG. 23A illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 23A can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver and a communication device for network connection.

Figure 23B:
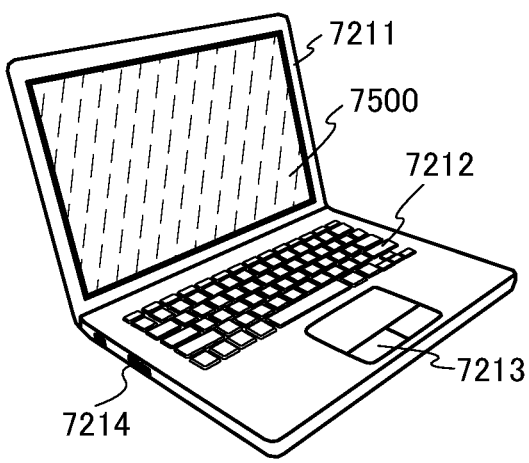

FIG. 23B illustrates a notebook personal computer 7200. The notebook personal computer 7200 includes a housing 7211, a keyboard 7212, a pointing device 7213, an external connection port 7214, and the like. The display portion 7500 is incorporated in the housing 7211.

Figure 23C:
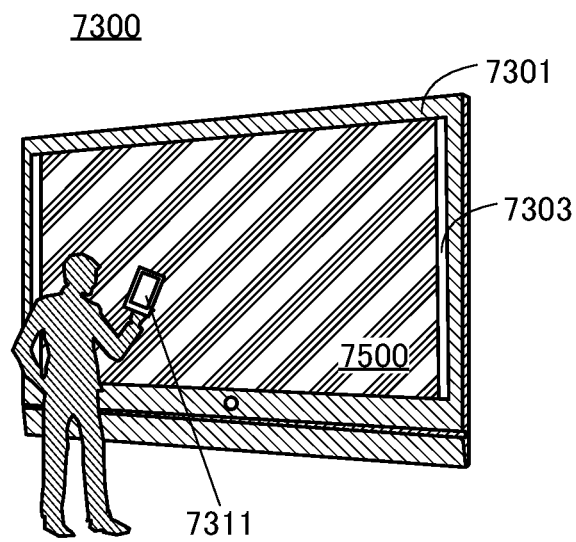
Figure 23D:
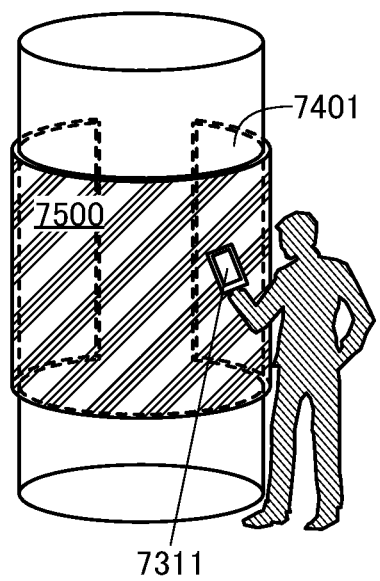

FIG. 23C and FIG. 23D illustrate examples of digital signage.

Digital signage 7300 illustrated in FIG. 23C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 23D is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effectiveness of the advertisement can be increased, for example.

A touch panel is preferably used for the display portion 7500 so that the user can operate the digital signage. Thus, the digital signage can be used not only for advertising but also for providing information that the user needs, such as route information, traffic information, and guidance information on a commercial facility.

As illustrated in FIG. 23C and FIG. 23D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used for the display portion 7500 in FIG. 23A to FIG. 23D.

The electronic devices in this embodiment each have a structure including a display portion; however, one embodiment of the present invention can also be applied to an electronic device that does not include a display portion.

At least part of this embodiment can be implemented in combination with the other embodiments described in this specification as appropriate.

Example 1

In this example, samples (a sample A1 and a sample A2) corresponding to the transistor 100 illustrated in FIG. 1 were fabricated, and the cross-sectional shapes and the drain current-drain voltage characteristics (ID-VD characteristics) of the transistors were evaluated. Note that the transistors without the conductive layer 106 were fabricated here.

<Sample Fabrication>

First, a 50-nm-thick first silicon nitride film, a 150-nm-thick second silicon nitride film, a 100-nm-thick third silicon nitride film, and a 3-nm-thick first silicon oxynitride film were deposited in this order over a glass substrate.

The first silicon nitride film and the third silicon nitride film were each deposited by a PECVD method using a mixed gas of a silane gas at a flow rate of 200 sccm, a nitrogen gas at a flow rate of 2000 sccm, and an ammonia gas at a flow rate of 100 sccm. In the deposition, the pressure was 100 Pa, the power was 2000 W, and the substrate temperature was 350° C.

The second silicon nitride film was deposited by a PECVD method using a mixed gas of a silane gas at a flow rate of 290 sccm, a nitrogen gas at a flow rate of 2000 sccm, and an ammonia gas at a flow rate of 2000 sccm. In the deposition, the pressure was 200 Pa, the power was 3000 W, and the substrate temperature was 350° C.

The first silicon oxynitride film was deposited by a PECVD method using a mixed gas of a silane gas at a flow rate of 20 sccm and a dinitrogen monoxide gas at a flow rate of 3000 sccm. In the deposition, the pressure was 40 Pa, the power was 3000 W, and the substrate temperature was 350° C.

Next, a 25-nm-thick first metal oxide film was deposited over the first silicon oxynitride film. The first metal oxide film was deposited by a sputtering method using an In—Ga—Zn oxide target (In:Ga:Zn=4:2:4.1 [atomic ratio]). In the deposition, the pressure was 0.6 Pa, the power was 2.5 kW, and the substrate temperature was room temperature. A mixed gas of an oxygen gas and an argon gas was used as a deposition gas, and the oxygen flow rate ratio was 10%.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Then, the first metal oxide film was processed into an island shape to form a first metal oxide layer.

Next, as a gate insulating layer, a 5-nm-thick second silicon oxynitride film, a 130-nm-thick third silicon oxynitride film, and a 5-nm-thick fourth silicon oxynitride film were deposited in this order.

The second silicon oxynitride film was deposited by a PECVD method using a mixed gas of a silane gas at a flow rate of 24 sccm and a dinitrogen monoxide gas at a flow rate of 18000 sccm. In the deposition, the pressure was 200 Pa, the power was 130 W, and the substrate temperature was 350° C. Note that the second silicon oxynitride film corresponds to the insulating layer 110a described in Embodiment 1.

The third silicon oxynitride film was deposited by a PECVD method using a mixed gas of a silane gas at a flow rate of 200 sccm and a dinitrogen monoxide gas at a flow rate of 10000 sccm. In the deposition, the pressure was 300 Pa, the power was 750 W, and the substrate temperature was 350° C. Note that the third silicon oxynitride film corresponds to the insulating layer 110b described in Embodiment 1.

The fourth silicon oxynitride film was deposited by a PECVD method using a mixed gas of a silane gas at a flow rate of 20 sccm and a dinitrogen monoxide gas at a flow rate of 3000 sccm. In the deposition, the pressure was 40 Pa, the power was 500 W, and the substrate temperature was 350° C. Note that the fourth silicon oxynitride film corresponds to the insulating layer 110c described in Embodiment 1.

Subsequently, heat treatment was performed at 370° C. in a nitrogen atmosphere for one hour. An oven apparatus was used for the heat treatment.

Next, a 20-nm-thick second metal oxide film was deposited over the fourth silicon oxynitride film. The second metal oxide film was deposited by a sputtering method using an In—Ga—Zn oxide target (In:Ga:Zn=4:2:4.1 [atomic ratio]). In the deposition, the pressure was 0.8 Pa, the power was 3.5 kW, and the substrate temperature was 200° C. An oxygen gas (oxygen flow rate ratio: 100%) was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, over the second metal oxide film, a 10-nm-thick ITSO film and a 100-nm-thick copper film were deposited in this order. The ITSO film and the copper film were deposited by a sputtering method. The ITSO film was deposited using an ITSO target ($In_2O_3$:$SnO_2$:$SiO_2$=85:10:5 [weight ratio]). The copper film was deposited using a Cu target.

Next, a resist mask was formed over the copper film, and the second metal oxide film, the ITSO film, and the copper film were processed to form a second metal oxide layer, an ITSO layer, and a copper layer. A wet etching method was used for the processing. As an etchant, a chemical solution obtained by mixing two chemical solutions, a chemical solution A and a chemical solution B, just before use at 5:1 [volume ratio] was used. As the chemical solution A, an aqueous solution of phosphoric acid (lower than 5 weight %), hydrofluoric acid (lower than 1 weight %), nitric acid (lower than 10 weight %), and an additive (lower than 22 weight %) was used. As the chemical solution B, an aqueous solution of hydrogen peroxide (31 weight %) was used. The etchant temperature at the time of etching was 30° C.

Note that the wet etching treatment time was different between the sample A1 and the sample A2 to make the samples have their respective widths L2 of the regions 108L in the channel length direction. The wet etching treatment time for the sample A1 was 110 sec, and the wet etching treatment time for the sample A2 was 60 sec.

Next, the second silicon oxynitride film, the third silicon oxynitride film, and the fourth silicon oxynitride film were etched using the above-described resist mask as a mask, so that a gate insulating layer was formed. A dry etching method was used for the processing. After that, the resist mask was removed.

Then, as a protective layer covering the transistor, a 100-nm-thick fourth silicon nitride film and a 300-nm-thick fifth silicon oxynitride film were deposited in this order.

The fourth silicon nitride film was deposited by a PECVD method using a mixed gas of a silane gas at a flow rate of 150 sccm, a nitrogen gas at a flow rate of 5000 sccm, and an ammonia gas at a flow rate of 100 sccm. In the deposition, the pressure was 200 Pa, the power was 2000 W, and the substrate temperature was 350° C.

The fifth silicon oxynitride film was deposited by a PECVD method using a mixed gas of a silane gas at a flow rate of 290 sccm and a dinitrogen monoxide gas at a flow rate of 4000 sccm. In the deposition, the pressure was 133 Pa, the power was 1000 W, and the substrate temperature was 350° C.

Next, an opening was formed in part of the protective layer covering the transistor, and a 30-nm-thick titanium film, a 100-nm-thick copper film, and a 50-nm-thick titanium film were deposited in this order by a sputtering method, and then processed to obtain a source electrode and a drain electrode. After that, an approximately 1.5-μm-thick acrylic resin film was formed as a planarization layer, and heat treatment was performed at a temperature of 250° C. in a nitrogen atmosphere for one hour.

Through the above steps, the transistors each formed over the glass substrate (the sample A1 and the sample A2) were obtained.

<Cross-Sectional Observation>

Then, the sample A1 and the sample A2 were thinned by focused ion beam (FIB), and cross sections of the sample A1 and the sample A2 were observed with STEM.

<Evaluation of ID-VD Characteristics>

Next, the ID-VD characteristics of the fabricated transistors were measured.

The ID-VD characteristics of the transistors were measured under the conditions where the source potential was a ground potential (GND) and the drain voltage (VD) was swept from 0 V to 30 V in increments of 0.25 V. The ID-VD measurements were successively performed on the same transistor under the four conditions where the gate voltage (VG) was 0 V, 2 V, 4 V, and 6 V. The transistor having a channel length of 3 μm and a channel width of 10 μm was used, and the ID-VD characteristics of 20 transistors were measured for each sample.

Figure 24A:
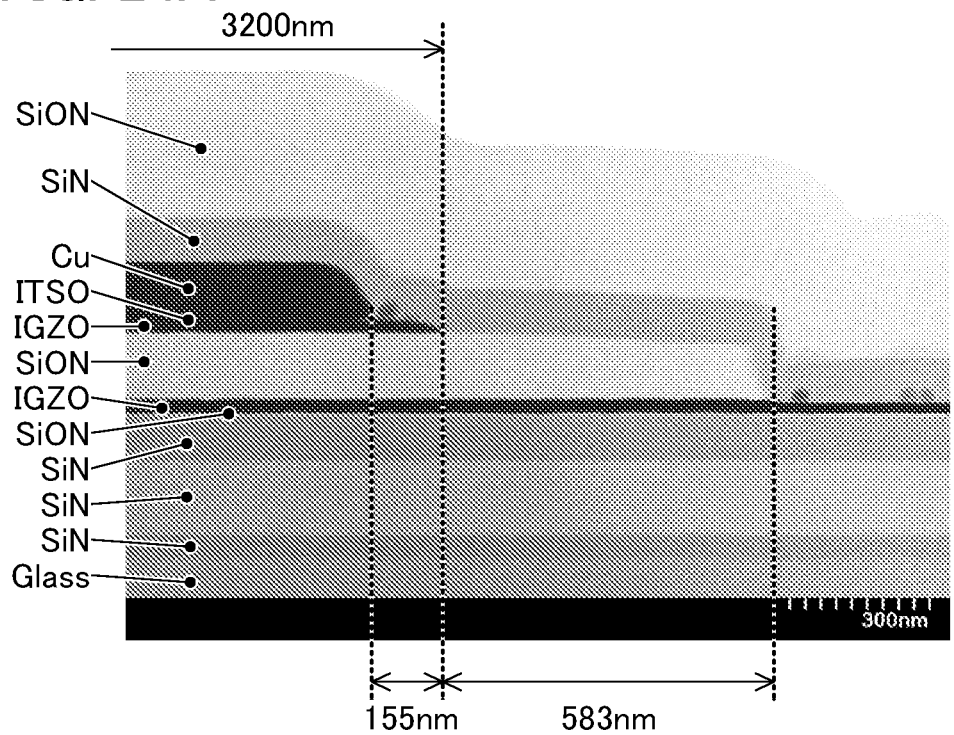
FIG. 24A is a cross-sectional STEM image of a transistor.

FIG. 24A shows a STEM image of the cross section of the sample A1. FIG. 24A is a transmission electron image (TE image) at a magnification of 80000 times. As shown in FIG. 24A, the width L2 of the region 108L in the sample A1 was 583 nm. Note that in FIG. 24A, the glass substrate is denoted as Glass; each of the silicon nitride films, SiN; each of the silicon oxynitride films, SiON; each of the metal oxide films, IGZO; the ITSO film, ITSO; and the copper film, Cu.

Figure 24B:
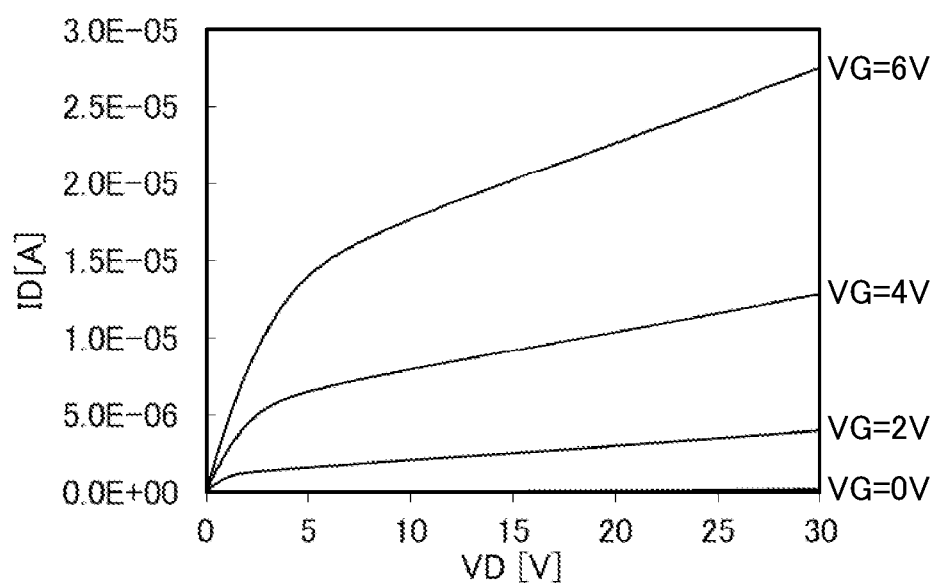
FIG. 24B is a graph showing ID-VD characteristics of a transistor.

FIG. 24B shows the ID-VD characteristics of the sample A1. In FIG. 24B, the horizontal axis represents drain voltage (VD) and the vertical axis represents drain current (ID). FIG. 24B reveals that the sample A1 has excellent ID-VD characteristics in any of the conditions where the gate voltage (VG) is 2 V, 4 V, and 6 V.

Figure 25A:
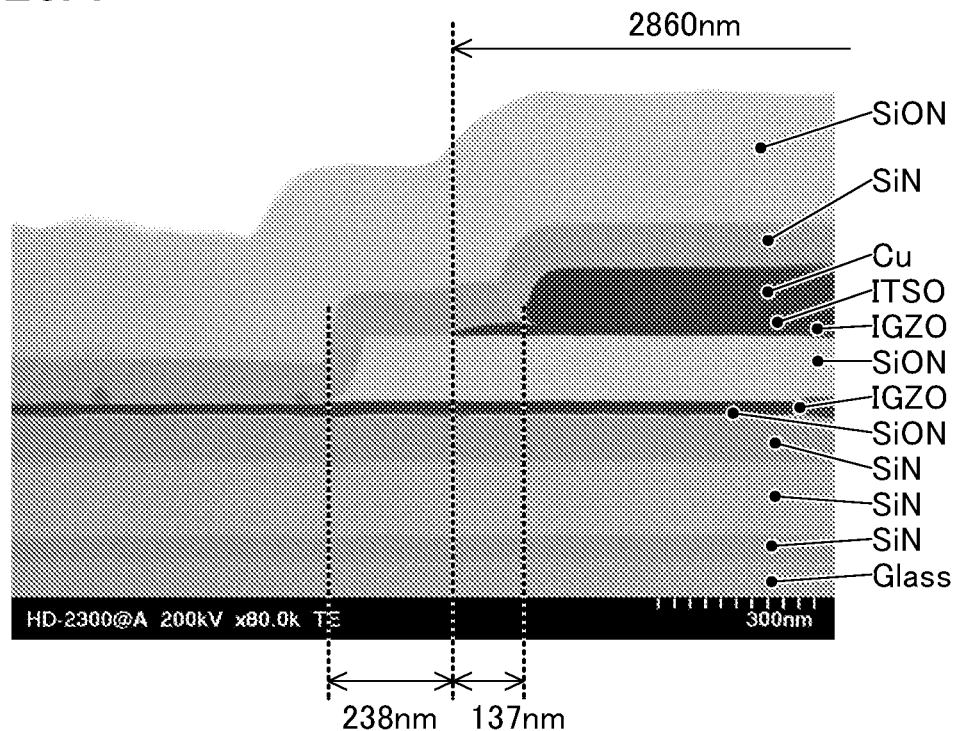
FIG. 25A is a cross-sectional STEM image of a transistor.

FIG. 25A shows a STEM image of the cross section of the sample A2. FIG. 25A is a transmission electron image (TE image) at a magnification of 80000 times. As shown in FIG. 25A, the width L2 of the region 108L in the sample A2 was 238 nm. Note that in FIG. 25A, the glass substrate is denoted as Glass; each of the silicon nitride films, SiN; each of the silicon oxynitride films, SiON; each of the metal oxide films, IGZO; the ITSO film, ITSO; and the copper film, Cu.

Figure 25B:
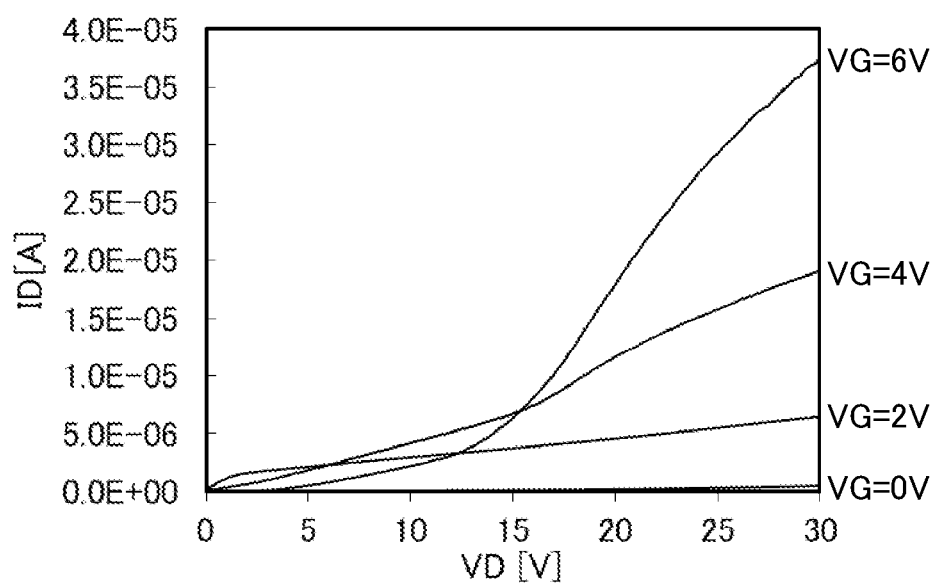
FIG. 25B is a graph showing ID-VD characteristics of a transistor.

FIG. 25B shows the ID-VD characteristics of the sample A2. In FIG. 25B, the horizontal axis represents drain voltage (VD) and the vertical axis represents drain current (ID). FIG. 25B reveals that the on-state current decreases in the sample A2 at gate voltages (VG) of 4 V and 6 V. Since the on-state current does not decrease at a gate voltage (VG) of 2 V, the transistor presumably deteriorates in a high drain voltage region at a gate voltage (VG) of 2 V. A decrease in the on-state current is not observed in the sample A1, which indicates that the large width of the region 108L in the sample A1 can inhibit the deterioration of the transistor at a high drain voltage.

Example 2

In this example, samples (a sample B1 to a sample B5) corresponding to the transistor 100 illustrated in FIG. 1 were fabricated, and the drain current-drain voltage characteristics (ID-VD characteristics) of the transistors were evaluated.

<Sample Fabrication>

First, a 30-nm-thick titanium film and a 100-nm-thick copper film were formed in this order over a glass substrate by a sputtering method, and then processed to obtain a first gate electrode (a bottom gate).

Next, as a first gate insulating layer, a 50-nm-thick first silicon nitride film, a 150-nm-thick second silicon nitride film, a 100-nm-thick third silicon nitride film, and a 3-nm-thick first silicon oxynitride film were deposited in this order. For the first silicon nitride film to the third silicon nitride film and the first silicon oxynitride film, reference can be made to the description in Example 1; thus, the detailed description is omitted.

Next, a 25-nm-thick first metal oxide film was deposited over the first silicon oxynitride film. The first metal oxide film was deposited by a sputtering method using an In—Ga—Zn oxide target (In:Ga:Zn=4:2:4.1 [atomic ratio]). In the deposition, the pressure was 0.3 Pa, the power was 4.5 kW, and the substrate temperature was room temperature. A mixed gas of an oxygen gas and an argon gas was used as a deposition gas, and the oxygen flow rate ratio was 10%.

Subsequently, after heat treatment was performed at 370° C. in a nitrogen atmosphere for one hour, another heat treatment was performed at 370° C. in a mixed gas atmosphere of nitrogen and oxygen (nitrogen gas flow rate: oxygen gas flow rate=4:1) for one hour. An oven apparatus was used for the heat treatment.

Then, the first metal oxide film was processed into an island shape to form a first metal oxide layer.

Next, as a gate insulating layer, a 5-nm-thick second silicon oxynitride film, a 130-nm-thick third silicon oxynitride film, and a 5-nm-thick fourth silicon oxynitride film were deposited in this order. For the second silicon oxynitride film to the fourth silicon oxynitride film, reference can be made to the description in Example 1; thus, the detailed description is omitted.

Subsequently, heat treatment was performed at 370° C. in a nitrogen atmosphere for one hour. An oven apparatus was used for the heat treatment.

Next, a 20-nm-thick second metal oxide film was deposited over the fourth silicon oxynitride film. The second metal oxide film was deposited by a sputtering method using an In—Ga—Zn oxide target (In:Ga:Zn=4:2:4.1 [atomic ratio]). In the deposition, the pressure was 0.8 Pa, the power was 3.5 kW, and the substrate temperature was 200° C. An oxygen gas (oxygen flow rate ratio: 100%) was used as a deposition gas.

Subsequently, heat treatment was performed at 370° C. in a mixed gas atmosphere of nitrogen and oxygen (nitrogen gas flow rate:oxygen gas flow rate=4:1) for one hour. An oven apparatus was used for the heat treatment.

Then, over the second metal oxide film, a 10-nm-thick ITSO film and a 100-nm-thick copper film were deposited in this order. The ITSO film and the copper film were deposited by a sputtering method. The ITSO film was deposited using an ITSO target ($In_2O_3$:$SnO_2$:$SiO_2$=85:10:5 [weight ratio]). The copper film was deposited using a Cu target.

Next, a resist mask was formed over the copper film, and the second metal oxide film, the ITSO film, and the copper film were processed to form a second metal oxide layer, an ITSO layer, and a copper layer. A wet etching method was used for the processing. For the etchant used here, reference can be made to the description in Example 1; thus, the detailed description is omitted.

Note that the wet etching treatment time was different among the sample B1 to the sample B5 to make the samples have their respective widths L2 of the regions 108L in the channel length direction. The wet etching treatment time was 60 sec for the sample B1, 75 sec for the sample B2, 90 sec for the sample B3, 105 sec for the sample B4, and 120 sec for the sample B5.

Then, the second silicon oxynitride film was etched using the aforementioned resist mask as a mask to form a second gate insulating layer. A dry etching method was used for the processing. After that, the resist mask was removed.

Then, as a protective layer covering the transistor, a 100-nm-thick fourth silicon nitride film and a 300-nm-thick fifth silicon oxynitride film were deposited in this order. For the fourth silicon nitride film and the fifth silicon oxynitride film, reference can be made to the description in Example 1; thus, the detailed description is omitted.

Next, an opening was formed in part of the protective layer covering the transistor, and a 30-nm-thick titanium film, a 100-nm-thick copper film, and a 50-nm-thick titanium film were deposited in this order by a sputtering method, and then processed to obtain a source electrode and a drain electrode. After that, an approximately 1.5-μm-thick acrylic resin film was formed as a planarization layer, and heat treatment was performed at a temperature of 250° C. in a nitrogen atmosphere for one hour.

Through the above steps, the transistors each formed over the glass substrate (the sample B1 to the sample B5) were obtained.

<Evaluation of ID-VD Characteristics>

Next, the ID-VD characteristics of the fabricated transistors were measured.

The ID-VD characteristics of the transistors were measured under the conditions where the source potential was a ground potential (GND) and the drain voltage (VD) was swept from 0 V to 30 V in increments of 0.25 V. The ID-VD measurements were successively performed on the same transistor under the four conditions where the gate voltage (VG) was 0 V, 2 V, 4 V, and 6 V. The transistor having a channel length of 3 μm and a channel width of 10 μm was used.

Figure 26:
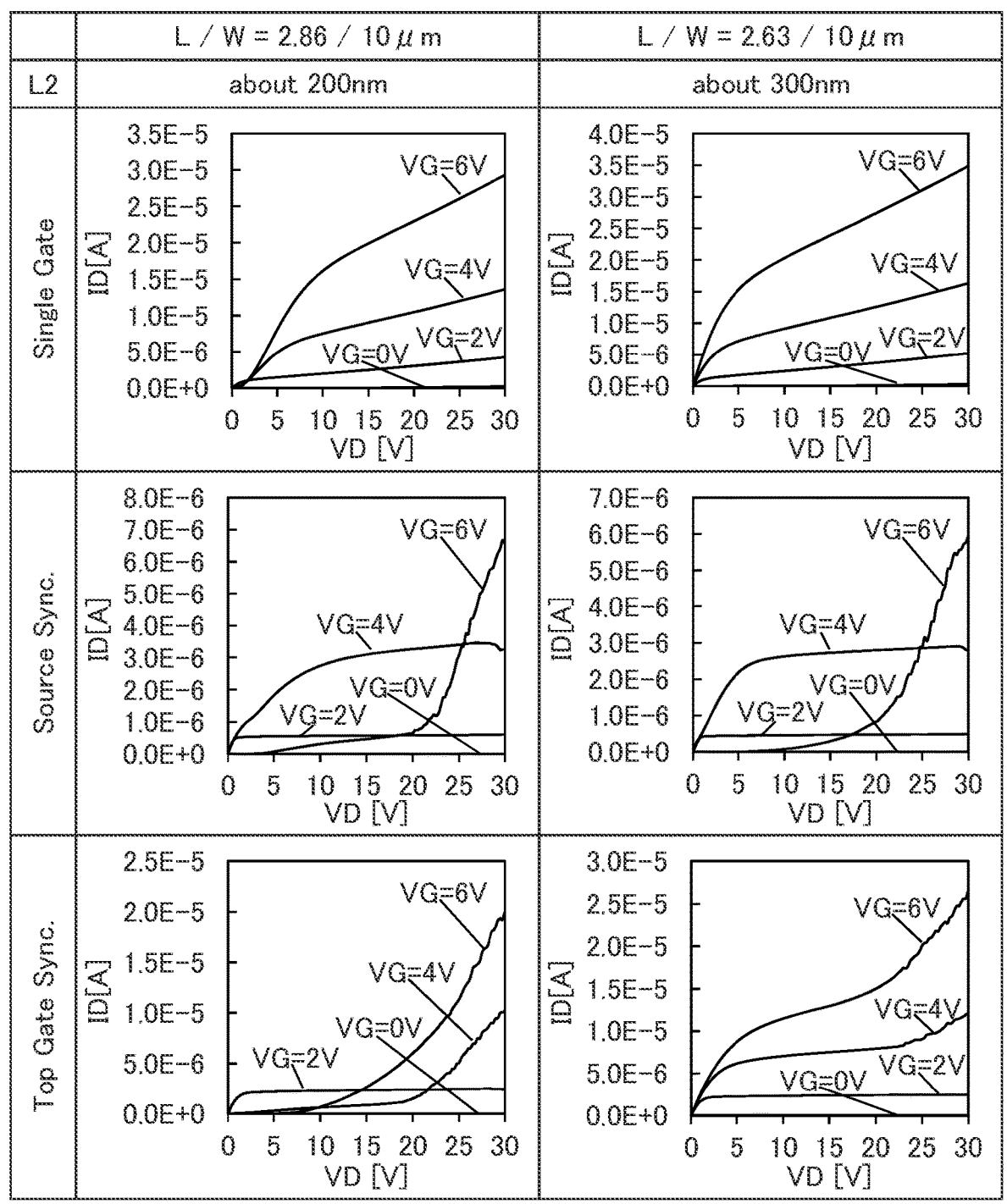
FIG. 26 is graphs showing ID-VD characteristics of transistors.
Figure 27:
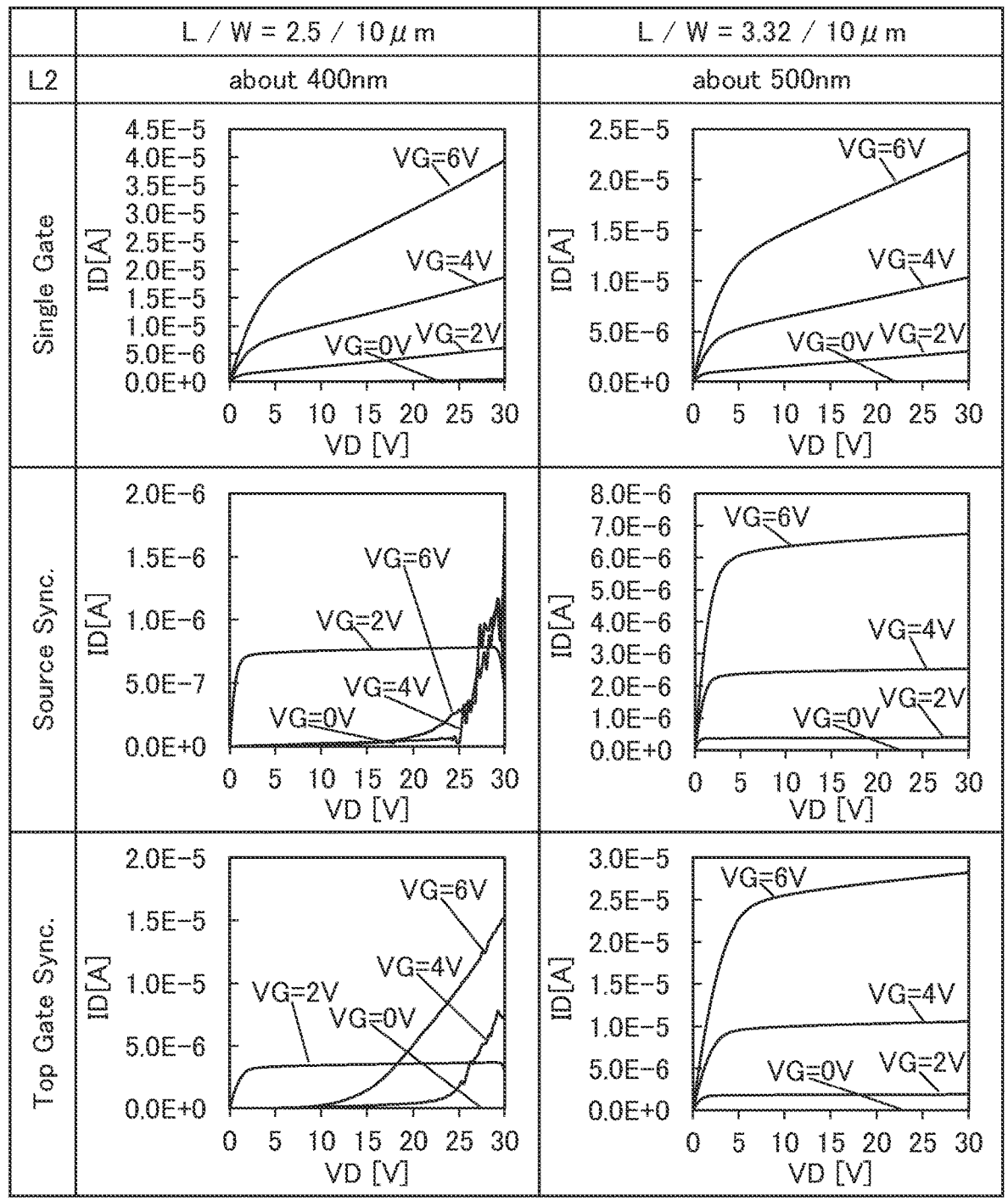
FIG. 27 is graphs showing ID-VD characteristics of transistors.
Figure 28:
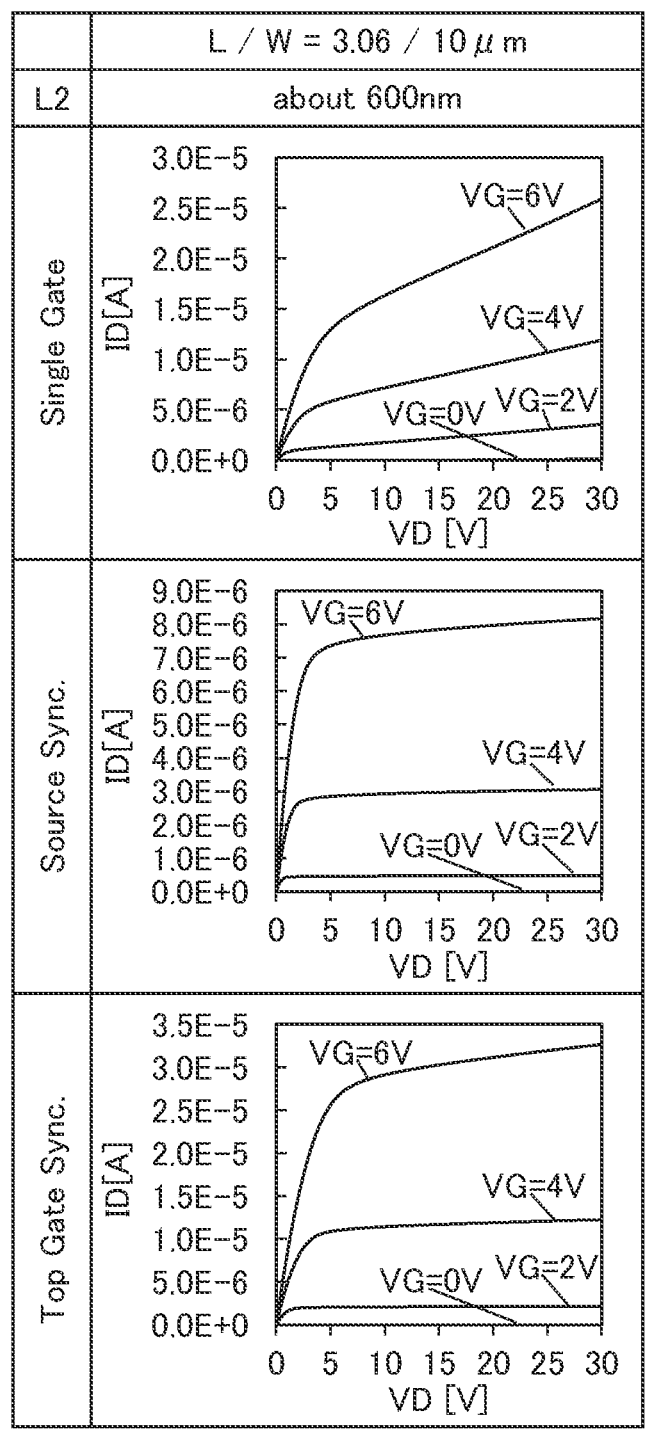
FIG. 28 is graphs showing ID-VD characteristics of transistors.

FIG. 26, FIG. 27, and FIG. 28 show the ID-VD characteristics of the sample B1 to the sample B5. In each of FIG. 26, FIG. 27, and FIG. 28, the horizontal axis represents drain voltage (VD) and the vertical axis represents drain current (ID).

FIG. 26 shows the results of the sample B1 and the sample B2 in the horizontal direction. FIG. 27 shows the results of the sample B3 and the sample B4 in the horizontal direction. FIG. 28 shows the results of the sample B5. Note that the sample B1 has a width L2 of approximately 200 nm, a channel length of 2.86 μm, and a channel width of 10 μm. The sample B2 has a width L2 of approximately 300 nm, a channel length of 2.63 μm, and a channel width of 10 μm. The sample B3 has a width L2 of approximately 400 nm, a channel length of 2.5 μm, and a channel width of 10 μm. The sample B4 has a width L2 of approximately 500 nm, a channel length of 3.32 μm, and a channel width of 10 μm. The sample B5 has a width L2 of approximately 600 nm, a channel length of 3.06 μm, and a channel width of 10 μm.

FIG. 26 to FIG. 28 each show different transistor structure conditions in the vertical direction. The results shown in Single Gate were obtained through the ID-VD measurement performed on the transistor without the conductive layer 106 by application of the gate voltage (VG) to the conductive layer 112. The results shown in Source Sync. were obtained through the ID-VD measurement performed on the transistor, which included the conductive layer 106 and in which the conductive layer 106 (bottom gate electrode) was electrically connected to the source electrode (GND), by application of the gate voltage (VG) to the conductive layer 112 (top gate electrode). The results shown in Top Gate Sync. were obtained through the ID-VD measurement performed on the transistor, which included the conductive layer 106 and in which the conductive layer 106 (bottom gate electrode) was electrically connected to the conductive layer 112 (top gate electrode), by application of the gate voltage (VG) to the conductive layer 112 (top gate electrode).

FIG. 26 to FIG. 28 reveal that, in Single Gate, the on-state current decreases with a width L2 of approximately 200 nm, whereas the on-state current does not decrease and excellent ID-VD characteristics are exhibited with a width L2 of approximately 300 nm or greater. In Source Sync. and Top Gate Sync., the on-state current decreases with widths L2 of approximately 200 nm, approximately 300 nm, and approximately 400 nm, whereas the on-state current does not decrease and excellent ID-VD characteristics are exhibited with a width L2 of approximately 500 nm or greater. It is found that, in any of the transistor structures, increasing the width L2 can inhibit a decrease in the on-state current in the case where a high drain voltage is applied.

Figure 29:
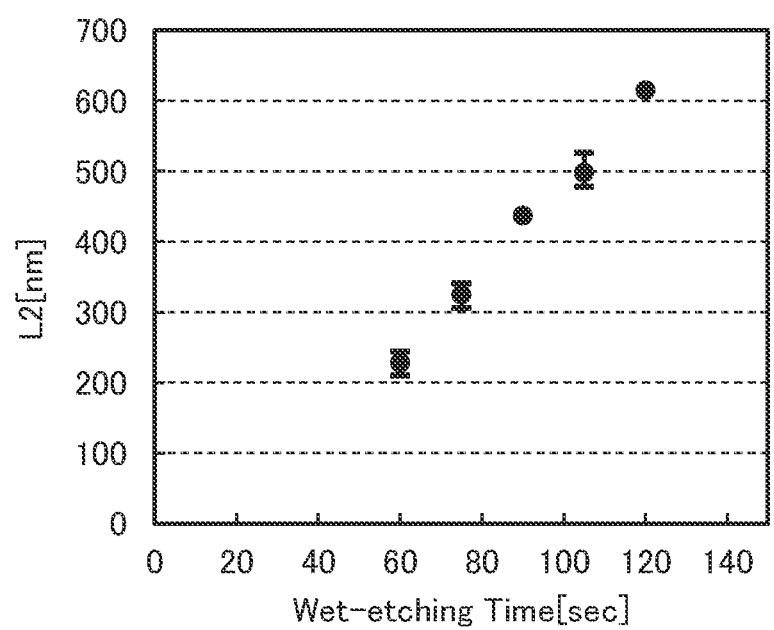
FIG. 29 is a graph showing a relationship between wet etching time and a width L2.

FIG. 29 shows the relationship between the width L2 and the wet etching treatment time at which the second metal oxide film, the ITSO film, and the copper film are processed to form the second metal oxide layer, the ITSO layer, and the copper layer. In FIG. 29, the horizontal axis represents wet etching treatment time (Wet-etching Time) and the vertical axis represents width L2. In addition, in FIG. 29, black circles each represent the average value in the substrate plane, and error bars represent the maximum values and the minimum values in the substrate plane. Note that the results shown here were obtained by measuring four portions in the substrate plane of each of the samples that were subjected to wet etching treatment for 60 sec, 75 sec, and 105 sec and measuring one portion in the substrate plane of each of the samples that were subjected to wet etching treatment for 90 sec and 120 sec. FIG. 29 reveals that the wet etching treatment time and the width L2 have an almost linear relationship, and the width L2 can be controlled by the wet etching treatment time with high accuracy.

Example 3

In this example, samples in each of which a metal oxide film was formed over an insulating film were fabricated, and the amounts of released oxygen and nitrogen monoxide from the insulating films and the spin densities of the insulating films were evaluated. A plurality of samples (a sample C1 to a sample C4, a sample D1 to a sample D4, a sample E1 to a sample E4, and a sample F1 to a sample F4) that differed in the deposition conditions of the insulating film and the deposition conditions of the metal oxide film were fabricated.

<Sample Fabrication>

First, an insulating film was deposited over a substrate.

As the substrate, a glass substrate was used for the sample C1 to the sample C4 and the sample D1 to the sample D4. A quartz substrate was used for the sample E1 to the sample E4 and the sample F1 to the sample F4.

As the insulating film in each of the sample C1 to the sample C4 and the sample E1 to the sample E4, an approximately 140-nm-thick silicon oxynitride film was formed by a plasma CVD method. The silicon oxynitride film was deposited under the conditions where the flow rates of a silane gas and a dinitrogen monoxide gas were 160 sccm and 4000 sccm, respectively; the pressure was 200 Pa; the power was 1500 W; and the substrate temperature was 220° C.

As the insulating film in each of the sample D1 to the sample D4 and the sample F1 to the sample F4, an approximately 5-nm-thick first silicon oxynitride film, an approximately 130-nm-thick second silicon oxynitride film, and an approximately 5-nm-thick third silicon oxynitride film were deposited by a plasma CVD method. The first silicon oxynitride film was deposited under the conditions where the flow rates of a silane gas and a dinitrogen monoxide gas were 24 sccm and 18000 sccm, respectively; the deposition pressure was 200 Pa; the power was 130 W; and the substrate temperature was 350° C. The second silicon oxynitride film was deposited under the conditions where the flow rates of a silane gas and a dinitrogen monoxide gas were 200 sccm and 4000 sccm, respectively; the deposition pressure was 300 Pa; the power was 750 W; and the substrate temperature was 350° C. The third silicon oxynitride film was deposited under the conditions where the flow rates of a silane gas and a dinitrogen monoxide gas were 20 sccm and 3000 sccm, respectively; the deposition pressure was 40 Pa; the power was 500 W; and the substrate temperature was 350° C.

Subsequently, heat treatment was performed at 370° C. in a nitrogen atmosphere for one hour.

Next, an approximately 20-nm-thick metal oxide film was deposited over the insulating film by a sputtering method. The metal oxide film was deposited using a metal oxide target having an atomic ratio of metal elements of In:Ga:Zn=4:2:3 [atomic ratio]. A mixed gas of an argon gas and an oxygen gas was used as a deposition gas.

The proportion of the flow rate of the oxygen gas to the total flow rate of the deposition gas (oxygen flow rate ratio) in the sample C2, the sample D2, the sample E2, and the sample F2 was 50%. The oxygen flow rate ratio in the sample C3, the sample D3, the sample E3, and the sample F3 was 70%. The oxygen flow rate ratio in the sample C4, the sample D4, the sample E4, and the sample F4 was 100%.

The metal oxide film was not formed in each of the sample C1, the sample D1, the sample E1, and the sample F1.

Next, heat treatment was performed on each sample at 370° C. in a mixed atmosphere of an oxygen gas and a nitrogen gas for one hour.

After that, the metal oxide film was removed by a wet etching method in each of the sample C2 to the sample C4, the sample D2 to the sample D4, the sample E2 to the sample E4, and the sample F2 to the sample F4.

Through the above steps, the sample C1 to the sample C4, the sample D1 to the sample D4, the sample E1 to the sample E4, and the sample F1 to the sample F4 were fabricated.

<TDS Analysis>

The sample C1 to the sample C4 and the sample D1 to the sample D4 were subjected to thermal desorption spectroscopy (TDS) analysis. The TDS analysis was performed at a stage temperature rising rate of 30° C./min.

Figure 30A:
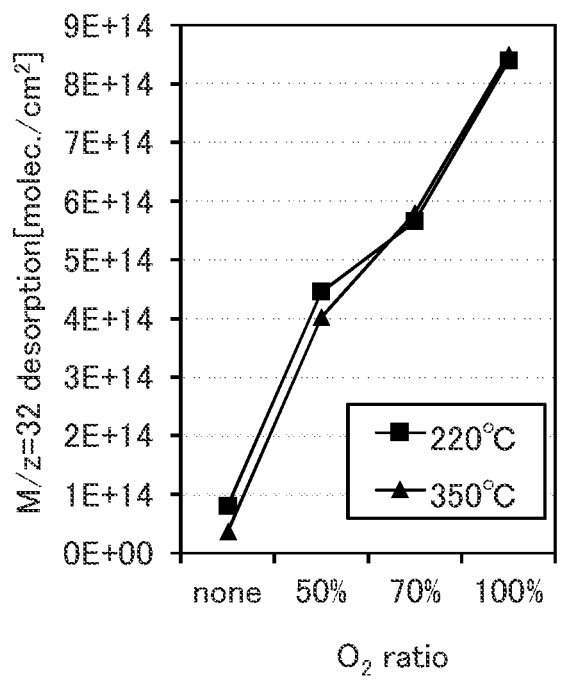
FIG. 30A and FIG. 30B are graphs each showing the released amount of gas from an insulating film.
Figure 30B:
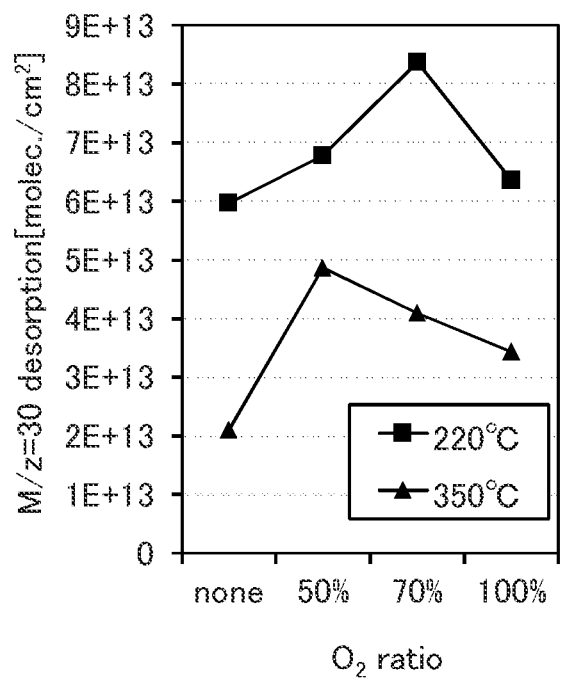

FIG. 30A and FIG. 30B show the TDS analysis results. FIG. 30A shows the released amount of gas with a mass-to-charge ratio (M/z) of 32 corresponding to an oxygen molecule, and FIG. 30B shows the released amount of gas with a mass-to-charge ratio (M/z) of 30 corresponding to a nitrogen monoxide molecule. In each of FIG. 30A and FIG. 30B, the horizontal axis represents oxygen flow rate ratio ($O_2$ ratio) in the deposition of the metal oxide film, and the vertical axis represents the released amount of gas (desorption). In addition, in each of FIG. 30A and FIG. 30B, black squares represent the condition where the substrate temperature during the deposition of the insulating film is 220° C., and black triangles represent the condition where the substrate temperature during the deposition of the insulating film is 350° C. Note that "none" in the horizontal axis in each of FIG. 30A and FIG. 30B represents the sample C1 and the sample D1 in which the metal oxide films are not formed.

FIG. 30A reveals that forming a metal oxide film over an insulating film increases the released amount of oxygen molecules from the insulating film, and oxygen is supplied to the insulating film by the formation of the metal oxide film. It is also found that the released amount of oxygen molecules from the insulating film increases with increasing oxygen flow rate ratio in the deposition of the metal oxide film. A difference in the released amount of oxygen due to the substrate temperature during the deposition of the insulating film is not observed.

FIG. 30B indicates that forming a metal oxide film over an insulating film increases the released amount of nitrogen monoxide molecules from the insulating film, and nitrogen oxide is formed in the insulating film by the formation of the metal oxide film. It is revealed that the released amount of nitrogen monoxide molecules is smaller in the condition where the substrate temperature during the deposition of the insulating film is 350° C. than in the condition where the substrate temperature is 220° C. In addition, in the condition where the substrate temperature during the deposition of the insulating film is 350° C., the released amount of nitrogen monoxide molecules from the insulating film decreases with increasing oxygen flow rate ratio in the deposition of the metal oxide film. In the condition where the substrate temperature during the deposition of the insulating film is 220° C., the released amount of nitrogen monoxide molecules tends to be higher in the condition where the oxygen flow rate ratio in the deposition of the metal oxide film is 70% than in the condition where the oxygen flow rate ratio is 50%.

<ESR Analysis>

The sample E1 to the sample E4 and the sample F1 to the sample F4 were subjected to electron spin resonance (ESR) analysis. In the ESR analysis, the measurement temperature was 85 K; 10 mW of high-frequency power (microwave power) with 9.2 GHz was applied; and the direction of a magnetic field was parallel to the surface of the sample film. The lower detection limit was $3.5 \times 10^{17}$ spins/cm$^3$.

Figure 30C:
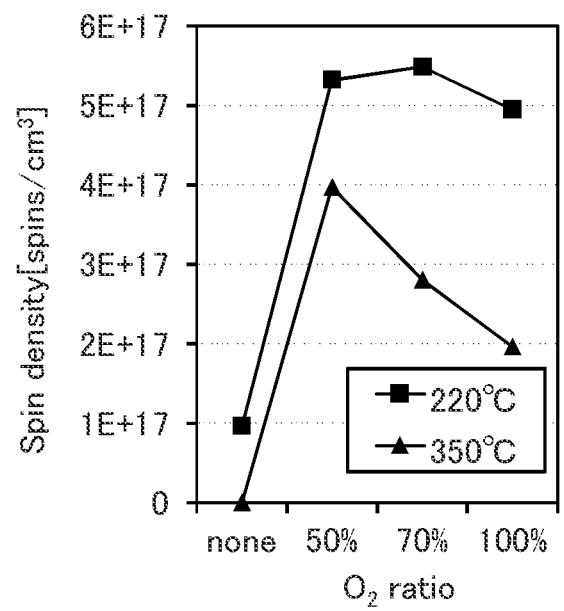
FIG. 30C is a graph showing spin density of an insulating film.

FIG. 30C shows the ESR analysis results. FIG. 30C shows the spin density of a signal due to nitrogen dioxide ($NO_2$). Note that according to the nitrogen nuclear spin, the signal due to nitrogen dioxide ($NO_2$) is divided into three signals, which are observed at g-factors of around 2.04, around 2.00, and around 1.96. In FIG. 30C, the horizontal axis represents oxygen flow rate ratio ($O_2$ ratio) in the deposition of the metal oxide film and the vertical axis represents spin density. In addition, in FIG. 30C, black squares represent the condition where the substrate temperature during the deposition of the insulating film is 220° C., and black triangles represent the condition where the substrate temperature during the deposition of the insulating film is 350° C. The spin density refers to the number of spins per volume of the insulating film, which is calculated by dividing the number of spins obtained through the ESR analysis by the volume of the insulating film used for the ESR analysis. Note that "none" in the horizontal axis in FIG. 30C represents the sample E1 and the sample F1 in which the metal oxide films are not formed.

As shown in FIG. 30C, forming the metal oxide film over the insulating film increases the spin density of the insulating film due to nitrogen dioxide ($NO_2$). It is revealed that the spin density due to nitrogen dioxide ($NO_2$) is lower in the condition where the substrate temperature during the deposition of the insulating film is 350° C. than in the condition where the substrate temperature is 220° C. In addition, in the condition where the substrate temperature during the deposition of the insulating film is 350° C., the spin density due to nitrogen dioxide ($NO_2$) decreases with increasing oxygen flow rate ratio in the deposition of the metal oxide film.

REFERENCE NUMERALS

C1: capacitor, C2: capacitor, DL_n: data line, DL_Y: data line, DL_1: data line, EL: light-emitting element, G1: wiring, G2: wiring, GL_m: scan line, GL_X: scan line, GL_1: scan line, LC: liquid crystal element, M1: transistor, M2: transistor, M3: transistor, N1: node, N2: node, P: region, P1: region, P2: region, Q: region, R: region, S1: wiring, S2: wiring, T1: period, T2: period, 100: transistor, 100A: transistor, 100B: transistor, 102: substrate, 103: insulating layer, 103a: insulating layer, 103b: insulating layer, 106: conductive layer, 108: semiconductor layer, 108L: region, 108N: region, 110: insulating layer, 110a: insulating layer, 110b: insulating layer, 110c: insulating layer, 110f: insulating film, 112: conductive layer, 112f: conductive film, 113: functional layer, 113f: functional film, 114: metal oxide layer, 114f: metal oxide film, 115: resist mask, 116: insulating layer, 118: insulating layer, 120a: conductive layer, 120b: conductive layer, 141a: opening portion, 141b: opening portion, 142: opening, 400: pixel circuit, 400EL: pixel circuit, 400LC: pixel circuit, 401: circuit, 401EL: circuit, 401LC: circuit, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 700A: display device, 700B: display device, 701: first substrate, 702: pixel portion, 704: source driver circuit portion, 705: second substrate, 706: gate driver circuit portion, 708: FPC terminal portion, 710: signal line, 711: wiring portion, 712: sealant, 716: FPC, 717: IC, 721: source driver IC, 722: gate driver circuit portion, 723: FPC, 724: printed circuit board, 730: insulating film, 732: sealing film, 734: insulating film, 736: coloring film, 738: light-blocking film, 740: protective layer, 741: protective layer, 742: bonding layer, 743: resin layer, 744: insulating layer, 745: support substrate, 746: resin layer, 750: transistor, 752: transistor, 760: wiring, 770: planarization insulating film, 772: conductive layer, 773: insulating layer, 774: conductive layer, 775: liquid crystal element, 776: liquid crystal layer, 778: spacer, 780: anisotropic conductive film, 782: light-emitting element, 786: EL layer, 788: conductive film, 790: capacitor, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7500: display portion, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, 9201: portable information terminal

The invention claimed is:

1. A semiconductor device comprising a semiconductor layer, a first insulating layer, a second insulating layer, a metal oxide layer, and a conductive layer, wherein the first insulating layer, the metal oxide layer, and the conductive layer are stacked in this order over the semiconductor layer, wherein an end portion of the first insulating layer is located inward from an end portion of the semiconductor layer, wherein an end portion of the metal oxide layer is located inward from the end portion of the first insulating layer, wherein an end portion of the conductive layer is located inward from the end portion of the metal oxide layer, wherein the second insulating layer is provided to cover the semiconductor layer, the first insulating layer, the metal oxide layer, and the conductive layer, wherein the semiconductor layer comprises a first region, a pair of second regions, and a pair of third regions, wherein the first region overlaps with the first insulating layer and the metal oxide layer, wherein the second regions between which the first region is sandwiched overlap with the first insulating layer and do not overlap with the metal oxide layer, wherein the third regions between which the first region and the pair of second regions are sandwiched do not overlap with the first insulating layer, wherein the third regions are in contact with the second insulating layer, wherein the third regions comprise a portion having lower resistance than the first region, and wherein the second regions comprise a portion having higher resistance than the third regions.

2. The semiconductor device according to claim 1, wherein the second regions comprise a portion having lower resistance than the first region.

3. The semiconductor device according to claim 1, wherein the second regions comprise a portion with a sheet resistance higher than or equal to $1\times10^3$ Ω/square and lower than or equal to $1\times10^9$ Ω/square.

4. The semiconductor device according to claim 1, wherein a width of each of the second regions is greater than or equal to 100 nm and less than or equal to 2 μm in a cross section in a channel length direction.

5. The semiconductor device according to claim 1, wherein the second insulating layer is a silicon nitride film.

6. The semiconductor device according to claim 1, wherein the end portion of the first insulating layer and the end portion of the metal oxide layer each have a tapered shape, and wherein a taper angle of the end portion of the metal oxide layer is smaller than a taper angle of the end portion of the first insulating layer.

7. The semiconductor device according to claim 1, wherein a functional layer is provided between the metal oxide layer and the conductive layer, wherein the functional layer has conductivity, and wherein an end portion of the functional layer is substantially aligned with the end portion of the metal oxide layer or is positioned between the end portion of the metal oxide layer and the end portion of the conductive layer.

8. The semiconductor device according to claim 7, wherein the semiconductor layer, the metal oxide layer, and the functional layer comprise the same metal element.

9. The semiconductor device according to claim 8, wherein the metal element is one or more of indium and zinc.

* * * * *